(12) United States Patent

Huang et al.

(10) Patent No.: US 9,559,722 B1
(45) Date of Patent: Jan. 31, 2017

(54) NETWORK DEVICES AND METHODS OF GENERATING LOW-DENSITY PARITY-CHECK CODES AND PERFORMING CORRESPONDING ENCODING OF DATA

(71) Applicant: Marvell International LTD., Hamilton (BM)

(72) Inventors: Jie Huang, San Jose, CA (US); Hui-Ling Lou, Sunnyvale, CA (US); Leilei Song, Sunnyvale, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/706,335

(22) Filed: May 7, 2015

Related U.S. Application Data

(63) Continuation-in-part of application No. 14/681,485, filed on Apr. 8, 2015.

(60) Provisional application No. 61/990,209, filed on May 8, 2014, provisional application No. 61/992,635, filed on May 13, 2014, provisional application No.
(Continued)

(51) Int. Cl.
*H03M 13/03* (2006.01)
*H03M 13/11* (2006.01)
*H03M 13/00* (2006.01)

(52) U.S. Cl.
CPC ......... *H03M 13/118* (2013.01); *H03M 13/616* (2013.01)

(58) Field of Classification Search
CPC .......................... H03M 13/118; H03M 13/616
See application file for complete search history.

(56) References Cited

U.S. PATENT DOCUMENTS 6,795,894 B1   9/2004  Neufeld et al.
6,978,355 B2   12/2005 Mowery et al.
(Continued)

FOREIGN PATENT DOCUMENTS

WO    WO-96/37844 A1    11/1996
WO    WO-2008/055272 A2  5/2008

OTHER PUBLICATIONS

IEEE Std 802.11b—1999/ Cor 1-2001; IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 2: Higher-Speed Physical Layer (PHY) extension in the 2.4 GHz Band—Corrigendum 1; IEEE Computer Society; Sponsored by the LAN/MAN Standards Committee; Nov. 7, 2001; 23 pages.
(Continued)

*Primary Examiner* — Sam Rizk

(57) ABSTRACT

A network device including a matrix generating module, an encoding module and a transceiver. The matrix generating module is configured to generate or access a code base matrix, wherein the code base matrix has a corresponding code rate of 7/8. The matrix generating module is also configured to, based on the code base matrix, generate a resultant matrix of a low-density parity-check code. The resultant matrix includes sub-matrices. Each of the sub-matrices is generated based on a respective element in the code base matrix. The resultant matrix has a code length of 648 or 1296. The encoding module is configured to encode data based on the resultant matrix. The transceiver is configured to transmit the encoded data.

27 Claims, 52 Drawing Sheets

Related U.S. Application Data

62/000,657, filed on May 20, 2014, provisional application No. 62/013,700, filed on Jun. 18, 2014, provisional application No. 62/013,706, filed on Jun. 18, 2014, provisional application No. 62/030,900, filed on Jul. 30, 2014, provisional application No. 61/982,129, filed on Apr. 21, 2014, provisional application No. 61/990,209, filed on May 8, 2014, provisional application No. 62/030,900, filed on Jul. 30, 2014.

(56) References Cited

U.S. PATENT DOCUMENTS

| | | | |
|---|---|---|---|
| 7,428,617 | B2 | 9/2008 | Okawa et al. |
| 7,800,856 | B1 | 9/2010 | Bennett et al. |
| 8,688,900 | B2 | 4/2014 | Eleftheriou et al. |
| 9,182,915 | B2 | 11/2015 | Sutardja |
| 9,323,688 | B2 | 4/2016 | Sutardja |
| 2006/0242534 | A1* | 10/2006 | Livshitz ............... H03M 13/116 714/758 |
| 2008/0294867 | A1 | 11/2008 | Kimura |
| 2011/0307755 | A1* | 12/2011 | Livshitz ............. H03M 13/1111 714/752 |
| 2013/0321948 | A1 | 12/2013 | Bandic et al. |
| 2013/0335856 | A1 | 12/2013 | Tanabe et al. |
| 2015/0113214 | A1 | 4/2015 | Sutardja |
| 2015/0242137 | A1 | 8/2015 | Sutardja |
| 2015/0318022 | A1 | 11/2015 | Sutardja |

OTHER PUBLICATIONS

U.S. Appl. No. 62/000,657, filed May 20, 2014, Huang.
U.S. Appl. No. 62/013,700, filed Jun. 18, 2014, Huang.
U.S. Appl. No. 62/013,706, filed Jun. 18, 2014, Huang.
U.S. Appl. No. 61/987,947, filed May 2, 2014, Sutardja.
IEEE P802.11ac / D2.0; Draft STANDARD for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Jan. 2012; 359 pages.
IEEE Std. 802.11b; Supplement to IEEE Standard for Information technology—Telecommunications and information exchange between systems—Local and metropolitan area networks—Specific Requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 2009; 96 pages.
Kiran Gunnam et al.; "Multi-Rate Layered Decoder Architecture for Block LDPC Codes of the IEEE 802.11n Wireless Standard"; 2007; pp. 1645-1648.
IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.
802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.
IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.
"Specification of the Bluetooth System" Master Table of Contents & Compliance Requirements—Covered Core Package version: 4.0; Jun. 30, 2010; 2302 pages.
IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.
IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.
IEEE Std 802.11a-1999 (Supplement to IEEE Std 802.11-1999) Supplement to IEEE Standard for Information technology—Telecommunications and information exchange between systems—Local and metropolitan area networks—Specific requirements—Part11: Wireless LAN Medium Access Control (MAC) and Physical Layer (PHY) specifications: High-Speed Physical Layer in the 5 Ghz Band; LAN/MAN Standards Committee of the IEEE Computer Society; Sep. 16, 1999; 91 pages.
IEEE P802,119/08.2 DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; Apr. 2003; 69 pages.
Rolf de Vegt; IEEE 802.11ax Selection Procedure (DRAFT); Jul. 2014; 117 pages.
International Search Report and Written Opinion for PCT Application No. PCT/US2014/061603 mailed Jan. 12, 2015; 12 pages.
U.S. Appl. No. 14/681,485, Huang et al.
U.S. Appl. No. 14/702,078, Sutardja.
U.S. Appl. No. 14/710,988, Sutardja.
IEEE P802.11 Wireless LANs; Proposed Specification Framework for TGah; Mar. 2012; 13 pages.
IEEE P802.20™ V14, Draft 802.20 Permanent Document; <System Requirements for IEEE 802.20 Mobile Broadband Wireless Access Systems—Version 14>; Jul. 16, 2004; 24 pages.
International Search Report and Written Opinion for PCT Application No. PCT/US2015/028867 mailed Jul. 13, 2015; 9 pages.
Taeho Kgil and Trevor Mudge; "FlashCache: A NAND Flash Memory File Cache for Low Power Web Serviers"; Advanced Computer Architecture Laboratory; The University of Michigan, Ann Arbor, USA; 2006; 13 pages.
Taeho Kgil and Trevor N. Mudge; "FlashCache: A NAND flash memory file cache for low power web servers"; ResearchGate; Jan. 2006; 11 pages.

\* cited by examiner

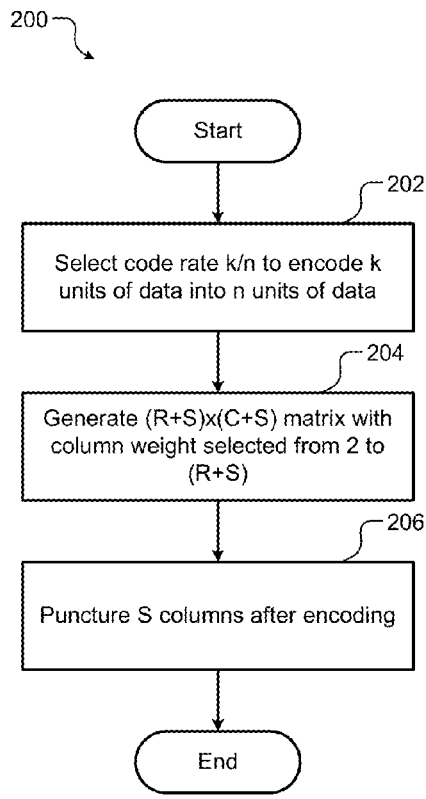
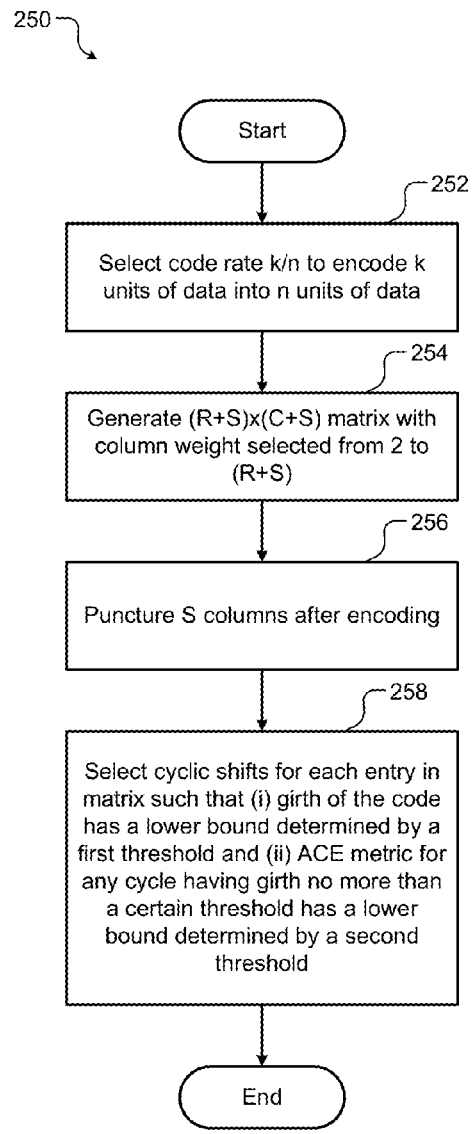
FIG. 4
FIG. 5

FIG. 13B $$\begin{bmatrix} -1 & 0 & 0 \\ 0 & 0 & -1 \\ 1 & 0 & 1 \\ 41 & 48 & 62 \\ 44 & 2 & 61 \\ 27 & 47 & 6 \\ 49 & 51 & 73 \\ 61 & 36 & 43 \\ 37 & 47 & 49 \\ 32 & 27 & 60 \\ 60 & 28 & 34 \\ 77 & 4 & 71 \\ 52 & 65 & 22 \\ 67 & 16 & 58 \\ 45 & 46 & 49 \\ 57 & 66 & 20 \\ 41 & 37 & 78 \\ 60 & 65 & 29 \\ 54 & 44 & 2 \\ 73 & 57 & 24 \\ 51 & 28 & 4 \\ 55 & 7 & 73 \\ 21 & 27 & 57 \\ 67 & 59 & 5 \end{bmatrix}$$

FIG. 14

$$\begin{bmatrix} -1 & 0 & 0 \\ 0 & 0 & -1 \\ 1 & 0 & 1 \\ 38 & 25 & 76 \\ 8 & 48 & 23 \\ 73 & 16 & 39 \\ 75 & 24 & 52 \\ 54 & 63 & 66 \\ 3 & 77 & 40 \\ 77 & 9 & 55 \\ 12 & 40 & 61 \\ 69 & 76 & 55 \\ 45 & 6 & 37 \\ 15 & 10 & 40 \\ 11 & 27 & 37 \\ 78 & 11 & 72 \\ 44 & 11 & 66 \\ 4 & 21 & 12 \\ 76 & 13 & 29 \\ 43 & 54 & 41 \\ 63 & 3 & 21 \\ 16 & 45 & 4 \\ 64 & 6 & 33 \\ 47 & -1 & 53 \end{bmatrix}$$

FIG. 15

$$\begin{bmatrix} -1 & 0 & 0 \\ 0 & 0 & -1 \\ 1 & 0 & 1 \\ 77 & 73 & 14 \\ 46 & 8 & 54 \\ 38 & 52 & 35 \\ 50 & 71 & 41 \\ 75 & 11 & 52 \\ 53 & 8 & 78 \\ 2 & 59 & 41 \\ 58 & 17 & 74 \\ 18 & 51 & 3 \\ 30 & 64 & 59 \\ 34 & 72 & 47 \\ 57 & 20 & 50 \\ 66 & 75 & 47 \\ 32 & 18 & 42 \\ 74 & 68 & 19 \\ 48 & 19 & 38 \\ 28 & 69 & 2 \\ 6 & 54 & 10 \\ 68 & 63 & 55 \\ 39 & -1 & 19 \\ 17 & -1 & 19 \end{bmatrix}$$

$$\begin{bmatrix} -1 & 0 & 0 \\ 0 & 0 & -1 \\ 1 & 0 & 1 \\ 30 & 42 & 39 \\ 55 & 59 & 19 \\ 28 & 35 & 60 \\ 58 & 44 & 32 \\ 20 & 4 & 22 \\ 39 & 56 & 31 \\ 7 & 76 & 43 \\ 15 & 9 & 77 \\ 7 & 56 & 66 \\ 17 & 13 & 43 \\ 68 & 65 & 37 \\ 17 & 68 & 33 \\ 20 & 76 & 39 \\ 26 & 24 & 6 \\ 41 & 63 & 74 \\ 20 & 64 & 48 \\ 37 & 22 & 51 \\ 51 & 33 & 10 \\ 29 & 53 & -1 \\ 56 & -1 & 46 \\ 69 & -1 & 8 \end{bmatrix}$$

FIG. 18

$$\begin{bmatrix} -1 & 0 & 0 \\ 0 & 0 & -1 \\ 1 & 0 & 1 \\ 41 & 48 & 62 \\ 44 & 2 & 61 \\ 27 & 47 & 6 \\ 49 & 51 & 73 \\ 61 & 36 & 43 \\ 37 & 47 & 49 \\ 32 & 27 & 60 \\ 60 & 28 & 34 \\ 77 & 4 & 71 \\ 52 & 65 & 22 \\ 67 & 16 & 58 \\ 45 & 46 & 49 \\ 57 & 66 & 20 \\ 41 & 37 & 78 \\ 60 & 65 & 29 \\ 54 & 44 & 2 \\ 73 & 57 & 24 \\ 51 & 28 & 4 \\ 55 & 7 & 73 \\ 21 & 27 & 57 \\ 67 & 59 & 5 \end{bmatrix}$$

FIG. 19

$$\begin{bmatrix} -1 & 0 & 0 \\ 0 & 0 & -1 \\ 1 & 0 & 1 \\ 71 & 41 & 48 \\ 44 & 35 & 19 \\ 60 & 1 & 40 \\ 49 & 55 & 22 \\ 44 & 29 & 0 \\ 19 & 45 & 42 \\ 68 & 80 & 31 \\ 54 & 41 & 75 \\ 21 & 34 & 64 \\ 72 & 30 & 70 \\ 54 & 51 & 46 \\ 31 & 35 & 34 \\ 47 & 28 & 4 \\ 2 & 38 & 52 \\ 66 & 30 & 76 \\ 52 & 1 & 46 \\ 57 & 35 & 66 \\ 37 & 25 & -1 \\ 21 & -1 & 76 \\ -1 & 48 & 75 \\ 76 & -1 & 36 \end{bmatrix}$$

FIG. 20

$$\begin{bmatrix}
-1 & 0 & 0 & -1 \\
0 & 0 & -1 & -1 \\
1 & 0 & -1 & -1 \\
40 & 75 & 72 & 32 \\
64 & 74 & 42 & 73 \\
51 & 65 & 48 & 44 \\
79 & 15 & 43 & 6 \\
63 & 76 & 5 & 50 \\
32 & 52 & 13 & 66 \\
67 & 50 & 25 & 31 \\
45 & 52 & 43 & 1 \\
12 & 59 & 75 & 26 \\
77 & 18 & 29 & 13 \\
80 & 4 & 42 & 31 \\
57 & 59 & -1 & 7 \\
-1 & 71 & 44 & -1 \\
-1 & -1 & 43 & 78 \\
28 & 79 & -1 & -1 \\
-1 & -1 & 18 & 34 \\
6 & -1 & -1 & 17 \\
-1 & 7 & -1 & 27 \\
63 & 16 & -1 & -1 \\
-1 & -1 & 74 & 18 \\
19 & -1 & -1 & 75 \\
-1 & -1 & 9 & 51
\end{bmatrix}$$

FIG. 21

$$\begin{bmatrix}
-1 & 0 & 0 & -1 \\
0 & 0 & -1 & -1 \\
1 & 0 & -1 & -1 \\
78 & 11 & 20 & 17 \\
28 & 38 & 19 & 17 \\
8 & 58 & 75 & 18 \\
1 & 58 & 25 & 34 \\
12 & 41 & 76 & 76 \\
21 & 55 & 23 & 65 \\
76 & 74 & 34 & 18 \\
49 & 72 & 38 & 44 \\
73 & 41 & 65 & 70 \\
18 & 10 & 53 & 43 \\
34 & 16 & 75 & 1 \\
-1 & 28 & 10 & 5 \\
42 & 70 & -1 & -1 \\
-1 & -1 & 35 & 54 \\
0 & -1 & 66 & -1 \\
-1 & 72 & 77 & -1 \\
44 & -1 & -1 & 43 \\
-1 & 10 & -1 & 28 \\
-1 & 17 & 5 & -1 \\
16 & -1 & -1 & 71 \\
-1 & -1 & 4 & 30 \\
53 & -1 & -1 & 46
\end{bmatrix}$$

FIG. 22

$$\begin{bmatrix}
-1 & 0 & 0 & -1 \\
0 & 0 & -1 & -1 \\
1 & 0 & -1 & -1 \\
52 & 15 & 11 & 28 \\
23 & 42 & 75 & 48 \\
60 & 74 & 15 & 70 \\
26 & 55 & 16 & 6 \\
55 & 46 & 78 & 71 \\
68 & 57 & 3 & 73 \\
2 & 23 & 28 & 74 \\
46 & 69 & 26 & 10 \\
-1 & 62 & 65 & 73 \\
40 & -1 & 49 & 63 \\
56 & 7 & 62 & -1 \\
62 & 56 & -1 & 51 \\
56 & 12 & -1 & 30 \\
31 & -1 & 13 & -1 \\
-1 & 4 & 61 & -1 \\
48 & -1 & -1 & 45 \\
-1 & 1 & 57 & -1 \\
-1 & -1 & 43 & 45 \\
41 & -1 & -1 & 42 \\
-1 & 59 & -1 & 20 \\
-1 & -1 & 78 & 50 \\
45 & -1 & -1 & 32
\end{bmatrix}$$

$$\text{FIG. 31: }\begin{bmatrix} -1 & 0 & 0 \\ 0 & 0 & -1 \\ 1 & 0 & 1 \\ 33 & 4 & 78 \\ 22 & 17 & 76 \\ 18 & 4 & 33 \\ 6 & 69 & 44 \\ 56 & 44 & 75 \\ 55 & 18 & 17 \\ 22 & 48 & 25 \\ 26 & 37 & 60 \\ 33 & 63 & 37 \\ 22 & 45 & 54 \\ 0 & 72 & 41 \\ 26 & 24 & 15 \\ 44 & 28 & 49 \\ 39 & 26 & 66 \\ 1 & 15 & 63 \\ 7 & 56 & 44 \\ 77 & 47 & 49 \\ 11 & 3 & 29 \\ 31 & -1 & 37 \\ 59 & 80 & -1 \\ -1 & 17 & 42 \\ 24 & -1 & 57 \end{bmatrix}$$

$$\text{FIG. 32: }\begin{bmatrix} -1 & 0 & 0 \\ 0 & 0 & -1 \\ 1 & 0 & 1 \\ 74 & 66 & 77 \\ 56 & 72 & 53 \\ 11 & 28 & 18 \\ 61 & 48 & 14 \\ 63 & 19 & 21 \\ 14 & 74 & 77 \\ 8 & 48 & 64 \\ 75 & 60 & 42 \\ 16 & 54 & 69 \\ 71 & 15 & 35 \\ 0 & 57 & 49 \\ 39 & 33 & 59 \\ 39 & 72 & 25 \\ 20 & 55 & 25 \\ 13 & 61 & 55 \\ 25 & 64 & 12 \\ 24 & 44 & 37 \\ 33 & 48 & -1 \\ 80 & -1 & 42 \\ 77 & 79 & -1 \\ -1 & 49 & 80 \\ 48 & -1 & 54 \end{bmatrix}$$

$$\text{FIG. 33: }\begin{bmatrix} -1 & 0 & 0 \\ 0 & 0 & -1 \\ 1 & 0 & 1 \\ 8 & 62 & 18 \\ 53 & 42 & 7 \\ 8 & 49 & 2 \\ 14 & 40 & 21 \\ 3 & 27 & 30 \\ 14 & 42 & 54 \\ 24 & 5 & 15 \\ 61 & 44 & 32 \\ 0 & 25 & 69 \\ 8 & 61 & 5 \\ 64 & 33 & 30 \\ 37 & 38 & 69 \\ 44 & 31 & 61 \\ 52 & 11 & 66 \\ 18 & 16 & 5 \\ -1 & 80 & 28 \\ 76 & 55 & -1 \\ 21 & -1 & 26 \\ 55 & 12 & -1 \\ 79 & -1 & 54 \\ -1 & 21 & 44 \\ 28 & -1 & 21 \end{bmatrix}$$

$$\text{FIG. 34} = \begin{bmatrix} -1 & 0 & 0 \\ 0 & 0 & -1 \\ -1 & 0 & 1 \\ 74 & 66 & 77 \\ 56 & 72 & 53 \\ 11 & 28 & 18 \\ 61 & 48 & 14 \\ 63 & 19 & 21 \\ 14 & 74 & 77 \\ 8 & 48 & 64 \\ 75 & 60 & 42 \\ 16 & 54 & 69 \\ 71 & 15 & 35 \\ 0 & 57 & 49 \\ 39 & 33 & 59 \\ 39 & 72 & 25 \\ 20 & 55 & 25 \\ 13 & 61 & 55 \\ 25 & 64 & 12 \\ 24 & 44 & 37 \\ 33 & 48 & -1 \\ 80 & -1 & 42 \\ 77 & 79 & -1 \\ -1 & 49 & 80 \\ 48 & -1 & 54 \end{bmatrix}$$

$$\text{FIG. 35} = \begin{bmatrix} -1 & 0 & 0 \\ 0 & 0 & -1 \\ -1 & 0 & 1 \\ 66 & 28 & 7 \\ 34 & 61 & 46 \\ 18 & 28 & 53 \\ 13 & 37 & 61 \\ 68 & 0 & 31 \\ 58 & 75 & 61 \\ 8 & 59 & 19 \\ 5 & 59 & 33 \\ 21 & 9 & 15 \\ 18 & 49 & 76 \\ 74 & 5 & 18 \\ 46 & 22 & 45 \\ 56 & 13 & 49 \\ 21 & 65 & 36 \\ 29 & 49 & 19 \\ 50 & 18 & 79 \\ 40 & 20 & 64 \\ 5 & -1 & 3 \\ 13 & -1 & 60 \\ -1 & 64 & 51 \\ 54 & 12 & -1 \\ 27 & -1 & 64 \end{bmatrix}$$

$$\text{FIG. 36} = \begin{bmatrix} -1 & 0 & 0 \\ 0 & 0 & -1 \\ -1 & 0 & 1 \\ 45 & 11 & 39 \\ 58 & 25 & 63 \\ 21 & 67 & 49 \\ 42 & 53 & 56 \\ 61 & 18 & 1 \\ 63 & 42 & 1 \\ 74 & 60 & 15 \\ 27 & 31 & 61 \\ 0 & 62 & 4 \\ 6 & 70 & 42 \\ 38 & 53 & 68 \\ 62 & 67 & 7 \\ 58 & 14 & 69 \\ 27 & -1 & 11 \\ -1 & 66 & 32 \\ -1 & 76 & 63 \\ 10 & 41 & -1 \\ 7 & -1 & 24 \\ 33 & 42 & -1 \\ -1 & 64 & 42 \\ 55 & -1 & 75 \\ 48 & -1 & 17 \end{bmatrix}$$

$$
\text{FIG. 37} = \begin{bmatrix}
-1 & 0 & 0 \\
0 & 0 & -1 \\
-1 & 0 & -1 \\
67 & 71 & 0 \\
13 & 22 & 35 \\
27 & 77 & 37 \\
10 & 56 & 72 \\
31 & 68 & 8 \\
76 & 21 & 72 \\
21 & 45 & 63 \\
29 & 48 & 17 \\
26 & 16 & 52 \\
31 & 47 & 10 \\
33 & 77 & -1 \\
-1 & 19 & 25 \\
-1 & 25 & 78 \\
27 & -1 & -1 \\
78 & 63 & -1 \\
3 & 35 & -1 \\
-1 & 52 & 51 \\
71 & -1 & 53 \\
5 & 26 & -1 \\
12 & -1 & 40 \\
-1 & 44 & 30 \\
17 & -1 & 11
\end{bmatrix}
$$

$$
\text{FIG. 38} = \begin{bmatrix}
-1 & 0 & 0 \\
0 & 0 & -1 \\
-1 & 0 & -1 \\
17 & 10 & 39 \\
9 & 17 & 41 \\
76 & 63 & 46 \\
18 & 13 & 8 \\
34 & 57 & 26 \\
29 & 9 & 75 \\
48 & 72 & 23 \\
77 & 78 & 4 \\
50 & 38 & 53 \\
48 & 55 & 41 \\
70 & 35 & 23 \\
51 & 11 & -1 \\
61 & 18 & -1 \\
-1 & 75 & 19 \\
2 & -1 & 19 \\
-1 & 68 & 42 \\
67 & -1 & 38 \\
29 & 76 & -1 \\
16 & 60 & -1 \\
22 & -1 & 33 \\
-1 & 20 & 18 \\
11 & -1 & 39
\end{bmatrix}
$$

$$
\text{FIG. 39} = \begin{bmatrix}
-1 & 0 & 0 & -1 \\
0 & 0 & -1 & -1 \\
-1 & 0 & -1 & -1 \\
-1 & 71 & 39 & 0 \\
42 & 78 & 60 & 63 \\
25 & 15 & 54 & 71 \\
3 & 69 & 34 & 27 \\
54 & 64 & 80 & -1 \\
13 & 70 & -1 & 50 \\
73 & -1 & 57 & 61 \\
-1 & 68 & 20 & 36 \\
53 & 2 & 75 & -1 \\
33 & 12 & 56 & -1 \\
74 & 36 & -1 & 67 \\
-1 & -1 & 44 & 80 \\
-1 & -1 & 20 & -1 \\
-1 & 54 & -1 & 36 \\
-1 & 25 & -1 & 12 \\
23 & -1 & 73 & -1 \\
78 & -1 & -1 & 74 \\
-1 & 6 & 78 & -1 \\
41 & 46 & -1 & -1 \\
-1 & -1 & 6 & 50 \\
65 & -1 & -1 & 73 \\
-1 & -1 & 25 & 22 \\
77 & -1 & -1 & 79
\end{bmatrix}
$$

FIG. 37   FIG. 38   FIG. 39

$$\begin{bmatrix} -1 & 0 & 0 & -1 \\ 0 & 0 & -1 & -1 \\ -1 & 0 & -1 & -1 \\ -1 & 70 & 33 & 32 \\ 34 & 53 & 15 & 69 \\ 26 & 32 & 43 & 78 \\ 72 & 3 & 36 & 29 \\ 27 & 56 & 36 & 43 \\ 73 & 23 & 19 & 40 \\ -1 & 51 & 34 & 66 \\ 43 & -1 & 78 & 52 \\ 12 & 17 & -1 & 66 \\ 56 & 0 & 51 & -1 \\ -1 & 57 & 0 & 13 \\ 52 & -1 & -1 & 34 \\ 10 & -1 & -1 & 20 \\ -1 & 36 & 14 & -1 \\ 4 & -1 & 76 & -1 \\ -1 & 56 & -1 & 57 \\ 21 & 18 & -1 & -1 \\ -1 & -1 & 16 & 27 \\ -1 & 38 & 31 & -1 \\ 6 & -1 & -1 & 35 \\ 10 & -1 & -1 & 15 \\ -1 & -1 & 35 & 32 \\ 30 & -1 & -1 & 48 \end{bmatrix}$$

FIG. 40

$$\begin{bmatrix} -1 & 0 & 0 & -1 \\ 0 & 0 & -1 & -1 \\ -1 & 0 & -1 & -1 \\ -1 & 27 & 37 & 35 \\ 64 & 18 & 6 & 23 \\ 63 & 31 & 36 & 73 \\ 10 & 26 & 28 & 9 \\ 74 & 30 & 56 & 48 \\ 12 & 74 & 50 & 59 \\ -1 & 51 & 16 & 52 \\ 61 & -1 & 30 & 49 \\ 53 & 42 & -1 & 48 \\ -1 & 12 & 76 & 50 \\ 30 & 72 & -1 & 76 \\ 34 & -1 & 40 & -1 \\ 60 & -1 & -1 & 11 \\ -1 & 7 & 42 & -1 \\ 3 & 10 & -1 & -1 \\ -1 & -1 & 25 & 4 \\ -1 & -1 & 13 & 40 \\ 41 & 16 & -1 & -1 \\ 74 & 13 & -1 & -1 \\ -1 & -1 & 26 & 50 \\ 3 & -1 & -1 & 17 \\ -1 & -1 & 51 & 37 \\ 60 & -1 & -1 & 51 \end{bmatrix}$$

FIG. 41

$$\begin{bmatrix} -1 & 0 & 0 & -1 \\ 0 & 0 & -1 & -1 \\ -1 & 0 & -1 & -1 \\ -1 & 38 & 28 & 50 \\ 75 & 7 & 79 & 72 \\ 31 & 9 & 15 & 39 \\ 37 & 2 & 24 & 70 \\ 16 & 9 & 62 & 57 \\ 38 & 9 & 78 & 40 \\ 50 & 75 & 77 & 33 \\ 69 & 37 & 72 & -1 \\ -1 & 37 & 45 & 51 \\ 59 & 40 & 68 & -1 \\ 18 & -1 & 16 & 60 \\ -1 & 7 & -1 & 25 \\ -1 & -1 & 27 & 5 \\ 6 & 23 & -1 & -1 \\ 63 & -1 & 55 & -1 \\ -1 & 39 & -1 & 28 \\ -1 & 27 & -1 & 9 \\ 64 & -1 & 76 & -1 \\ -1 & -1 & 51 & 60 \\ 5 & 59 & -1 & -1 \\ 29 & -1 & -1 & 61 \\ -1 & -1 & 73 & 45 \\ 66 & -1 & -1 & 60 \end{bmatrix}$$

$$\begin{bmatrix}
-1 & 0 & 0 & -1 \\
0 & 0 & -1 & -1 \\
-1 & 0 & -1 & -1 \\
-1 & 63 & 6 & 7 \\
75 & 35 & 11 & 25 \\
79 & -1 & 48 & 39 \\
52 & 22 & 31 & 67 \\
12 & 55 & 41 & 14 \\
8 & 37 & 52 & 45 \\
52 & 69 & 24 & 6 \\
75 & 27 & 22 & 3 \\
16 & 27 & 52 & 9 \\
53 & 8 & 35 & 72 \\
26 & 9 & -1 & -1 \\
-1 & -1 & 17 & 43 \\
-1 & 9 & 42 & -1 \\
73 & -1 & -1 & 70 \\
-1 & 62 & -1 & 62 \\
14 & -1 & 75 & -1 \\
26 & -1 & -1 & 58 \\
-1 & 63 & 68 & -1 \\
-1 & 14 & -1 & 27 \\
42 & -1 & 62 & -1 \\
51 & -1 & -1 & 61 \\
-1 & -1 & 39 & 62 \\
65 & -1 & -1 & 69
\end{bmatrix}$$

FIG. 44

$$\begin{bmatrix}
-1 & 0 & 0 & -1 \\
0 & 0 & -1 & -1 \\
-1 & 0 & -1 & -1 \\
-1 & 3 & 63 & 38 \\
44 & 64 & 52 & 9 \\
43 & 29 & 23 & 3 \\
12 & 65 & 5 & -1 \\
-1 & 73 & 14 & 36 \\
23 & -1 & 4 & 55 \\
35 & 59 & -1 & 31 \\
26 & 41 & -1 & 7 \\
34 & 60 & 72 & -1 \\
-1 & -1 & 2 & 32 \\
9 & -1 & 32 & -1 \\
-1 & 12 & -1 & 6 \\
16 & -1 & -1 & 33 \\
-1 & 64 & 9 & -1 \\
15 & 28 & -1 & -1 \\
-1 & -1 & 72 & 62 \\
-1 & -1 & 3 & 23 \\
67 & 77 & -1 & -1 \\
78 & 29 & -1 & -1 \\
-1 & -1 & 10 & 20 \\
-1 & -1 & 40 & -1 \\
53 & -1 & -1 & 50 \\
23 & -1 & -1 & 28
\end{bmatrix}$$

FIG. 45

$$\begin{bmatrix}
-1 & 0 & 0 & -1 \\
0 & 0 & -1 & -1 \\
-1 & 0 & -1 & -1 \\
-1 & 40 & 67 & 55 \\
76 & 66 & 30 & 14 \\
44 & -1 & 42 & 77 \\
62 & 68 & 51 & -1 \\
68 & -1 & 2 & 47 \\
-1 & 79 & 29 & 56 \\
30 & 50 & -1 & 24 \\
67 & 23 & 59 & -1 \\
-1 & 51 & 7 & -1 \\
4 & -1 & -1 & 77 \\
27 & -1 & 80 & -1 \\
-1 & 62 & -1 & 67 \\
21 & 61 & -1 & -1 \\
-1 & -1 & 67 & 64 \\
-1 & -1 & 25 & 41 \\
60 & 67 & -1 & -1 \\
-1 & 75 & 16 & -1 \\
3 & -1 & -1 & 4 \\
75 & -1 & -1 & 50 \\
-1 & 46 & 27 & -1 \\
-1 & -1 & 44 & 26 \\
53 & -1 & -1 & 51 \\
49 & -1 & -1 & 75
\end{bmatrix}$$

$$\begin{bmatrix} -1 & 0 & 0 & -1 \\ 0 & 0 & -1 & -1 \\ -1 & 0 & -1 & -1 \\ -1 & 79 & 64 & 78 \\ 55 & 21 & 7 & 4 \\ 67 & 74 & 38 & 40 \\ -1 & 78 & 77 & 73 \\ 17 & 27 & -1 & -1 \\ 39 & 66 & 74 & -1 \\ 61 & -1 & 21 & -1 \\ -1 & 32 & -1 & 74 \\ 19 & -1 & -1 & 79 \\ -1 & 14 & 34 & -1 \\ -1 & -1 & 35 & 20 \\ 75 & 22 & -1 & -1 \\ 30 & -1 & -1 & 47 \\ -1 & 40 & 14 & -1 \\ 13 & -1 & 2 & -1 \\ -1 & 80 & -1 & 7 \\ 5 & -1 & -1 & 50 \\ -1 & 14 & 23 & -1 \\ 2 & -1 & -1 & 14 \\ -1 & 4 & 53 & -1 \\ -1 & -1 & 76 & 11 \\ 76 & -1 & -1 & 68 \\ 54 & -1 & -1 & 26 \end{bmatrix}$$

FIG. 46

$$\begin{bmatrix} -1 & 0 & 0 & -1 \\ 0 & 0 & -1 & -1 \\ -1 & 0 & -1 & -1 \\ -1 & 36 & -1 & 66 \\ 52 & 73 & 61 & 21 \\ 25 & -1 & 6 & 80 \\ -1 & 33 & -1 & 32 \\ -1 & 5 & 35 & -1 \\ 68 & -1 & -1 & 32 \\ -1 & 35 & -1 & 68 \\ 24 & -1 & 43 & -1 \\ 73 & -1 & -1 & 39 \\ -1 & 52 & 46 & -1 \\ -1 & 71 & 66 & -1 \\ 21 & -1 & 4 & -1 \\ 39 & 80 & -1 & -1 \\ -1 & -1 & 40 & 77 \\ 19 & -1 & -1 & 26 \\ -1 & 29 & 28 & -1 \\ 21 & -1 & 12 & -1 \\ -1 & 34 & -1 & 54 \\ 77 & 25 & -1 & -1 \\ -1 & -1 & 44 & 24 \\ -1 & -1 & 51 & 76 \\ 68 & -1 & -1 & 59 \\ 4 & -1 & -1 & 0 \end{bmatrix}$$

FIG. 47

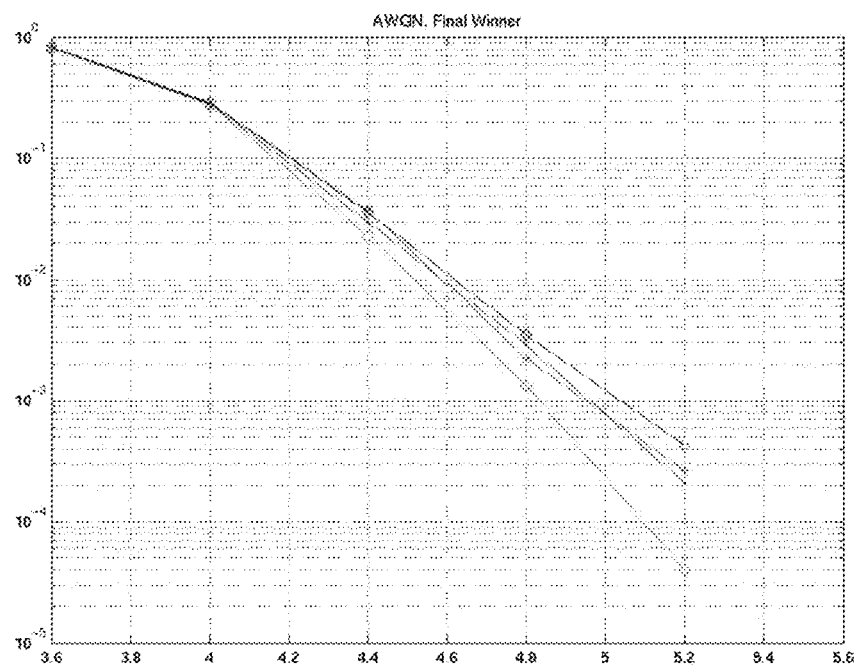
FIG. 48A
FIG. 48B
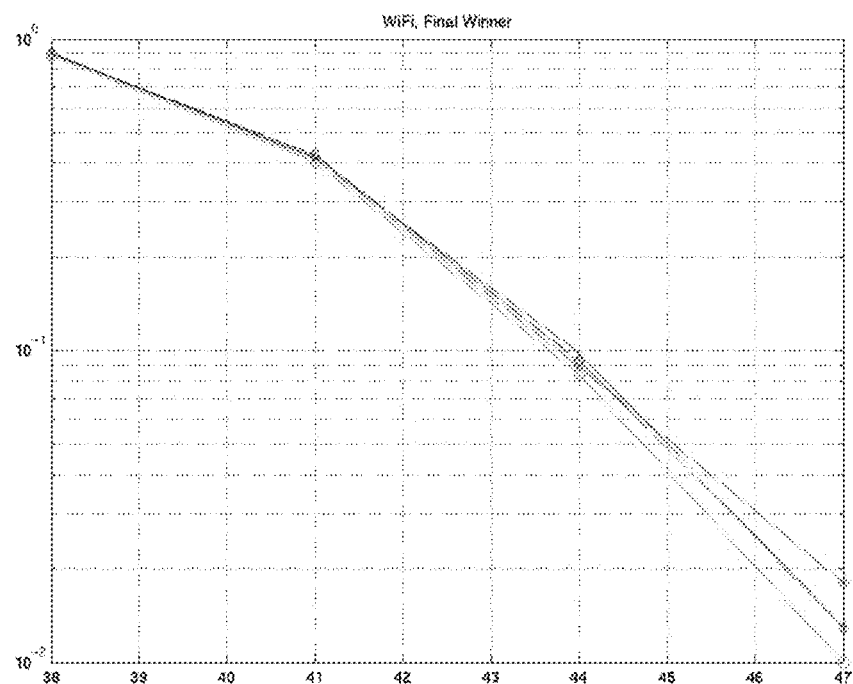

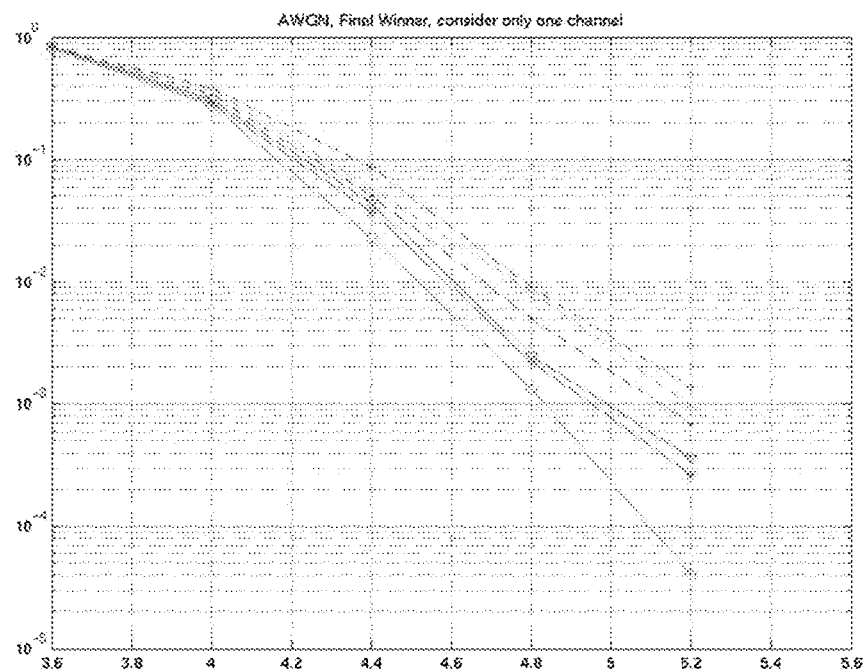
FIG. 49A
FIG. 49B
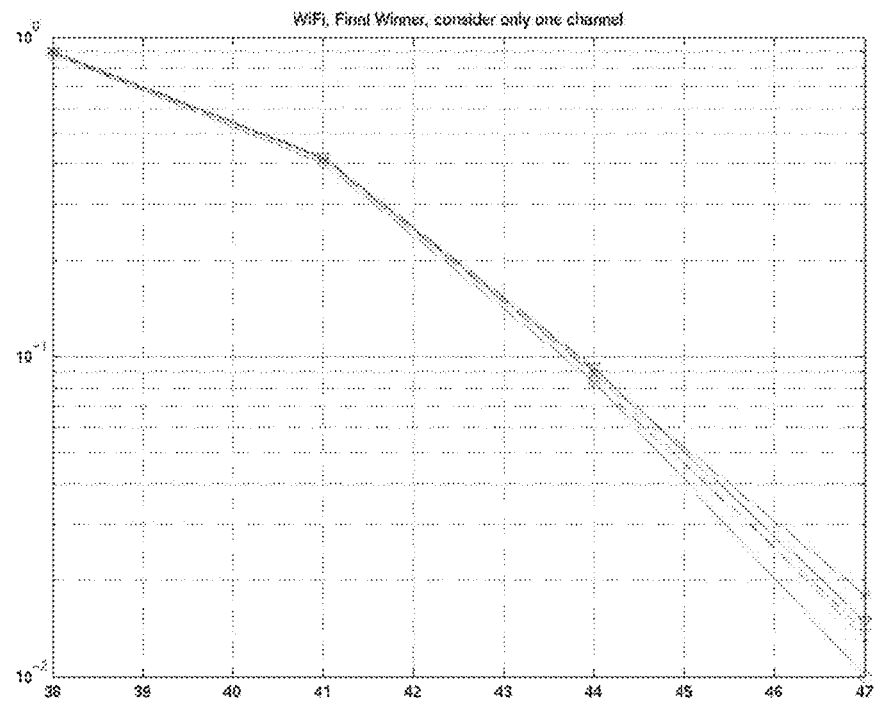

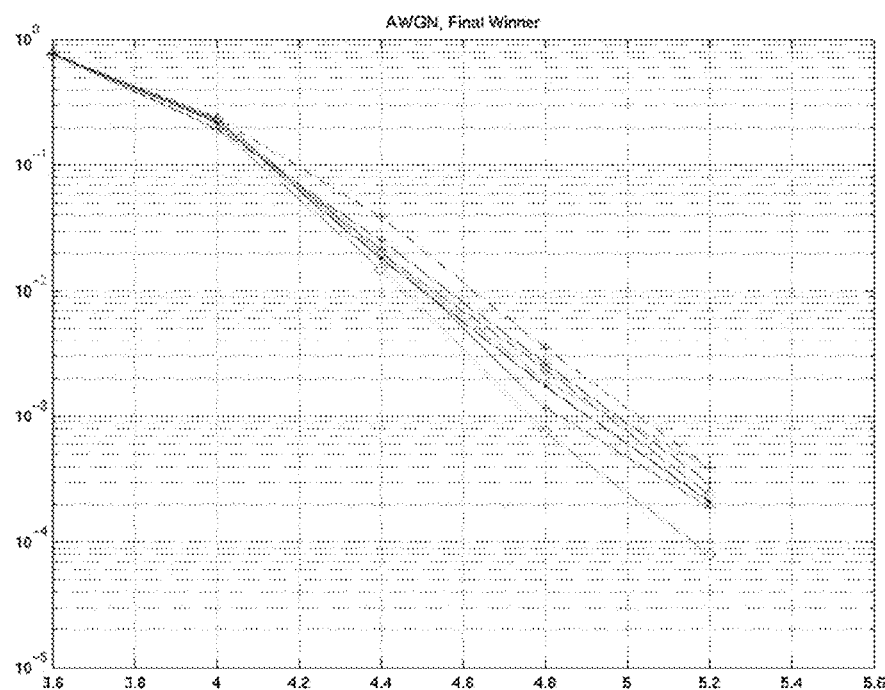
FIG. 50A
FIG. 50B
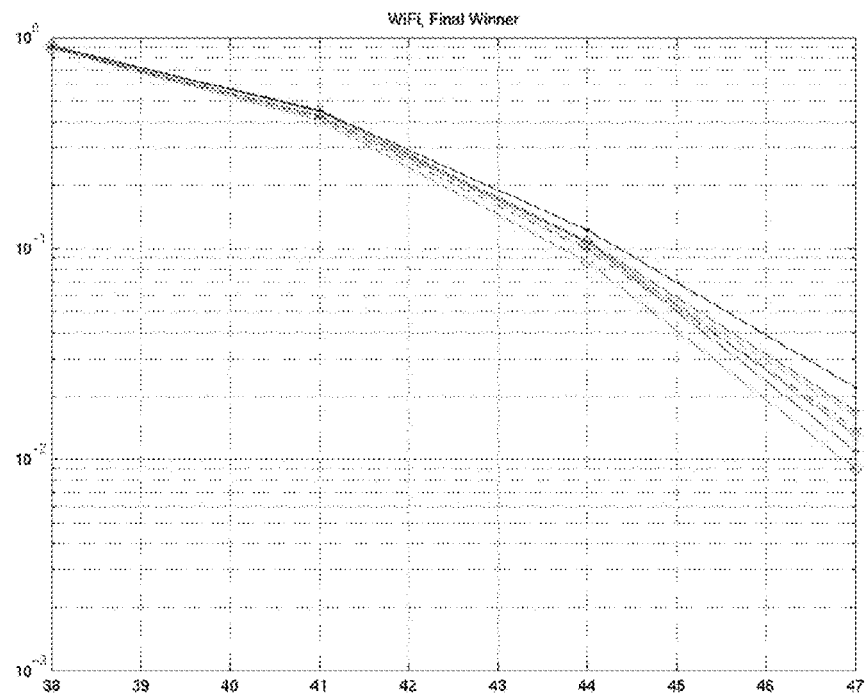

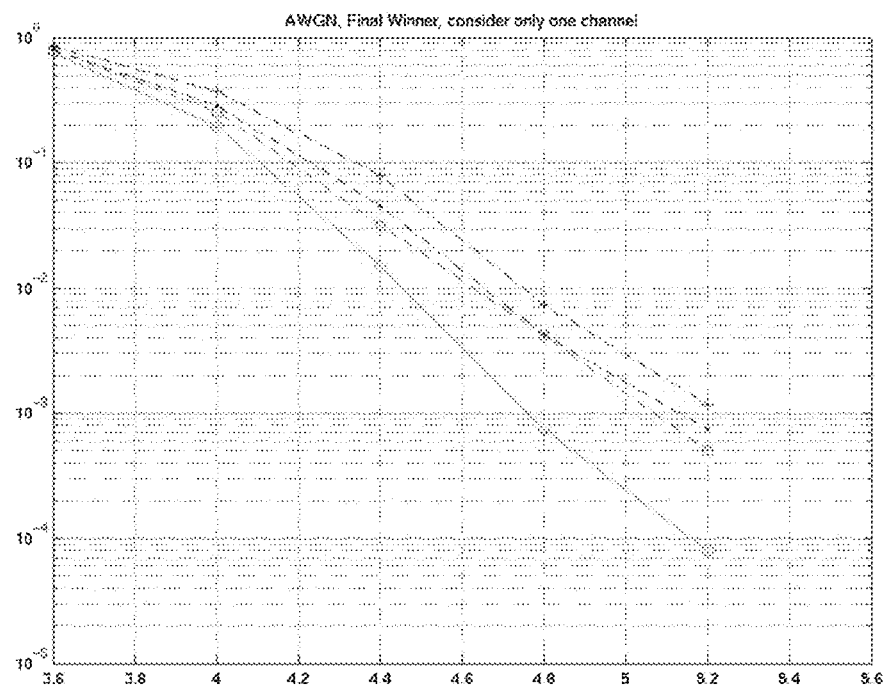
FIG. 51A
FIG. 51B
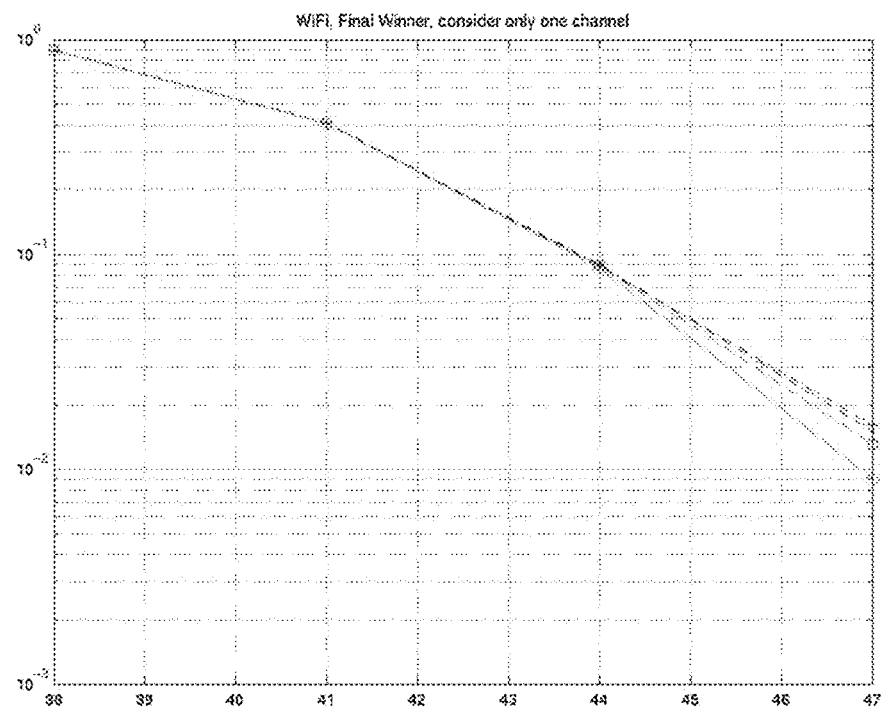

$$\text{FIG. 53:} \begin{bmatrix} 21 & 16 & 11 & 20 & 20 & 10 & 22 & 21 & 11 & 25 & 15 & 13 & 2 & 14 & 6 & 22 & 7 & 16 & 8 & 18 & 18 & 1 & 0 & -1 \\ -1 & 23 & 6 & 0 & 13 & 9 & 5 & 12 & 18 & 19 & 18 & 26 & 9 & 8 & 4 & 15 & 12 & 24 & 1 & 8 & 0 & 0 & -1 & 0 \\ 0 & 14 & 25 & 10 & 15 & 6 & 14 & 18 & 15 & 0 & 3 & 25 & 22 & 25 & 0 & 25 & 23 & 7 & 9 & 25 & 26 & -1 & 0 & 0 \end{bmatrix}$$

FIG. 53

$$\text{FIG. 54:} \begin{bmatrix} 15 & -1 & 16 & 21 & 23 & 9 & 4 & 9 & 17 & 9 & 13 & 10 & 7 & 18 & 7 & 22 & 4 & 2 & 26 & 16 & 8 & 18 & 23 & 3 & 13 & 1 & 0 & -1 \\ -1 & 23 & 12 & 5 & 2 & 13 & 18 & 0 & 14 & 21 & 20 & 11 & 2 & 12 & 23 & 12 & 2 & 26 & 8 & 18 & 23 & 12 & 6 & 1 & 0 & 0 & -1 & 0 \\ 1 & 26 & 1 & 25 & 19 & 0 & 20 & 19 & 22 & 20 & 11 & 7 & 13 & 19 & 0 & 21 & 26 & 8 & 18 & 10 & 1 & 0 & -1 & 0 & 0 \end{bmatrix}$$

FIG. 54

$$\text{FIG. 55:} \begin{bmatrix} 15 & 24 & 22 & 0 & 4 & 18 & 6 & 15 & 1 & 4 & 22 & 4 & 7 & 3 & 19 & 16 & 1 & 16 & 5 & 6 & 4 & 0 & -1 \\ -1 & -1 & 24 & 24 & 15 & 23 & 19 & 25 & 24 & 26 & 9 & 2 & 22 & 4 & 9 & 20 & 20 & 7 & 21 & 12 & 25 & 0 & 0 \\ 22 & 17 & -1 & 19 & 21 & 7 & 5 & 23 & 7 & 2 & 23 & 25 & 4 & 6 & 6 & 12 & 14 & 11 & 20 & 24 & 15 & 1 & 0 \end{bmatrix}$$

FIG. 55

$$\begin{bmatrix} 15 & -1 & 13 & 4 & 26 & 22 & 2 & 23 & 24 & 10 & 6 & 20 & 14 & 1 & 9 & 18 & 22 & 24 & 2 & 24 & 2 & 1 & 0 & -1 & 0 & 0 \\ -1 & 15 & -1 & 2 & 0 & 15 & 9 & 8 & 21 & 20 & 25 & 26 & 3 & 5 & 11 & 8 & 16 & 12 & 16 & 6 & 25 & 0 & 0 & 0 & 0 & -1 \\ 1 & 23 & 16 & 24 & 25 & 2 & 24 & 20 & 26 & 11 & 2 & 10 & 26 & 11 & 20 & 24 & 13 & 6 & 23 & 16 & 18 & 1 & -1 & 0 & 0 & 0 \end{bmatrix}$$

FIG. 56

$$\begin{bmatrix} 16 & 13 & -1 & 26 & 26 & 22 & 5 & 13 & 4 & 18 & 21 & 9 & 22 & 15 & 13 & 10 & 17 & 23 & 25 & 16 & 19 & 1 & 0 & -1 & 0 & 0 \\ -1 & -1 & 14 & 9 & 3 & 8 & 8 & 2 & 15 & 3 & 22 & 1 & 19 & 13 & 8 & 6 & 23 & 11 & 16 & 23 & 21 & 0 & 0 & 0 & 0 & -1 \\ 21 & 3 & 10 & 2 & 7 & 21 & 3 & 1 & 23 & 19 & 14 & 11 & 13 & 24 & 10 & 4 & 2 & 18 & 4 & 26 & 6 & 1 & -1 & 0 & 0 & 0 \end{bmatrix}$$

FIG. 57

$$\begin{bmatrix} 26 & -1 & 17 & 6 & 3 & 17 & 10 & 26 & 0 & 7 & 9 & 24 & 11 & 17 & 9 & 5 & 5 & 24 & 20 & 13 & 8 & 21 & 1 & 0 & -1 & 0 & 0 \\ -1 & 24 & 8 & -1 & -1 & 21 & 20 & 24 & 1 & 9 & 21 & 20 & 26 & 26 & 20 & 0 & 24 & 16 & 23 & 6 & 25 & 6 & 0 & 0 & 0 & 0 & -1 \\ 13 & 1 & -1 & 7 & 15 & 11 & 17 & 8 & 15 & 18 & 4 & 22 & 15 & 25 & 15 & 21 & 7 & 19 & 18 & 11 & 12 & 1 & -1 & 0 & 0 & 0 \end{bmatrix}$$

$$\begin{bmatrix} 8 & 24 & -1 & 25 & 17 & -1 & 14 & 6 & 15 & 3 & 22 & 15 & 0 & 6 & 0 & 17 & 22 & 20 & 4 & 22 & 25 & 1 & 0 & -1 \\ -1 & 25 & 5 & -1 & 3 & 15 & -1 & 4 & 3 & 12 & 5 & 0 & 20 & 22 & 8 & 24 & 14 & 4 & 7 & 12 & 4 & 0 & 0 & 0 \\ 10 & -1 & 19 & 24 & -1 & 22 & 20 & 14 & 6 & 10 & 0 & 18 & 13 & 21 & 19 & 21 & 6 & 13 & 13 & 20 & 20 & 1 & -1 & 0 \end{bmatrix}$$

FIG. 60

$$\begin{bmatrix} -1 & 10 & -1 & -1 & 14 & -1 & 20 & 12 & -1 & 24 & 20 & 20 & -1 & 17 & 0 & 19 & 0 & 4 & 15 & 0 & 18 & 20 & -1 & 0 & 0 & -1 \\ -1 & -1 & 4 & 26 & -1 & 20 & 18 & -1 & 16 & 8 & 2 & -1 & 11 & 4 & 16 & 9 & 24 & 26 & 9 & 20 & 0 & 16 & -1 & 0 & 0 & -1 \\ -1 & 1 & -1 & -1 & 3 & -1 & -1 & -1 & 3 & 21 & 10 & 8 & 3 & 20 & 26 & 26 & 9 & 17 & 22 & 25 & 0 & 20 & -1 & -1 & 0 & -1 \end{bmatrix}$$

(The figures above are best-effort reconstructions of the rotated matrices shown.)

FIG. 61

$$\begin{bmatrix} 8 & -1 & -1 & 14 & -1 & -1 & 25 & -1 & -1 & 24 & 19 & -1 & 16 & 25 & 10 & 20 & 20 & 4 & 26 & 11 & 19 & -1 & 0 & 0 & -1 & -1 \\ -1 & -1 & 5 & -1 & -1 & 6 & 23 & 19 & 8 & -1 & -1 & 15 & 26 & 13 & 19 & 22 & 23 & 11 & 10 & 6 & 11 & 0 & -1 & 0 & -1 & -1 \\ 22 & 2 & 8 & 0 & 19 & 8 & -1 & 14 & -1 & 3 & 3 & 0 & 21 & -1 & 11 & 11 & 26 & 2 & 6 & 3 & 24 & 9 & -1 & -1 & -1 & -1 \end{bmatrix}$$

$$\begin{bmatrix} -1 & 0 & 0 & -1 \\ 0 & 0 & -1 & -1 \\ -1 & 0 & -1 & -1 \\ 24 & 25 & 17 & 21 \\ -1 & 14 & 7 & 17 \\ 12 & 20 & 15 & 21 \\ 9 & 24 & 8 & 4 \\ 11 & 18 & 7 & 9 \\ 12 & 22 & 21 & 12 \\ 2 & 14 & 20 & 19 \\ 3 & -1 & 24 & 13 \\ 10 & 4 & -1 & 12 \\ -1 & 13 & 4 & 15 \\ 14 & -1 & -1 & 10 \\ 12 & 2 & 16 & -1 \\ 24 & -1 & 2 & -1 \\ -1 & 18 & -1 & 11 \\ 10 & -1 & -1 & 22 \\ -1 & -1 & 5 & 0 \\ -1 & 26 & 2 & -1 \\ 15 & -1 & -1 & 18 \\ 2 & -1 & 24 & -1 \\ -1 & 4 & -1 & 10 \\ 15 & -1 & -1 & -1 \\ -1 & -1 & 20 & 14 \end{bmatrix}$$

FIG. 62

$$\begin{bmatrix} -1 & 0 & 0 & -1 \\ 0 & 0 & -1 & -1 \\ -1 & 0 & -1 & -1 \\ 18 & 13 & 17 & 16 \\ 15 & -1 & 5 & 25 \\ 24 & 12 & -1 & 5 \\ 21 & 4 & 3 & -1 \\ -1 & 10 & 19 & 20 \\ 7 & -1 & 8 & 2 \\ 14 & 11 & -1 & 3 \\ -1 & 6 & 25 & 10 \\ 6 & 24 & -1 & -1 \\ -1 & 8 & 20 & -1 \\ 21 & -1 & 1 & -1 \\ -1 & -1 & 8 & 5 \\ 14 & -1 & -1 & 19 \\ -1 & 2 & -1 & 4 \\ 24 & -1 & 26 & -1 \\ 6 & 2 & -1 & -1 \\ -1 & 19 & 12 & -1 \\ 17 & -1 & -1 & 24 \\ -1 & -1 & 14 & 3 \\ -1 & 22 & -1 & 13 \\ 25 & -1 & -1 & 19 \\ -1 & -1 & 22 & 8 \end{bmatrix}$$

FIG. 63

$$\begin{bmatrix} -1 & 0 & 0 & -1 \\ 0 & 0 & -1 & -1 \\ -1 & 1 & 0 & -1 \\ -1 & 26 & 23 & 8 \\ 5 & 21 & 15 & 23 \\ 11 & 8 & 24 & 16 \\ 19 & 2 & 24 & 14 \\ -1 & 4 & -1 & 0 \\ -1 & 22 & 26 & -1 \\ 21 & -1 & -1 & 9 \\ -1 & -1 & 15 & 12 \\ 24 & -1 & 11 & -1 \\ 15 & 19 & -1 & -1 \\ -1 & 18 & 24 & -1 \\ -1 & -1 & 14 & 16 \\ 17 & -1 & -1 & 9 \\ 10 & 25 & -1 & -1 \\ -1 & 21 & -1 & 20 \\ 11 & -1 & 13 & -1 \\ -1 & 14 & 22 & -1 \\ -1 & -1 & 10 & 14 \\ -1 & 14 & -1 & 9 \\ 23 & -1 & -1 & 13 \\ -1 & -1 & 10 & 16 \\ 21 & -1 & -1 & 3 \end{bmatrix}$$

FIG. 64

$$\text{FIG. 65: } \begin{bmatrix}
-1 & 0 & 0 & -1 \\
0 & 0 & -1 & -1 \\
-1 & 0 & -1 & -1 \\
0 & 19 & 9 & 14 \\
4 & 21 & 25 & -1 \\
15 & 21 & 20 & 26 \\
7 & 9 & 5 & 22 \\
-1 & 4 & 7 & -1 \\
22 & 11 & -1 & -1 \\
-1 & -1 & 10 & 2 \\
-1 & -1 & 19 & -1 \\
2 & -1 & -1 & 5 \\
-1 & -1 & -1 & 25 \\
4 & 26 & -1 & -1 \\
-1 & -1 & 16 & 14 \\
-1 & 13 & 11 & -1 \\
22 & -1 & -1 & 21 \\
15 & 13 & -1 & -1 \\
-1 & -1 & 14 & 16 \\
11 & -1 & 2 & -1 \\
24 & 20 & -1 & -1 \\
-1 & -1 & 10 & 11 \\
-1 & 11 & -1 & 2 \\
-1 & -1 & 3 & 17 \\
20 & -1 & -1 & 2
\end{bmatrix}$$

$$\text{FIG. 66: } \begin{bmatrix}
-1 & 0 & 0 & -1 \\
0 & 0 & -1 & -1 \\
-1 & 0 & -1 & -1 \\
13 & 6 & 21 & 11 \\
22 & 12 & 7 & 19 \\
21 & 19 & 25 & 21 \\
13 & 17 & 14 & 8 \\
22 & -1 & -1 & 21 \\
-1 & -1 & 13 & -1 \\
8 & -1 & -1 & 25 \\
-1 & -1 & 11 & 19 \\
-1 & 16 & 12 & -1 \\
3 & 9 & -1 & -1 \\
3 & -1 & 6 & -1 \\
-1 & -1 & 21 & 16 \\
5 & -1 & -1 & 14 \\
-1 & 23 & -1 & 21 \\
-1 & 21 & 13 & -1 \\
6 & -1 & -1 & 18 \\
0 & -1 & 15 & -1 \\
-1 & 3 & 16 & -1 \\
-1 & 3 & -1 & 22 \\
17 & -1 & -1 & 23 \\
-1 & -1 & 5 & 20 \\
11 & -1 & -1 & 13
\end{bmatrix}$$

$$\text{FIG. 67: } \begin{bmatrix}
-1 & 0 & 0 & -1 \\
0 & 0 & -1 & -1 \\
-1 & 0 & -1 & -1 \\
49 & 1 & 0 & 1 \\
49 & 40 & 45 \\
18 & 38 & 52 \\
12 & 22 & 28 \\
30 & 4 & 42 \\
12 & 25 & 23 \\
39 & 32 & 10 \\
33 & 38 & 40 \\
48 & 50 & 33 \\
14 & 40 & 33 \\
38 & 22 & 32 \\
30 & 38 & 12 \\
7 & 31 & 48 \\
15 & 12 & 45 \\
3 & 47 & 38 \\
7 & 16 & 29 \\
27 & 22 & 42 \\
14 & 28 & 37 \\
42 & 40 & 17 \\
13 & 53 & 17 \\
35 & 41 & 8 \\
33 & 22 & 25
\end{bmatrix}$$

$$\begin{bmatrix} 42 & 37 & 31 & 4 & 11 & 11 & 38 & 7 & 12 & 28 & 39 & 24 & 31 & 26 & 25 & 32 & 0 & 6 & 7 & 27 & 9 & 1 & 0 & -1 \\ 38 & 16 & 3 & 31 & 35 & 47 & 12 & 50 & 7 & 34 & 49 & 7 & 32 & 2 & 15 & 36 & 51 & 48 & 20 & 46 & 11 & 0 & 0 & 0 \\ 33 & 5 & 17 & 33 & 34 & 4 & 25 & 42 & 43 & 6 & 46 & 40 & 36 & 46 & 23 & 53 & 34 & 0 & 16 & 11 & 21 & 1 & -1 & 0 \end{bmatrix}$$

FIG. 68

$$\begin{bmatrix} 20 & 53 & 18 & 7 & 4 & 28 & 0 & 10 & 34 & 48 & 34 & 0 & 23 & 32 & 24 & 11 & 50 & 20 & 17 & 14 & 1 & 0 & -1 \\ 46 & 24 & 34 & 27 & 35 & 33 & 2 & 31 & 49 & 16 & 32 & 4 & 41 & 6 & 25 & 35 & 34 & 33 & 9 & 23 & 0 & 0 & 0 \\ 1 & 22 & 21 & 41 & 46 & 3 & 48 & 47 & 51 & 43 & 10 & 10 & 31 & 28 & 43 & 47 & 39 & 5 & 24 & 7 & 1 & -1 & 0 \end{bmatrix}$$

FIG. 69

$$\begin{bmatrix} 16 & 39 & 44 & 12 & 46 & 39 & 43 & 32 & 25 & 43 & 29 & 45 & 20 & 35 & 2 & 53 & 52 & 31 & 51 & 28 & 21 & 1 & 0 & -1 \\ -1 & 22 & 21 & 4 & 42 & 19 & 46 & 13 & 19 & 18 & 5 & 18 & 29 & 14 & 34 & 6 & 15 & 51 & 3 & 47 & 23 & 0 & 0 & 0 \\ 37 & 26 & 2 & 48 & 18 & 24 & 44 & 9 & 1 & 37 & 44 & 40 & 23 & 48 & 31 & 37 & 4 & 20 & 49 & 30 & 32 & 1 & -1 & 0 \end{bmatrix}$$

FIG. 70

$$\begin{bmatrix} 21 & 25 & 17 & 37 & 10 & 21 & 12 & 42 & 12 & 42 & 39 & 5 & 6 & 1 & 38 & 2 & 14 & 53 & 52 & 28 & 1 & 0 & -1 \\ -1 & 45 & 0 & 19 & 49 & 32 & 46 & 9 & 27 & 23 & 14 & 33 & 46 & 45 & 17 & 48 & 52 & 2 & 41 & 32 & 0 & 0 & 0 \\ 44 & -1 & 50 & 17 & 2 & 18 & 11 & 44 & 53 & 28 & 29 & 16 & 21 & 30 & 6 & 14 & 51 & 23 & 17 & 9 & 1 & -1 & 0 \end{bmatrix}$$

FIG. 71

$$\begin{bmatrix} 10 & -1 & 32 & 9 & 19 & 13 & 33 & 11 & 52 & 8 & 8 & 51 & 26 & 41 & 43 & 31 & 50 & 10 & 3 & 8 & 1 & 1 & 0 & -1 \\ -1 & 39 & 12 & 23 & 32 & 16 & 4 & 51 & 16 & 18 & 32 & 6 & 9 & 9 & 27 & 18 & 43 & 38 & 5 & 0 & 37 & 0 & 0 & 0 \\ 1 & 0 & 36 & 4 & 28 & 41 & 26 & 41 & 46 & 32 & 43 & 23 & 4 & 12 & 33 & 47 & 15 & 51 & 36 & 46 & 35 & 1 & -1 & 0 \end{bmatrix}$$

FIG. 72

$$\begin{bmatrix} 14 & 48 & 47 & -1 & 6 & 46 & 42 & 23 & 7 & 1 & 45 & 32 & 16 & 25 & 49 & 26 & 6 & 50 & 8 & 40 & 51 & 40 & 4 & 38 & 1 & 0 & -1 \\ -1 & 47 & 44 & 6 & 42 & 1 & 30 & 7 & 33 & 51 & 12 & 46 & 26 & 41 & 24 & 18 & 50 & 33 & 50 & 41 & 1 & 14 & 53 & 49 & 0 & 0 & 0 \\ 8 & 32 & -1 & 30 & 23 & 7 & 33 & 43 & 26 & 5 & 43 & 26 & 46 & 5 & 53 & 44 & 45 & 52 & 45 & 9 & 6 & 6 & 3 & 23 & 1 & -1 & 0 \end{bmatrix}$$

FIG. 73

$$\text{FIG. 74:} \begin{bmatrix}
0 & 10 & -1 & 4 & 47 & 3 & 19 & 18 & 39 & 33 & 27 & 50 & 44 & 13 & 18 & 43 & 25 & 47 & 46 & 51 & 49 & 1 & 0 & -1 \\
-1 & -1 & 51 & 9 & 14 & 16 & 6 & 20 & 32 & 51 & 0 & 3 & 30 & 7 & 35 & 15 & 33 & 51 & 34 & 9 & 6 & 0 & 0 & 0 \\
3 & 43 & 21 & -1 & 48 & 38 & 25 & 38 & 49 & 4 & 20 & 14 & 38 & 21 & 22 & 3 & 48 & 29 & 19 & 25 & 36 & 1 & -1 & 0
\end{bmatrix}$$

FIG. 74

$$\text{FIG. 75:} \begin{bmatrix}
47 & -1 & 12 & -1 & 36 & -1 & 29 & -1 & 43 & 15 & 21 & 21 & 38 & -1 & 47 & 5 & 15 & 25 & 24 & 10 & -1 & 0 & 1 & -1 \\
-1 & -1 & -1 & 6 & 43 & -1 & -1 & 9 & 0 & -1 & -1 & 38 & 44 & 43 & 42 & 25 & 33 & 28 & 53 & 26 & 0 & 0 & 0 & 0 \\
-1 & 5 & -1 & 48 & -1 & 21 & -1 & 38 & 13 & 16 & 4 & 48 & 44 & 50 & 48 & 49 & 2 & 2 & 13 & 37 & -1 & -1 & -1 & -1 \\
47 & -1 & 7 & -1 & -1 & 25 & -1 & -1 & -1 & -1 & -1 & -1 & 37 & 25 & 5 & 30 & 30 & 36 & 13 & 3 & -1 & -1 & -1 & -1 \\
3 & -1 & -1 & & & & & & & & & & & & & & & & & & & & & \\
-1 & -1 & -1 & & & & & & & & & & & & & & & & & & & & & \\
23 & 10 & & & & & & & & & & & & & & & & & & & & & &
\end{bmatrix}$$

FIG. 75

$$\text{FIG. 76:} \begin{bmatrix}
-1 & -1 & -1 & -1 & 8 & -1 & -1 & 53 & 31 & 12 & 6 & 0 & 29 & 36 & 33 & 10 & 38 & 19 & 52 & 21 & -1 & 0 & 1 & -1 \\
-1 & 20 & -1 & -1 & -1 & 53 & -1 & 51 & 52 & -1 & 39 & -1 & -1 & -1 & 49 & 36 & 53 & 0 & 22 & 48 & 1 & 0 & 0 & 0 \\
-1 & -1 & -1 & -1 & 21 & 26 & 12 & -1 & -1 & 52 & 35 & 10 & -1 & 43 & 0 & 36 & 53 & 49 & 51 & 45 & 0 & -1 & -1 & -1 \\
3 & -1 & 13 & 28 & -1 & -1 & 24 & 41 & -1 & -1 & -1 & 48 & 36 & 53 & 24 & 34 & 49 & 22 & 30 & 40 & -1 & -1 & -1 & -1
\end{bmatrix}$$

FIG. 76

$$\text{FIG. 77}: \begin{bmatrix}
-1 & 0 & 1 & 16 & 21 & 41 & 13 & 16 & 42 & 9 & 47 & 47 & 12 & 45 & -1 & -1 & 53 & 24 & -1 & 2 & -1 & -1 & 16 & -1 & 37 \\
0 & 0 & 0 & 17 & 14 & 30 & 10 & 46 & 47 & 22 & 4 & -1 & -1 & 0 & 9 & 21 & -1 & 28 & -1 & 31 & -1 & 0 & -1 & -1 & -1 \\
0 & -1 & 1 & 51 & 52 & 17 & 38 & 35 & 20 & 16 & -1 & 20 & 34 & 17 & 42 & -1 & -1 & -1 & 20 & -1 & 4 & 37 & -1 & 4 & -1 \\
-1 & -1 & -1 & 51 & 16 & 9 & 16 & 50 & 28 & -1 & 4 & 16 & -1 & -1 & 49 & 8 & 23 & -1 & 29 & -1 & 40 & -1 & 43 & 33 & 30
\end{bmatrix}$$

$$\text{FIG. 78}: \begin{bmatrix}
-1 & 0 & 1 & 26 & 25 & 12 & 17 & 39 & 45 & 13 & 29 & 36 & 29 & 13 & -1 & -1 & 39 & -1 & 42 & 8 & -1 & -1 & 49 & -1 & 27 \\
0 & 0 & 0 & 19 & 20 & 31 & 48 & 41 & 31 & 34 & 36 & 11 & 34 & -1 & 1 & 42 & -1 & 41 & -1 & 49 & 24 & -1 & -1 & -1 & -1 \\
0 & -1 & 1 & 7 & 35 & 20 & 11 & 45 & 40 & 45 & 11 & 45 & -1 & 17 & 9 & 38 & 3 & -1 & 12 & -1 & -1 & 41 & -1 & 30 & -1 \\
-1 & -1 & -1 & 23 & 48 & 7 & 32 & 30 & 21 & 51 & 22 & 50 & 34 & 47 & 52 & -1 & -1 & 29 & -1 & -1 & 3 & 41 & 36 & 33 & 49
\end{bmatrix}$$

$$\text{FIG. 79}: \begin{bmatrix}
-1 & 0 & 1 & 36 & 7 & 17 & 13 & 12 & 36 & 30 & 38 & -1 & 3 & 38 & 30 & -1 & 10 & -1 & 50 & -1 & 8 & -1 & 3 & -1 & -1 \\
0 & 0 & 0 & 9 & 48 & 49 & 53 & 14 & 43 & 44 & 14 & 43 & -1 & 39 & -1 & 42 & -1 & 21 & 5 & -1 & -1 & -1 & -1 & -1 & -1 \\
0 & -1 & 1 & 15 & 52 & 23 & 43 & 46 & 39 & 41 & 9 & 24 & 22 & 1 & -1 & 37 & 30 & -1 & -1 & 19 & -1 & 15 & -1 & 4 & -1 \\
-1 & -1 & -1 & 35 & 32 & 17 & 36 & 46 & 28 & 0 & 27 & 48 & 52 & -1 & 4 & -1 & -1 & 28 & -1 & 37 & 50 & 1 & 4 & -1 & -1
\end{bmatrix}$$

$$\begin{bmatrix}
-1 & 0 & 0 & -1 \\
0 & 0 & -1 & -1 \\
-1 & 1 & 0 & -1 \\
18 & 40 & 50 & 35 \\
30 & -1 & 45 & 48 \\
6 & 18 & -1 & 7 \\
23 & 46 & 52 & -1 \\
-1 & 6 & 4 & 36 \\
28 & -1 & 15 & -1 \\
26 & 15 & 43 & -1 \\
-1 & 37 & 53 & 35 \\
49 & 35 & -1 & 39 \\
43 & 49 & -1 & -1 \\
43 & -1 & 27 & 38 \\
-1 & 17 & 0 & -1 \\
26 & 16 & -1 & -1 \\
36 & -1 & -1 & 16 \\
-1 & 49 & -1 & 42 \\
33 & -1 & 37 & -1 \\
-1 & 25 & -1 & 50 \\
-1 & -1 & 42 & 10 \\
33 & -1 & 41 & -1 \\
-1 & 3 & -1 & 16 \\
44 & -1 & -1 & 21 \\
-1 & -1 & 10 & 38
\end{bmatrix}$$

FIG. 80

$$\begin{bmatrix}
-1 & 0 & 0 & -1 \\
0 & 0 & -1 & -1 \\
-1 & 1 & 0 & -1 \\
2 & 35 & 32 & 41 \\
33 & 13 & 8 & 43 \\
50 & 53 & 7 & 39 \\
41 & 53 & 39 & -1 \\
45 & 14 & -1 & 17 \\
-1 & 36 & 45 & 52 \\
43 & 7 & 36 & -1 \\
22 & -1 & 6 & 46 \\
29 & 32 & 47 & -1 \\
-1 & 29 & -1 & 37 \\
-1 & -1 & 8 & 19 \\
-1 & 21 & 39 & -1 \\
-1 & 7 & -1 & 20 \\
40 & -1 & -1 & 6 \\
-1 & 0 & 3 & -1 \\
6 & -1 & 2 & -1 \\
-1 & 36 & -1 & 4 \\
31 & -1 & -1 & 12 \\
0 & -1 & 5 & -1 \\
-1 & 3 & -1 & 48 \\
28 & -1 & -1 & 26 \\
-1 & -1 & 51 & 43
\end{bmatrix}$$

FIG. 81

$$\begin{bmatrix}
-1 & 0 & 0 & -1 \\
0 & 0 & -1 & -1 \\
-1 & 1 & 0 & -1 \\
24 & 16 & 35 & 47 \\
28 & 11 & 36 & 15 \\
28 & 53 & 20 & 33 \\
33 & 24 & 38 & 10 \\
33 & 14 & 10 & 31 \\
17 & 4 & 21 & 7 \\
33 & 46 & 48 & 25 \\
-1 & 22 & 42 & 15 \\
-1 & 39 & 24 & -1 \\
4 & 12 & -1 & 3 \\
29 & 31 & -1 & -1 \\
4 & -1 & 10 & -1 \\
-1 & -1 & 29 & 11 \\
-1 & 41 & -1 & 50 \\
33 & 26 & -1 & -1 \\
4 & -1 & 48 & -1 \\
-1 & 53 & 39 & -1 \\
-1 & -1 & 41 & 16 \\
14 & -1 & -1 & 39 \\
-1 & 15 & -1 & 50 \\
30 & -1 & -1 & 19 \\
-1 & -1 & 51 & 3
\end{bmatrix}$$

FIG. 82

$$\begin{bmatrix} 10 & 15 & 17 & -1 & 24 & 20 & 9 & 17 & 13 & 0 & 10 & 17 & 5 & 11 & 23 & 12 & 4 & 25 & 20 & 20 & 12 & 18 & 1 & 0 & -1 \\ -1 & -1 & 19 & 26 & 20 & 10 & 22 & 18 & 7 & 10 & 16 & 24 & 19 & 20 & 20 & 20 & 15 & 10 & 11 & 18 & 16 & 10 & 0 & 0 & 0 \\ 20 & 8 & -1 & 13 & 23 & 12 & 26 & 6 & 25 & 15 & 6 & 8 & 13 & 16 & 9 & 13 & 1 & 19 & 23 & 26 & 14 & 5 & 1 & -1 & 0 \end{bmatrix}$$

FIG. 83

$$\begin{bmatrix} 8 & -1 & 12 & -1 & 18 & 13 & 21 & 5 & 6 & 11 & 6 & 24 & 15 & 9 & 21 & 0 & 6 & 23 & 12 & 18 & 19 & 18 & 21 & 5 & 1 & 0 & -1 \\ -1 & 21 & -1 & 0 & 0 & 7 & 0 & 7 & 11 & 23 & 11 & 22 & 6 & 5 & 24 & 1 & 11 & 0 & 9 & 17 & 19 & 7 & 1 & 22 & 0 & 0 & 0 \\ 16 & -1 & 22 & 8 & -1 & 5 & 3 & 12 & 23 & 4 & 10 & 6 & 10 & 1 & 17 & 11 & 9 & 10 & 5 & 22 & 7 & 17 & -1 & 0 & 0 \end{bmatrix}$$

FIG. 84

$$\begin{bmatrix} 5 & -1 & 25 & 26 & 13 & 18 & -1 & 9 & 23 & 19 & 19 & 7 & 3 & 2 & 10 & 13 & 9 & 5 & 13 & 5 & 21 & 12 & 1 & 0 & -1 \\ -1 & 0 & 10 & -1 & 4 & -1 & 13 & 11 & 11 & 17 & 0 & 23 & 9 & 23 & 21 & 10 & 22 & 15 & 0 & 1 & 24 & 17 & 0 & 0 & 0 \\ 10 & 10 & -1 & 13 & -1 & 17 & 11 & 18 & 6 & 16 & 15 & 19 & 11 & 8 & 0 & 26 & 13 & 23 & 5 & 20 & 10 & 14 & 1 & -1 & 0 \end{bmatrix}$$

FIG. 85

$$\begin{bmatrix} 25 & -1 & 4 & 21 & 11 & -1 & 23 & -1 & 9 & 6 & 22 & 3 & 17 & 7 & 4 & 24 & 14 & 12 & 20 & 0 & 1 & -1 & 0 & -1 \\ -1 & 15 & -1 & -1 & -1 & 20 & 3 & 23 & -1 & 8 & 14 & 13 & 22 & 9 & 2 & 9 & 11 & 20 & 11 & 13 & 23 & 0 & 0 & 0 \\ 11 & 7 & -1 & 26 & 19 & 8 & -1 & 13 & 5 & -1 & 10 & 21 & 25 & 9 & 26 & 9 & 16 & 5 & 20 & 4 & 18 & 1 & -1 & 0 \end{bmatrix}$$

FIG. 86

$$\begin{bmatrix} 18 & 14 & 11 & -1 & 19 & -1 & 19 & -1 & 6 & 5 & -1 & 11 & 5 & 24 & 14 & 16 & 4 & 23 & 18 & 3 & 5 & 2 & 18 & 4 & 1 & 17 & 0 & 2 & 6 & 8 & -1 & 1 & 0 & 0 & -1 \\ -1 & -1 & 26 & 8 & -1 & 19 & -1 & 19 & 3 & -1 & 6 & -1 & 14 & -1 & 11 & 4 & 23 & 12 & 26 & 19 & 0 & 8 & 11 & 6 & 8 & -1 & 1 & 0 & 0 & -1 \\ 23 & 8 & -1 & 17 & 5 & 4 & -1 & 5 & 6 & -1 & -1 & 14 & 16 & 4 & 18 & 21 & 13 & 19 & 23 & 26 & 0 & -1 & 0 \end{bmatrix}$$

FIG. 87

$$\begin{bmatrix} 20 & 17 & -1 & 22 & 3 & 21 & 11 & -1 & 5 & -1 & 23 & 16 & 0 & 17 & 26 & 12 & 15 & 26 & 10 & 14 & 14 & 16 & 1 & 0 & -1 \\ -1 & -1 & 17 & 14 & 18 & -1 & -1 & 22 & -1 & 18 & 2 & 23 & 14 & 20 & 7 & 0 & 22 & 21 & 15 & 8 & 14 & 0 & 0 & -1 \\ 16 & 24 & 4 & -1 & 16 & 24 & 19 & 9 & -1 & 24 & 4 & 17 & 11 & 13 & 4 & 10 & 15 & 7 & 26 & 25 & 26 & 0 & -1 & 0 \end{bmatrix}$$

FIG. 88

$$\begin{bmatrix} 12 & 4 & 4 & -1 & 4 & 2 & -1 & 8 & -1 & 23 & -1 & 14 & 2 & -1 & 16 & 25 & -1 & 22 & 3 & 2 & 6 & 11 & 12 & 23 & 0 & 21 & 11 & 15 & 18 & 5 & 11 & 20 & 4 & 3 & 21 & 1 & 0 & -1 \\ -1 & -1 & 23 & 13 & 8 & -1 & 16 & 14 & 19 & -1 & 14 & 24 & -1 & 26 & 10 & 24 & 14 & 15 & 21 & 23 & 8 & 22 & 1 & 5 & 11 & 20 & 16 & 19 & 0 & 1 & -1 \\ 13 & 2 & 0 & -1 & -1 & 16 & 25 & -1 & 22 & 3 & 2 & 6 & 11 & 12 & 23 & 0 & 21 & 11 & 15 & 18 & 5 & 11 & 20 & 4 & 3 & 21 & 1 & 0 & -1 \end{bmatrix}$$

FIG. 89

$$\begin{bmatrix} 0 & 7 & -1 & 1 & 9 & -1 & 12 & -1 & -1 & 9 & 7 & -1 & 0 & 0 & -1 & 22 & -1 & 15 & -1 & 0 & 16 & 0 & 16 & 7 & 21 & -1 & 0 \\ -1 & -1 & 24 & 23 & -1 & 9 & 24 & 21 & 1 & -1 & 10 & 20 & 16 & -1 & 5 & -1 & 1 & 7 & 26 & 16 & 13 & 9 & 1 & 0 \\ 4 & 25 & 9 & -1 & 2 & -1 & -1 & -1 & 11 & 3 & -1 & 23 & -1 & 8 & 19 & 6 & -1 & 6 & 5 & 2 & 13 & 5 & 4 & -1 \end{bmatrix}$$

FIG. 90

$$\begin{bmatrix} 24 & -1 & -1 & 19 \\ -1 & -1 & 21 & 5 \\ -1 & -1 & -1 & 5 \\ 0 & -1 & -1 & 5 \\ 10 & 23 & -1 & -1 \\ -1 & -1 & 11 & 11 \\ 16 & -1 & 14 & -1 \\ -1& 7 & -1 & 22 \\ 21 & 22 & -1 & -1 \\ -1 & -1 & 9 & 3 \\ 8 & -1 & -1 & 21 \\ -1 & -1 & 7 & 15 \\ -1 & 13 & -1 & 2 & -1 & -1 \\ 25 & -1 & 22 & -1 \\ -1 & 15 & -1 & 12 \\ -1 & 17 & -1 & 6 \\ 19 & -1 & -1 & 22 \\ -1 & 23 & 25 & 10 \\ 21 & 25 & 8 & -1 \\ 13 & -1 & 9 & 12 \\ 0 & 25 & 20 & 6 \\ 0 & 10 & 24 & 2 & 0 \\ -1 & 2 & 19 & 10 & 25 \\ -1 & -1 & 9 & 26 & 19 \\ -1 & 1 & 0 & 1 & -1 \\ -1 & 0 & 0 & -1 & -1 \\ -1 & 0 & 0 & -1 \end{bmatrix}$$

$$\begin{bmatrix} 23 & 21 & -1 & -1 & -1 & 0 & -1 & 21 & -1 & 9 & -1 & -1 & 22 & 1 & -1 & 11 & -1 & -1 & 0 & -1 & 1 & -1 & 0 & 0 & -1 \\ -1 & -1 & 25 & -1 & -1 & 11 & -1 & -1 & 8 & -1 & 20 & 15 & -1 & 20 & -1 & 26 & -1 & -1 & 17 & 0 & -1 & 1 & 0 & -1 & -1 \\ -1 & -1 & 13 & 26 & 18 & 9 & -1 & 16 & 22 & -1 & 11 & 25 & -1 & -1 & -1 & -1 & -1 & 18 & 5 & 19 & -1 & -1 & 1 & 0 & 0 \\ 5 & 4 & 8 & 22 & -1 & -1 & 9 & 24 & 21 & -1 & 0 & 9 & 12 & -1 & 5 & 6 & 16 & 20 & 25 & 25 & 19 & -1 & -1 & 1 & -1 \end{bmatrix}$$

FIG. 98

$$\begin{bmatrix} 12 & 35 & -1 & 29 & 22 & -1 & 1 & 16 & -1 & -1 & 39 & 26 & 38 & 35 & 30 & 10 & 29 & 41 & 11 & 7 & 45 & 27 & 42 & 1 & 0 & -1 \\ -1 & -1 & 16 & 51 & 49 & 10 & -1 & 2 & -1 & 34 & 50 & 1 & 40 & 42 & 32 & 27 & 19 & 23 & 0 & 19 & 1 & 0 & 0 \\ 2 & 24 & 18 & -1 & -1 & 6 & 48 & 23 & 43 & -1 & 47 & 15 & 39 & 14 & 40 & 35 & 19 & 44 & 22 & 35 & 24 & 18 & 34 & 1 & -1 & 0 \end{bmatrix}$$

FIG. 99

$$\begin{bmatrix} 16 & -1 & 21 & 17 & 53 & 3 & -1 & 33 & 52 & -1 & 51 & 15 & 36 & 28 & 17 & 5 & 20 & 1 & 45 & 41 & 8 & 22 & 1 & 0 & 0 & -1 \\ -1 & 23 & 23 & -1 & -1 & 26 & 0 & 48 & -1 & 3 & 22 & 0 & 45 & 18 & 33 & 8 & 7 & 19 & 36 & 36 & 14 & 4 & 0 & -1 & 0 \\ 26 & 9 & -1 & 31 & 12 & -1 & 38 & -1 & 50 & 12 & 42 & 42 & 52 & 50 & 51 & 1 & 38 & 49 & 40 & 16 & 47 & 43 & 1 & -1 & 0 \end{bmatrix}$$

FIG. 100

$$H_{101} = \begin{bmatrix} 32 & -1 & 25 & 15 & -1 & 6 & 27 & 34 & 33 & 33 & 39 & 53 & 39 & 0 & 16 & 20 & 31 & 40 & 16 & 0 & 0 & -1 \\ 17 & 3 & 12 & 35 & 45 & 37 & -1 & -1 & 28 & 13 & 11 & 17 & 44 & 24 & 12 & 10 & 25 & 50 & 22 & 0 & 0 & 0 \\ -1 & 0 & -1 & -1 & 5 & -1 & 10 & 13 & 38 & 32 & 10 & 2 & 37 & 10 & 46 & 31 & 0 & 26 & 20 & 1 & -1 & 0 \end{bmatrix}$$

FIG. 101

$$H_{102} = \begin{bmatrix} 27 & -1 & 48 & 11 & -1 & -1 & 19 & 50 & -1 & 21 & 24 & 9 & 42 & 47 & 29 & 35 & 27 & 52 & 51 & 41 & 33 & 46 & 1 & 0 & 0 & -1 \\ -1 & 45 & 29 & 19 & 23 & 4 & -1 & -1 & 4 & 49 & 25 & 36 & 1 & 33 & 13 & 25 & 21 & 0 & 2 & 52 & 0 & 21 & 0 & 0 & 0 \\ 12 & 50 & -1 & -1 & 21 & 47 & 33 & 11 & 47 & -1 & -1 & 45 & 46 & 9 & 9 & 46 & 46 & 8 & 24 & 16 & 53 & 15 & 1 & -1 & 0 \end{bmatrix}$$

FIG. 102

$$H_{103} = \begin{bmatrix} 53 & 24 & 25 & -1 & 2 & -1 & 22 & 25 & -1 & 5 & 42 & 14 & 29 & 3 & 8 & 21 & 22 & 44 & 9 & 34 & 29 & 13 & 44 & 0 & 0 & -1 \\ 24 & -1 & 20 & 12 & -1 & 42 & 4 & 2 & 51 & -1 & -1 & -1 & 20 & 35 & 34 & 15 & 44 & 11 & 49 & 24 & 43 & 24 & 36 & 0 & 0 & 0 \\ 16 & 34 & -1 & 21 & 9 & 36 & -1 & -1 & 51 & -1 & 44 & 47 & 9 & 30 & 30 & 29 & 34 & 47 & 14 & 15 & 30 & 45 & 16 & 1 & -1 & 0 \end{bmatrix}$$

$$\begin{bmatrix} 52 & -1 & 12 & 14 & -1 & 17 & 19 & 1 & -1 & -1 & 0 & 36 & 7 & 35 & 40 & 3 & 42 & 47 & 10 & 18 & 13 & 1 & 0 & 0 \\ -1 & 26 & 31 & -1 & 53 & 24 & -1 & -1 & 30 & 51 & -1 & 6 & 43 & 41 & 37 & 6 & 52 & 43 & 29 & 12 & 18 & 0 & 0 & -1 \\ 12 & -1 & -1 & 26 & 25 & -1 & 30 & 22 & 24 & 40 & 28 & -1 & 16 & 0 & 30 & 39 & 44 & 20 & 48 & 50 & 38 & -1 & 1 & 0 \end{bmatrix}$$

FIG. 105

$$\begin{bmatrix} 8 & 19 & -1 & 49 & 48 & -1 & 38 & 17 & 0 & -1 & 23 & 48 & 32 & 52 & 14 & 33 & 22 & 32 & 31 & 39 & 52 & 1 & 0 & 0 \\ -1 & -1 & 47 & 14 & 52 & 40 & -1 & 12 & -1 & 24 & -1 & 19 & 10 & 48 & 37 & 0 & 8 & 15 & 36 & 45 & 6 & 0 & 0 & -1 \\ 5 & 47 & 32 & -1 & -1 & 35 & 49 & -1 & 15 & 23 & 25 & -1 & 40 & 35 & 19 & 6 & 35 & 23 & 0 & 20 & 27 & 1 & 1 & 0 \end{bmatrix}$$

FIG. 106

$$\begin{bmatrix} 47 & 42 & 2 & -1 & 35 & -1 & 46 & -1 & 40 & 23 & 47 & -1 & 52 & 3 & 3 & 35 & 51 & 43 & 11 & 12 & 22 & 1 & 0 & 0 \\ -1 & -1 & 52 & 30 & -1 & 7 & -1 & 52 & 19 & -1 & 3 & 44 & 20 & 32 & 11 & 38 & 13 & 19 & 49 & 37 & 27 & 0 & 0 & -1 \\ 0 & 3 & -1 & 0 & 12 & 33 & 27 & 39 & -1 & 16 & -1 & 40 & 6 & 20 & 43 & 2 & 39 & 48 & 1 & 40 & 3 & 1 & 1 & 0 \end{bmatrix}$$

$$\begin{bmatrix} -1 & 0 & 0 & -1 \\ 0 & 0 & -1 & -1 \\ -1 & 1 & 0 & -1 \\ -1 & 53 & 36 & 32 \\ 28 & 7 & 22 & 25 \\ 0 & 15 & 6 & 40 \\ 41 & 46 & 32 & -1 \\ 41 & -1 & 31 & 39 \\ 24 & -1 & 8 & 33 \\ 22 & 0 & -1 & 53 \\ -1 & 25 & 32 & -1 \\ 45 & -1 & -1 & 17 \\ -1 & 13 & 45 & -1 \\ 45 & -1 & 10 & -1 \\ -1 & 28 & -1 & 35 \\ -1 & 6 & -1 & 52 \\ 14 & -1 & 30 & -1 \\ 8 & 34 & -1 & -1 \\ -1 & -1 & 27 & 1 \\ 45 & -1 & 42 & -1 \\ -1 & 13 & -1 & 1 \\ 53 & -1 & 7 & -1 \\ -1 & 19 & -1 & 42 \\ 41 & -1 & -1 & 30 \\ -1 & -1 & 4 & 34 \\ 53 & -1 & -1 & 34 \end{bmatrix}$$

FIG. 110

$$\begin{bmatrix} -1 & 0 & 0 & -1 \\ 0 & 0 & -1 & -1 \\ -1 & 1 & 0 & -1 \\ -1 & 14 & 41 & 1 \\ 19 & 22 & 34 & 3 \\ 48 & 27 & 31 & 50 \\ 8 & 18 & 32 & 9 \\ 13 & 2 & 10 & -1 \\ 20 & -1 & 26 & 41 \\ -1 & 31 & -1 & 5 \\ 7 & -1 & 16 & -1 \\ 11 & 23 & -1 & -1 \\ -1 & -1 & 1 & 18 \\ -1 & -1 & 29 & 7 \\ -1 & 46 & 15 & -1 \\ -1 & 53 & 28 & -1 \\ 27 & -1 & -1 & 25 \\ -1 & 52 & 42 & -1 \\ 3 & -1 & -1 & 16 \\ -1 & 5 & 27 & -1 \\ 28 & -1 & -1 & 46 \\ 44 & -1 & 7 & -1 \\ -1 & 42 & -1 & 38 \\ 38 & -1 & -1 & 9 \\ -1 & -1 & 51 & 41 \\ 21 & -1 & -1 & 0 \end{bmatrix}$$

FIG. 111

$$\begin{bmatrix} -1 & 0 & 0 & -1 \\ 0 & 0 & -1 & -1 \\ -1 & 1 & 0 & -1 \\ -1 & 32 & 52 & 37 \\ 6 & 3 & 52 & 6 \\ -1 & 51 & -1 & 35 \\ 40 & -1 & 25 & -1 \\ 6 & -1 & -1 & 42 \\ -1 & 39 & 53 & -1 \\ -1 & -1 & 40 & 36 \\ 28 & 48 & -1 & -1 \\ 26 & 47 & -1 & -1 \\ -1 & -1 & 14 & 28 \\ -1 & 29 & 50 & -1 \\ 53 & -1 & 28 & -1 \\ 26 & -1 & -1 & 35 \\ -1 & 18 & -1 & 39 \\ 3 & -1 & 41 & -1 \\ -1 & 12 & -1 & 23 \\ 15 & 50 & -1 & -1 \\ -1 & -1 & 20 & 7 \\ -1 & 5 & -1 & 25 \\ 18 & -1 & 44 & -1 \\ 17 & -1 & -1 & 24 \\ -1 & -1 & 21 & 13 \\ 0 & -1 & -1 & 45 \end{bmatrix}$$

NETWORK DEVICES AND METHODS OF GENERATING LOW-DENSITY PARITY-CHECK CODES AND PERFORMING CORRESPONDING ENCODING OF DATA

CROSS-REFERENCE TO RELATED APPLICATIONS

The present disclosure is a Continuation-in-part Application of U.S. patent application Ser. No. 14/681,485, filed Apr. 8, 2015. This application claims the benefit of U.S. Provisional Application No. 61/992,635, filed on May 13, 2014; U.S. Provisional Application No. 62/000,657, filed May 20, 2014; U.S. Provisional Application No. 62/013,700, filed Jun. 18, 2014; and Provisional Application 62/013,706, filed Jun. 18, 2014. This application and U.S. patent application Ser. No. 14/681,485, filed Apr. 8, 2015 claim the benefit of U.S. Provisional Application No. 61/990,209, filed May 8, 2014; and U.S. Provisional Application No. 62/030,900, filed Jul. 30, 2014. U.S. patent application Ser. No. 14/681,485 claims the benefit of U.S. Provisional Application No. 61/982,129, filed on Apr. 21, 2014.

This application and U.S. patent application Ser. No. 14/681,485 are related to U.S. patent application Ser. No. 14/702,078, filed on May 1, 2015. U.S. patent application Ser. No. 14/702,078 claims the benefit of U.S. Provisional Application No. 61/987,947 filed on May 2, 2014 and is related to U.S. patent application Ser. No. 14/519,826, filed on Oct. 21, 2014, which claims the benefit of U.S. Provisional Application No. 61/893,662, filed on Oct. 21, 2013, U.S. Provisional Application No. 61/893,675, filed on Oct. 21, 2013, and U.S. Provisional Application No. 61/893,683, filed on Oct. 21, 2013, and U.S. Provisional Application No. 61/895,049, filed Oct. 24, 2013. The entire disclosures of the applications referenced above are incorporated herein by reference.

FIELD

The present disclosure relates generally to wireless communications between network devices, and more particularly to generation of low-density parity-check codes used during encoding.

BACKGROUND

Wireless local area networks (WLANs) have evolved rapidly over the past few years. Progressive WLAN standards have focused primarily on improving data throughputs. For example, the peak data throughputs of IEEE standards 802.11b, 802.11a/g, 802.11n, and 802.11ac are respectively 11 Mbps, 54 Mbps, 600 Mbps, and 7 Gbps. IEEE 802.11ax targets a five to ten times average spectral efficiency gain at least in one dense deployment. It is desirable to increase the per-link data throughput by all means.

To increase data throughput, low-density parity-check (LDPC) codes are used to encode data in wireless networks. LDPC codes are linear block codes having a corresponding parity-check matrix H with a favorable property of being sparse, i.e., the matrix H contains only a low number of nonzero elements. Tanner graphs of such codes are bipartite graphs containing two different kinds of nodes: variable nodes and check nodes. An (n, k) LDPC code with a code rate k/n is represented by an m×n parity-check matrix H, where m=n−k denotes the redundancy (i.e., parity bits) of the coding scheme. The LDPC codes can be regular or irregular depending on a degree distribution of variable nodes (column weights) and check nodes (row weights).

SUMMARY

A network device is provided and includes a matrix generating module, an encoding module and a transceiver. The matrix generating module is configured to generate or access a code base matrix, wherein the code base matrix has a corresponding code rate of 7/8. The matrix generating module is also configured to, based on the code base matrix, generate a resultant matrix of a low-density parity-check code. The resultant matrix includes sub-matrices. Each of the sub-matrices is generated based on a respective element in the code base matrix. The resultant matrix has a code length of 648 or 1296. The encoding module is configured to encode data based on the resultant matrix. The transceiver is configured to transmit the encoded data.

In other features, a network device is provided and includes a matrix generating module, an encoding module and a transceiver. The matrix generating module is configured to generate or access a code base matrix. The code base matrix has a corresponding code rate of 11/12. The matrix generating module is also configured to, based on the code base matrix, generate a resultant matrix of a low-density parity-check code. The resultant matrix includes sub-matrices. Each of the sub-matrices is generated based on a respective element in the code base matrix. The resultant matrix has a code length of 648 or 1296. The encoding module is configured to encode data based on the resultant matrix. The transceiver is configured to transmit the encoded data.

In other features, a method is provided and includes: generating or accessing a code base matrix, where the code base matrix has a corresponding code rate of 7/8; and based on the code base matrix, generating a resultant matrix of a low-density parity-check code. The resultant matrix includes a plurality of sub-matrices. Each of the plurality of sub-matrices is generated based on a respective element in the code base matrix. The resultant matrix has a code length of 648 or 1296. The method further includes: encoding data based on the resultant matrix; and transmitting the encoded data via a transceiver.

In other features, a method is provided and includes: generating or accessing a code base matrix, where the code base matrix has a corresponding code rate of 11/12; and based on the code base matrix, generating a resultant matrix of a low-density parity-check code. The resultant matrix includes sub-matrices. Each of the sub-matrices is generated based on a respective element in the code base matrix. The resultant matrix has a code length of 648 or 1296. The method further includes encoding data based on the resultant matrix; and transmitting the encoded data via a transceiver.

In other features, a system is provided and includes a code rate selecting module and a matrix generating module. The code rate selecting module is configured to select a code rate of k/n to encode k units of data into n units of data using a low-density parity-check (LDPC) code, where k and n are integers greater than 1, and k=n−1. The matrix generating module is configured to generate a matrix with (R+S) rows and (C+S) columns, where R and C are integers greater than 1, R=C/n, C=24 and S is an integer greater than or equal to zero and denotes a number of columns of the matrix deleted after encoding the k units of data using the LDPC code.

In another feature, the system further includes a column weight selecting module configured to select a column weight from 2 to (R+S), where the column weight denotes a number of nonzero entries in a column of the matrix.

In another feature, the matrix is a concentrated representation of a parity-check matrix of the LDPC code.

In other features, the system further includes a column weight selecting module and a cyclic shift module. The column weight selecting module is configured to select a column weight distribution for the matrix, where a column weight denotes a number of nonzero entries in a column of the matrix. The matrix generating module is configured to generate the matrix in accordance with the column weight distribution. The cyclic shift module is configured to select cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined second threshold has a lower bound determined by a third threshold, where the ACE metric denotes a total number of edges coming into variable nodes of one cycle of the LDPC code.

In other features, the system further includes a parameter selecting module and a code generating module. The parameter selecting module is configured to select a plurality of parameters ($girth_i$, $ACE_i$), where $girth_i$ is an integer greater than a predetermined threshold greater than zero, $ACE_i$ is an integer greater than or equal to zero, $1 \leq i \leq n$, and i and n are integers greater than 1. The column weight selecting module is configured to select a plurality of column weight distributions for the matrix. The code generating module is configured to generate, for each of the column weight distributions, a plurality of LDPC codes with the $girth_i$ and the $ACE_i$.

In other features, the matrix generating module is configured to generate a matrix for one of the plurality of LDPC codes in accordance with one of the plurality of column weight distributions. The cyclic shift module is configured to generate cyclic shifts for each entry in the matrix. The code generating module is configured to determine, based on the cyclic shifts, whether the one of the plurality of LDPC codes meets the following predetermined criteria: the girth of the one of the plurality of LDPC codes has the lower bound determined by the predetermined threshold; and the ACE metric for any cycle having girth no more than the first threshold has the lower bound determined by the second threshold, where the first threshold is greater than the predetermined threshold.

In another feature, the code generating module is configured to generate, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the predetermined criteria.

In another feature, in response to none of the plurality of LDPC codes generated using the parameters ($girth_i$, $ACE_i$) meeting the criteria, the parameter selecting module is configured to select a plurality of parameters ($girth_j$, $ACE_j$), where $girth_j$ is an integer greater than zero and less than the predetermined threshold for $girth_i$, $ACE_j$ is an integer greater than or equal to zero, $1 \leq j \leq n$, and j and n are integers greater than 1; and the code generating module is configured to generate, for each of the column weight distributions, the plurality of LDPC codes, by initially using the parameters ($girth_j$, $ACE_j$) with highest values of $girth_j$ and $ACE_j$, and by subsequently using the parameters ($girth_j$, $ACE_j$) with decreasing values of $girth_j$ and $ACE_j$ until one of the plurality of LDPC codes meets the criteria.

In other features, the column weight selecting module is configured to determine a mean column weight of the plurality of column weight distributions and to select upper and lower bounds of the plurality of column weight distributions based on the mean column weight. The code generating module is configured to generate the plurality of LDPC codes only for values of the plurality of column weight distributions between the upper and lower bounds.

In another feature, the system further includes an evaluating module configured to evaluate performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations; and to identify one or more of the plurality of column weight distributions for which one or more of the plurality of LDPC codes have performance greater than or equal to a predetermined level.

In another feature, for each of the column weight distributions, the code generating module is configured to stop generating the plurality of LDPC codes in response to two consecutive ones of the plurality LDPC codes having performance worse than prior ones of the plurality LDPC codes.

In other features, the code generating module is configured to generate, for the one or more of the plurality of column weight distributions for which the one or more of the plurality of LDPC codes have performance greater than or equal to the predetermined level, a plurality of codewords using respective LDPC codes. The evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a system includes a column weight selecting module, a matrix generating module, and a cyclic shift selecting module. The column weight selecting module is configured to select a column weight distribution for a matrix of a low-density parity-check (LDPC) code, where a column weight denotes a number of nonzero entries in a column of the matrix of the LDPC code. The matrix generating module is configured to generate the matrix for the LDPC code in accordance with the column weight distribution. The cyclic shift selecting module is configured to select cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In another feature, the matrix generating module is configured to generate the matrix for the LDPC code in accordance with the column weight distribution using a progressive-edge-growth (PEG) method.

In another feature, the matrix is a concentrated representation of a parity-check matrix of the LDPC code.

In still other features, a system includes a parameter selecting module, a column weight selecting module, and a code generating module. The parameter selecting module is configured to select a plurality of parameters (girth$_i$, ACE$_i$), where girth denotes a length of a shortest cycle of a low-density parity-check (LDPC) code, ACE is an Approximate Cycle Extrinsic message degree (ACE) of the LDPC code and denotes a total number of edges coming into variable nodes of one cycle of the LDPC code, girth$_i$ is an integer greater than a predetermined threshold greater than zero, ACE$_i$ is an integer greater than or equal to zero, 1<i<n, and i and n are integers greater than 1. The column weight selecting module is configured to select a plurality of column weight distributions for a matrix of the LDPC code, where a column weight denotes a number of nonzero entries in a column of the matrix of the LDPC code. The code generating module is configured to generate, for each of the column weight distributions, a plurality of LDPC codes with the girth$_i$ and the ACE$_i$.

In another feature, the code generating module includes a matrix generating module and a cyclic shift generating module. The matrix generating module is configured to generate a matrix for one of the plurality of LDPC codes in accordance with one of the plurality of column weight distributions. The cyclic shift generating module is configured to generate cyclic shifts for each entry in the matrix. The code generating module is configured to determine, based on the cyclic shifts, whether the one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In another feature, the code generating module is configured to generate, for each of the column weight distributions, the plurality of LDPC codes, by initially using the parameters (girth$_i$, ACE$_i$) with highest values of girth$_i$ and ACE$_i$, and by subsequently using the parameters (girth$_i$, ACE$_i$) with decreasing values of girth$_i$ and ACE$_i$ until one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, in response to none of the plurality of LDPC codes generated using the parameters (girth$_i$, ACE$_i$) meeting the criteria, the parameter selecting module is configured to select a plurality of parameters (girth$_j$, ACE$_j$), where girth$_j$ is an integer greater than zero and less than the predetermined threshold for girth$_i$, ACE$_j$ is an integer greater than or equal to zero, 1<j<n, and j and n are integers greater than 1. The code generating module is configured to generate, for each of the column weight distributions, the plurality of LDPC codes, by initially using the parameters (girth$_j$, ACE$_j$) with highest values of girth$_j$ and ACE$_j$, and by subsequently using the parameters (girth$_j$, ACE$_j$) with decreasing values of girth$_j$ and ACE$_j$ until one of the plurality of LDPC codes meets the criteria.

In other features, the column weight selecting module is configured to determine a mean column weight of the plurality of column weight distributions and to select upper and lower bounds of the plurality of column weight distributions based on the mean column weight. The code generating module is configured to generate the plurality of LDPC codes only for values of the plurality of column weight distributions between the upper and lower bounds.

In another feature, the system further includes an evaluating module configured to evaluate performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations; and to identify one or more of the plurality of column weight distributions for which one or more of the plurality of LDPC codes have performance greater than or equal to a predetermined level.

In another feature, for each of the column weight distributions, the code generating module is configured to stop generating the plurality of LDPC codes in response to two consecutive ones of the plurality LDPC codes having performance worse than prior ones of the plurality LDPC codes.

In other features, the code generating module is configured to generate, for the one or more of the plurality of column weight distributions for which the one or more of the plurality of LDPC codes have performance greater than or equal to the predetermined level, a plurality of codewords using respective LDPC codes. The evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a method includes selecting a code rate of k/n to encode k units of data into n units of data using a low-density parity-check (LDPC) code, where k and n are integers greater than 1, and k=n−1. The method further includes generating a matrix with (R+S) rows and (C+S) columns, where R and C are integers greater than 1, R=C/n, C=24 and S is an integer greater than or equal to zero and denotes a number of columns of the matrix deleted after encoding the k units of data using the LDPC code.

In another feature, the method further includes selecting a column weight from 2 to (R+S), where the column weight denotes a number of nonzero entries in a column of the matrix.

In another feature, the matrix is a concentrated representation of a parity-check matrix of the LDPC code.

In other features, the method further includes selecting a column weight distribution for the matrix, where a column weight denotes a number of nonzero entries in a column of the matrix; and generating the matrix in accordance with the column weight distribution. The method further includes selecting cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In other features, the method further includes selecting a plurality of parameters (girth$_i$, ACE$_i$), where girth$_i$ is an integer greater than a predetermined threshold greater than zero, ACE$_i$ is an integer greater than or equal to zero, 1<i<n, and i and n are integers greater than 1. The method further includes selecting a plurality of column weight distributions for the matrix; and generating, for each of the column weight distributions, a plurality of LDPC codes with the girth$_i$ and the ACE$_i$.

In other features, the method further includes generating a matrix for one of the plurality of LDPC codes in accordance with one of the plurality of column weight distributions and generating cyclic shifts for each entry in the matrix. The method further includes determining, based on the cyclic shifts, whether the one of the plurality of LDPC codes meets the following predetermined criteria: the girth of the one of the plurality of LDPC codes has the lower bound determined by the predetermined threshold; and the ACE metric for any cycle having girth no more than the first threshold has the lower bound determined by the second threshold, where the first threshold is greater than the predetermined threshold.

In other features, the method further includes generating, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the predetermined criteria.

In other features, the method further includes, in response to none of the plurality of LDPC codes generated using the parameters ($girth_i$, $ACE_i$) meeting the criteria, selecting a plurality of parameters ($girth_j$, $ACE_j$), where $girth_j$ is an integer greater than zero and less than the predetermined threshold for $girth_i$, $ACE_j$ is an integer greater than or equal to zero, $1 \leq j \leq n$, and j and n are integers greater than 1. The method further includes generating, for each of the column weight distributions, the plurality of LDPC codes, by initially using the parameters ($girth_j$, $ACE_j$) with highest values of $girth_j$ and $ACE_j$, and by subsequently using the parameters ($girth_j$, $ACE_j$) with decreasing values of $girth_j$ and $ACE_j$ until one of the plurality of LDPC codes meets the criteria.

In other features, the method further includes determining a mean column weight of the plurality of column weight distributions and to select upper and lower bounds of the plurality of column weight distributions based on the mean column weight. The method further includes generating the plurality of LDPC codes only for values of the plurality of column weight distributions between the upper and lower bounds.

In other features, the method further includes evaluating performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations. The method further includes identifying one or more of the plurality of column weight distributions for which one or more of the plurality of LDPC codes have performance greater than or equal to a predetermined level.

In another feature, the method further includes, for each of the column weight distributions, stopping generation of the plurality of LDPC codes in response to two consecutive ones of the plurality LDPC codes having performance worse than prior ones of the plurality LDPC codes.

In other features, the method further includes generating, for the one or more of the plurality of column weight distributions for which the one or more of the plurality of LDPC codes have performance greater than or equal to the predetermined level, a plurality of codewords using respective LDPC codes. The method further includes evaluating performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a method includes selecting a column weight distribution for a matrix of a low-density parity-check (LDPC) code, where a column weight denotes a number of nonzero entries in a column of the matrix of the LDPC code, and generating the matrix for the LDPC code in accordance with the column weight distribution. The method further includes selecting cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In another feature, the method further includes generating the matrix for the LDPC code in accordance with the column weight distribution using a progressive-edge-growth (PEG) method.

In another feature, the matrix is a concentrated representation of a parity-check matrix of the LDPC code.

In still other features, a method includes selecting a plurality of parameters ($girth_i$, $ACE_i$), where girth denotes a length of a shortest cycle of a low-density parity-check (LDPC) code, ACE is an Approximate Cycle Extrinsic message degree (ACE) of the LDPC code and denotes a total number of edges coming into variable nodes of one cycle of the LDPC code, $girth_i$ is an integer greater than a predetermined threshold greater than zero, $ACE_i$ is an integer greater than or equal to zero, $1 \leq i \leq n$, and i and n are integers greater than 1. The method further includes selecting a plurality of column weight distributions for a matrix of the LDPC code, where a column weight denotes a number of nonzero entries in a column of the matrix of the LDPC code. The method further includes generating, for each of the column weight distributions, a plurality of LDPC codes with the $girth_i$ and the $ACE_i$.

In other features, the method further includes generating a matrix for one of the plurality of LDPC codes in accordance with one of the plurality of column weight distributions and generating cyclic shifts for each entry in the matrix. The method further includes determining, based on the cyclic shifts, whether the one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, the method further includes generating, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, the method further includes, in response to none of the plurality of LDPC codes generated using the parameters ($girth_i$, $ACE_i$) meeting the criteria, selecting a plurality of parameters (girth$_j$, ACE$_j$), where girth$_j$ is an integer greater than zero and less than the predetermined threshold for girth$_j$, ACE$_j$ is an integer greater than or equal to zero, 1<j<n, and j and n are integers greater than 1. The method further includes generating, for each of the column weight distributions, the plurality of LDPC codes, by initially using the parameters (girth$_j$, ACE$_j$) with highest values of girth$_j$ and ACE$_j$, and by subsequently using the parameters (girth$_j$, ACE$_j$) with decreasing values of girth$_j$ and ACE$_j$ until one of the plurality of LDPC codes meets the criteria.

In other features, the method further includes determining a mean column weight of the plurality of column weight distributions and to select upper and lower bounds of the plurality of column weight distributions based on the mean column weight. The method further includes generating the plurality of LDPC codes only for values of the plurality of column weight distributions between the upper and lower bounds.

In other features, the method further includes evaluating performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations. The method further includes identifying one or more of the plurality of column weight distributions for which one or more of the plurality of LDPC codes have performance greater than or equal to a predetermined level.

In another feature, the method further includes, for each of the column weight distributions, stopping generation of the plurality of LDPC codes in response to two consecutive ones of the plurality LDPC codes having performance worse than prior ones of the plurality of LDPC codes.

In other features, the method further includes generating, for the one or more of the plurality of column weight distributions for which the one or more of the plurality of LDPC codes have performance greater than or equal to the predetermined level, a plurality of codewords using respective LDPC codes. The method further includes evaluating performance of the respective LDPC codes over both AWGN and WiFi channels, and to identify one or more parity-check matrices of the respective LDPC codes that perform best over (i) both AWGN and WiFi channels and (ii) either AWGN or WiFi channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 4 is a flowchart of a method for designing a base structure for generating LDPC codes according to the present disclosure.

FIG. 5 is a flowchart of a method for designing LDPC codes according to the present disclosure.

FIGS. 7A and 7B show examples of base matrices for code rate 7/8 generated using code design methods according to the present disclosure.

FIGS. 13A and 13B show examples of base matrices for code rate 11/12 generated using code design methods according to the present disclosure.

FIGS. 14-19 show various examples of 3×24 base matrices with column weights of 2 or 3 for code rate 7/8 with a block length of 1944 bits for WiFi channel generated without puncturing according to the present disclosure.

Figures 23, 24, 25:
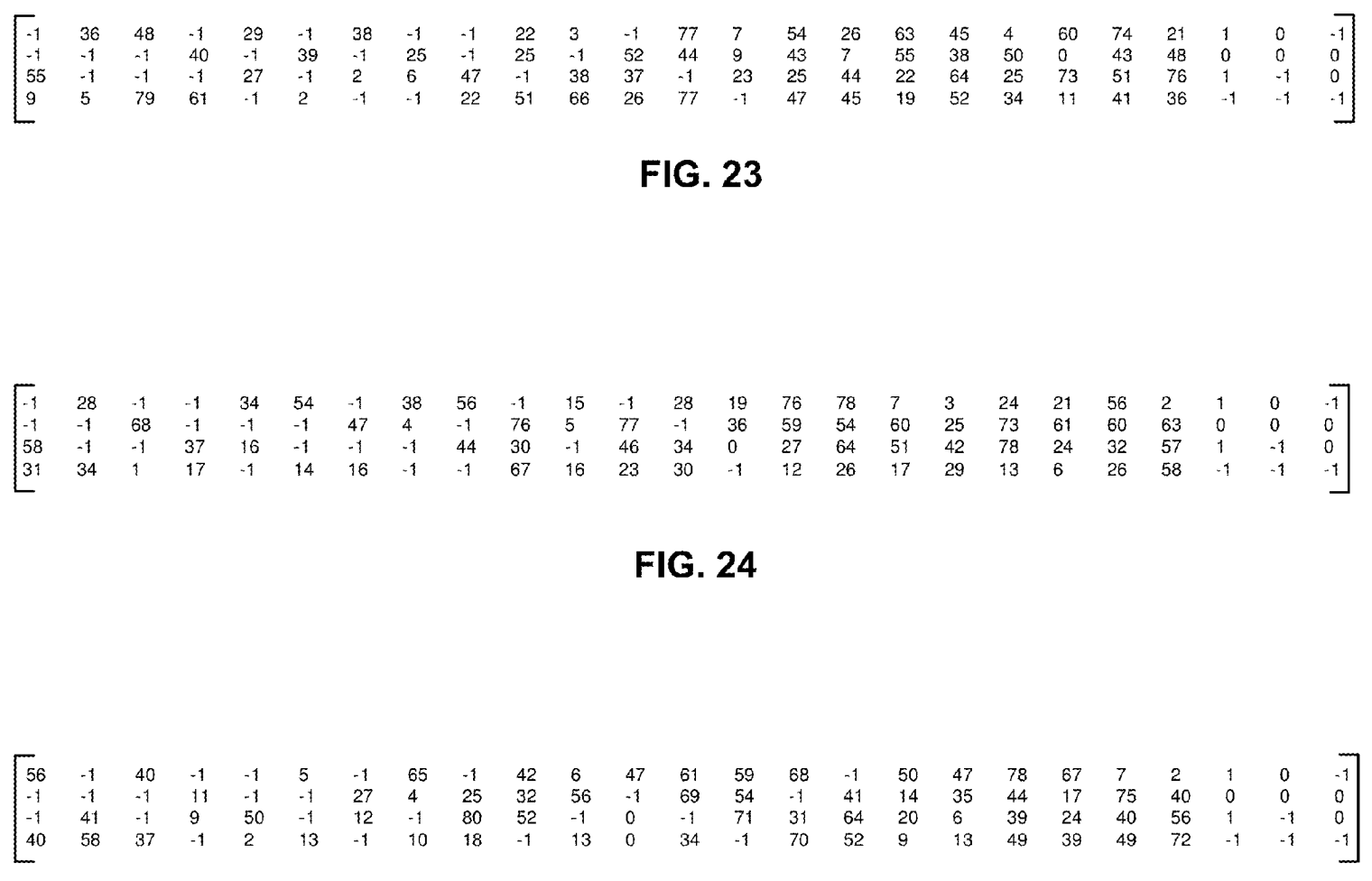
Figures 26, 27, 28:
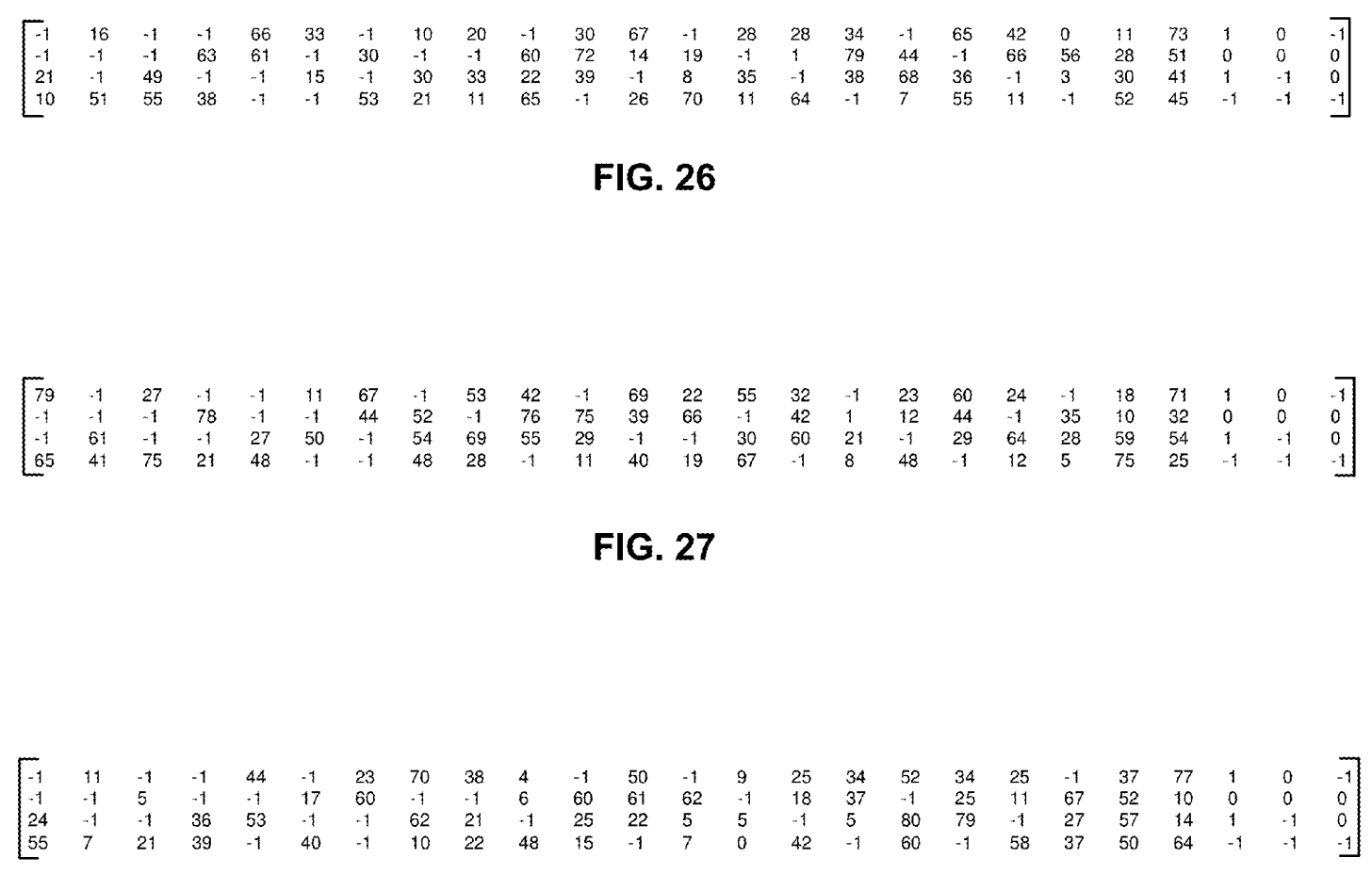

FIGS. 20-28 show various examples of 4×25 base matrices with column weights of 2, 3, or 4 for code rate 7/8 with a block length of 1944 bits for WiFi channel generated with puncturing of one column according to the present disclosure.

FIGS. 31-38 show various examples of 3×25 base matrices with column weights of 2 or 3 for code rate 11/12 with a block length of 1944 bits for WiFi channel generated with puncturing of one column according to the present disclosure.

FIGS. 39-47 show various examples of 4×26 base matrices with column weights of 2, 3, or 4 for code rate 11/12 with a block length of 1944 bits for WiFi channel generated with puncturing of two columns according to the present disclosure.

FIGS. 48A-51B show various examples of performance of codes with code rate 11/12 generated using 3×25 and 4×26 base matrices designed according to the present disclosure.

FIGS. 53-59 are examples of 3×24 code base matrices for a code rate of 7/8 and a code length of 648 bits in accordance with the present disclosure.

FIGS. 60-66 are examples of 4×25 code base matrices for a code rate of 7/8 and a code length of 648 bits in accordance with the present disclosure.

FIGS. 67-74 are examples of 3×24 code base matrices for a code rate of 7/8 and a code length of 1296 bits in accordance with the present disclosure.

FIGS. 75-82 are examples of 4×25 code base matrices for a code rate of 7/8 and a code length of 1296 bits in accordance with the present disclosure.

FIGS. 83-90 are examples of 3×25 code base matrices for a code rate of 11/12 and a code length of 648 bits in accordance with the present disclosure.

Figures 92, 93, 94:
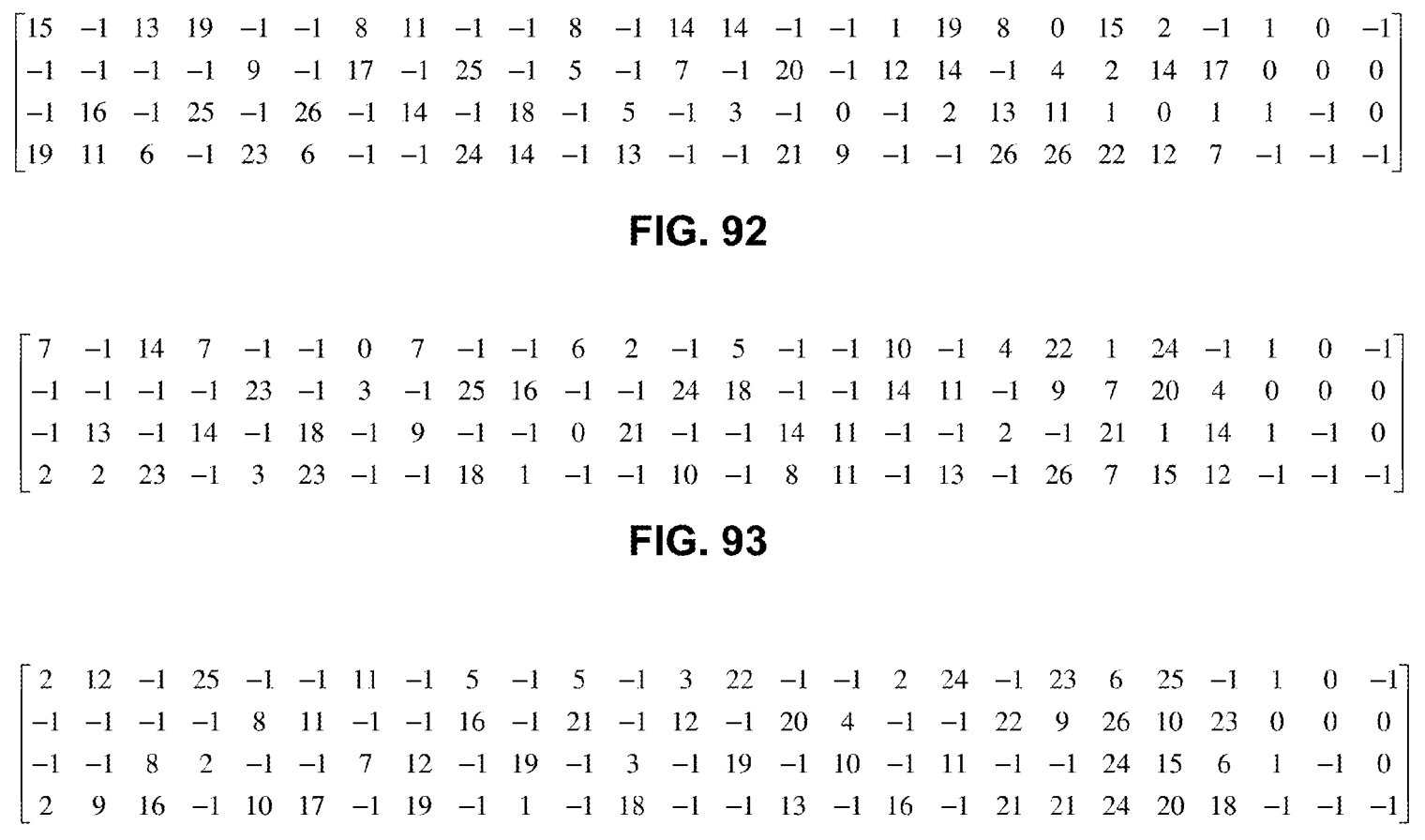
Figures 95, 96, 97:
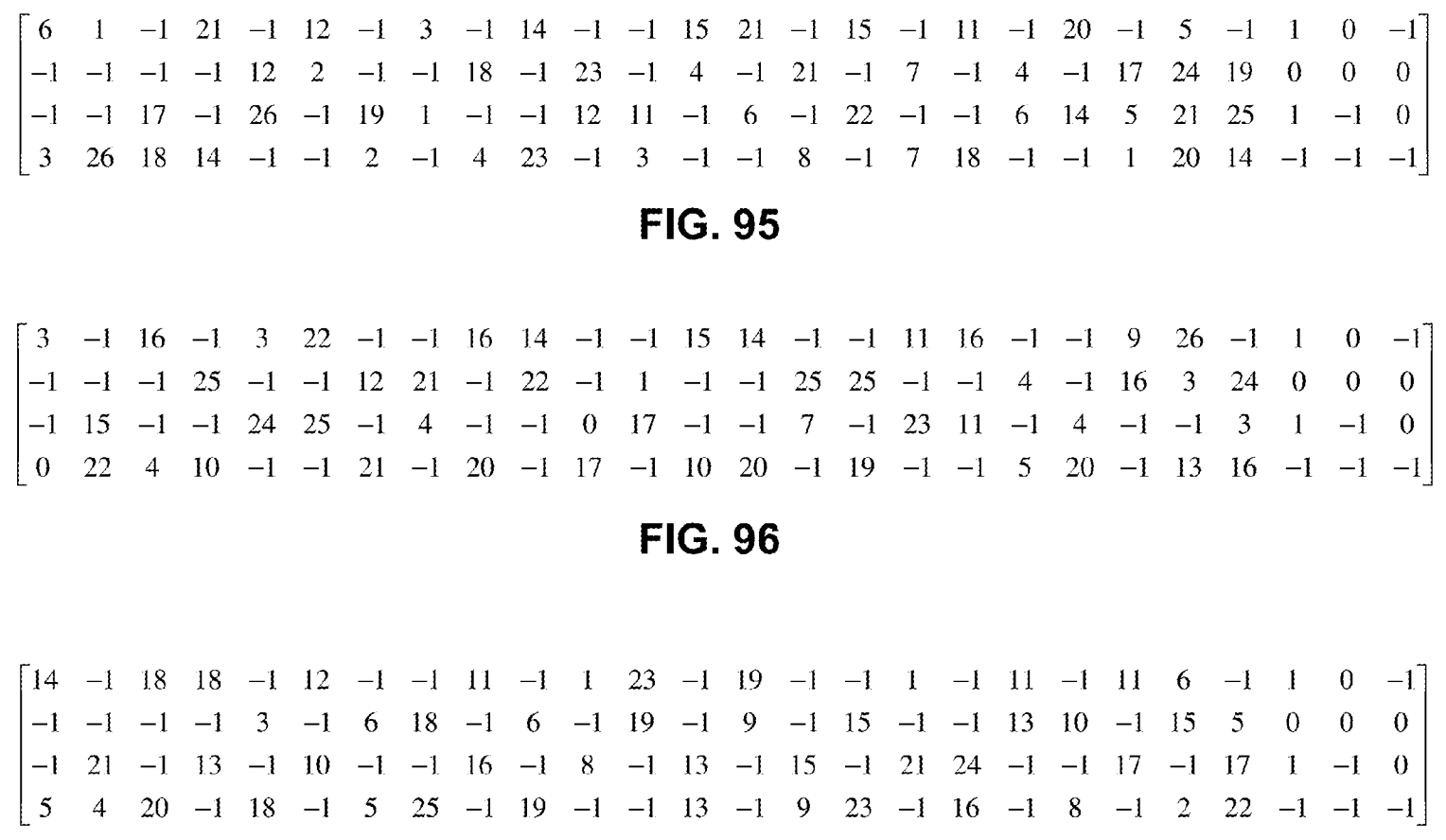

FIGS. 91-98 are examples of 4×26 code base matrices for a code rate of 11/12 and a code length of 648 bits in accordance with the present disclosure.

FIGS. 99-106 are examples of 3×25 code base matrices for a code rate of 11/12 and a code length of 1296 bits in accordance with the present disclosure.

Figures 107, 108, 109:
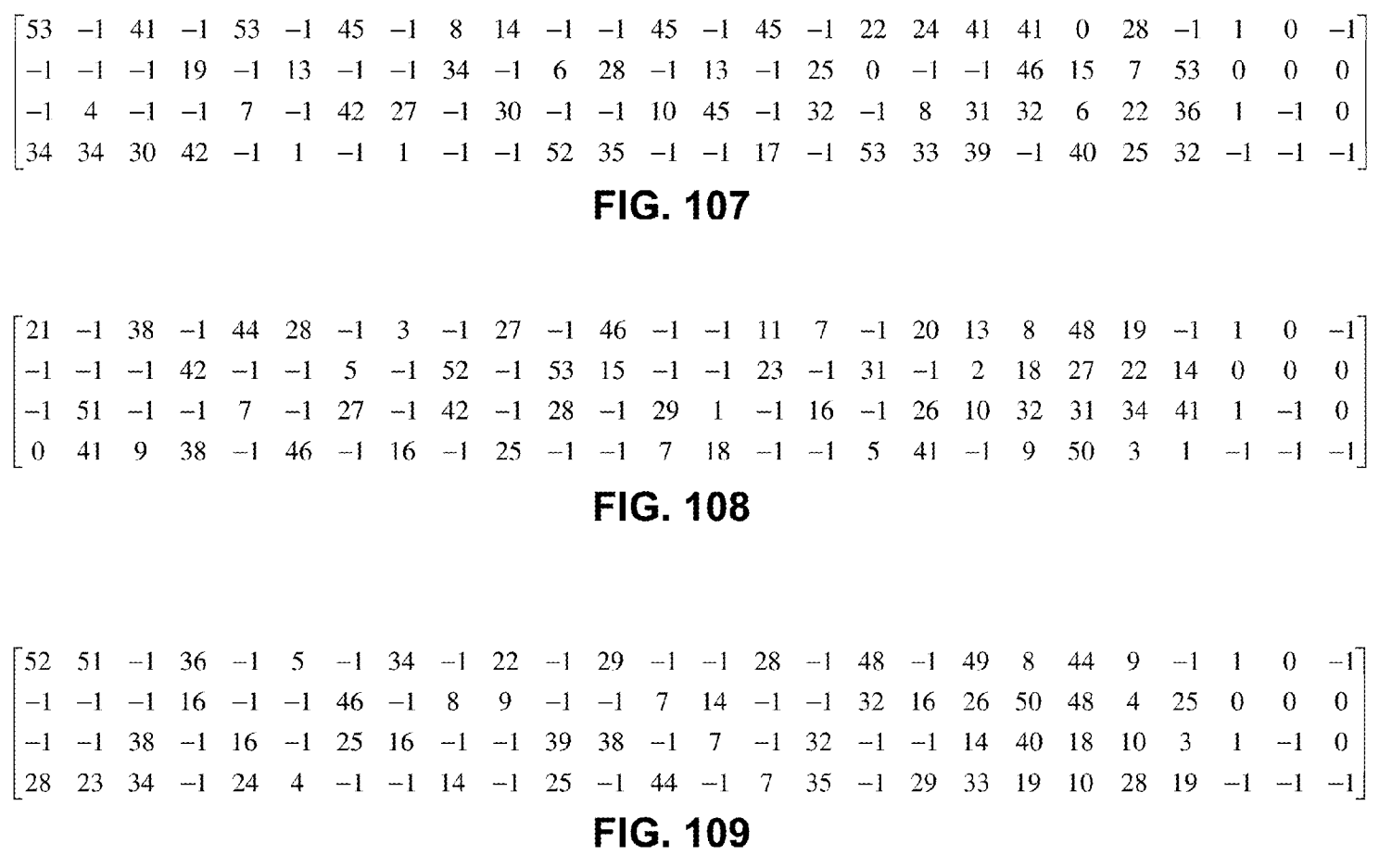

FIGS. 107-113 are examples of 4×26 code base matrices for a code rate of 11/12 and a code length of 1296 bits in accordance with the present disclosure.

In the drawings, reference numbers may be reused to identify similar and/or identical elements.

DESCRIPTION

WiFi networks compliant with IEEE802.11n/ac standards use quasi-cyclic (QC) low-density parity-check (LDPC) codes to encode data. A parity-check matrix of a QC-LDPC code includes circulant sub-matrices. These networks typically use block lengths of 648, 1296, 1944. These networks use QC-LDPC codes with code rates of 1/2, 2/3, 3/4, and 5/6, where a code rate of k/n indicates that k units of data (e.g., bits) are encoded into n units of data, where k and n are integers greater than 1, and k<n. The QC-LDPC codes have base matrices with 24 columns. For example, the base matrices for the code rates 1/2, 2/3, 3/4, and 5/6 are 12×24, 8×24, 6×24, and 4×24 matrices, respectively. The expansion factors for the three codeword lengths are respectively 27 (block length 648 divide by 24), 54 (block length 1296 divide by 24), and 81 (block length 1944 divide by 24). WiFi receivers use Layered Belief Propagation decoding to decode the data encoded with these QC-LDPC codes.

The present disclosure relates to novel LDPC code designs with higher code rates. Specifically, the present disclosure proposes novel LDPC code structures, code design criteria, and code search procedures. Some of the proposed base structures include QC-LDPC codes with base matrices of 24 or more columns and similar codeword lengths as existing 802.11n/ac LDPC code structures such that existing 802.11n/ac LDPC implementations can support the new codes with minimal changes.

Figure 1:
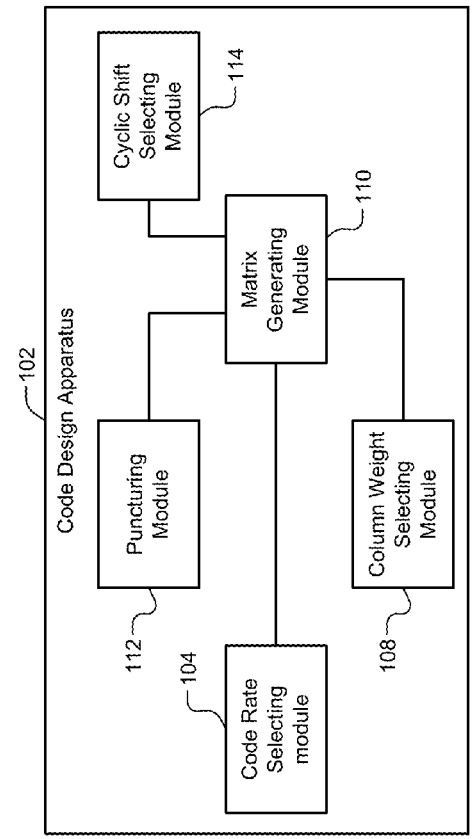
FIG. 1 is a block diagram of a system including a code design apparatus that selects code rates for low-density parity-check (LDPC) according to the present disclosure.

FIG. 1 shows a system 100 including a code design apparatus 102 according to the present disclosure. The code design apparatus 102 designs QC-LDPC codes having the proposed base structure as follows. The code design apparatus 102 includes a code rate selecting module 104, a column weight selecting module 108, a matrix generating module 110, and a puncturing module 112.

The code rate selecting module 104 is configured to select a code rate of k/n to encode k units of data into n units of data using a QC-LDPC code, where k and n are integers greater than 1, and k=n−1. The code rate k/n is greater than the code rates 1/2, 2/3, 3/4, and 5/6. For example only, the code rate k/n may include 7/8, 11/12, and so on.

The matrix generating module 110 is configured to generate a base matrix of size (R+S)×(C+S) (i.e., with (R+S) rows and (C+S) columns), where the matrix is a concentrated representation of a parity-check matrix of the QC-LDPC code, R+S and C+S respectively denote number of rows and columns of the base matrix and are integers greater than 1, and S is an integer greater than or equal to zero and denotes a number of columns of the base matrix that are punctured (i.e., deleted) by the puncturing module 112 after encoding the data using the QC-LDPC code with code rate k/n=1−R/C. In this disclosure, k=n−1 with n=2, 3, 4, . . . , etc.; and C=24, R/C=1−k/n=1/n.

For example, for a code rate of 7/8, the size of the base matrix is (3+S)×(24+S) with S parity-check columns punctured after encoding the data, where C=24, and the number R=3 are derived by dividing 24 by 8, and where S={0, 1, 2, . . . }. As another example, for a code rate of 11/12, the size of the base matrix is (2+S)×(24+S) with S parity-check columns punctured after encoding the data, where C=24 and the number R=2 are derived by dividing 24 by 12, and where S={0, 1, 2, . . . }.

The column weight selecting module 108 is configured to select a column weight for each column of the base matrix from 2 to (R+S), where the column weight denotes a number of nonzero entries in a column of the base matrix. For example, for code rates 7/8 and 11/12, the column weights are selected from {2, 3, . . . , 3+S} and {2, 3, . . . , 2+S}, respectively.

Puncturing columns allows flexibility in selecting different column weights. If S=0, the size of the base matrix for the code rates 7/8 and 11/12 is 3×24 and 2×24, respectively; and the column weight can be either 2 or 3 for the code rate 7/8, and the column weight for the code rate 11/12 can be 2. The code rates 7/8 and 11/12 are used throughout the present disclosure for example only. The proposed base structure of the QC-LDPC codes can be generalized to other code rates.

Figure 2:
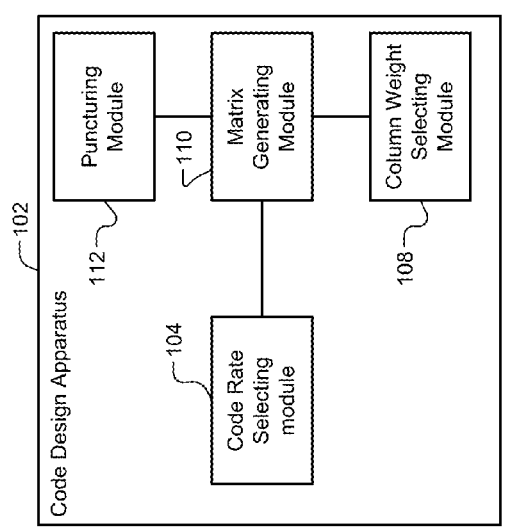
FIG. 2 is a block diagram of a system including a code design apparatus that generates LDPC codes according to the present disclosure.

FIG. 2 shows the system 100 including the code design apparatus 102 in further detail. The code design apparatus 102 designs a QC-LDPC code that has the proposed base structure and that meets the proposed code design criteria described below. The code design apparatus 102 includes the code rate selecting module 104, the column weight selecting module 108, the matrix generating module 110, the puncturing module 112, which are described with reference to FIG. 1, and a cyclic shift selecting module 114. The proposed code design involves the following two steps and two criteria.

The column weight selecting module 108 is configured to select a column weight distribution for a base matrix of a LDPC code. The column weight denotes a number of nonzero entries in a column of the base matrix of the LDPC code. In a first step, for a selected column weight distribution, the matrix generating module 110 is configured to generate the base matrix for the LDPC code accordance to the selected column weight distribution using a progressive-edge-growth (PEG) method.

In a second step, the cyclic shift selecting module 114 is configured to select cyclic shifts for each entry in the base matrix such that the LDPC code meets two criteria: First, a girth of the LDPC code has a lower bound determined by a first threshold (e.g., 6), where the girth of the LDPC code is a length of a shortest cycle of the LDPC code; and second, an Approximate Cycle Extrinsic message degree (ACE) metric for any cycle having girth no more than a predetermined threshold (e.g., 8) has a lower bound determined by a second threshold (e.g., 2), where the ACE metric denotes a total number of edges coming into variable nodes of one cycle of the LDPC code. This design favors low column weight distribution, which simplifies decoding.

Figure 3:
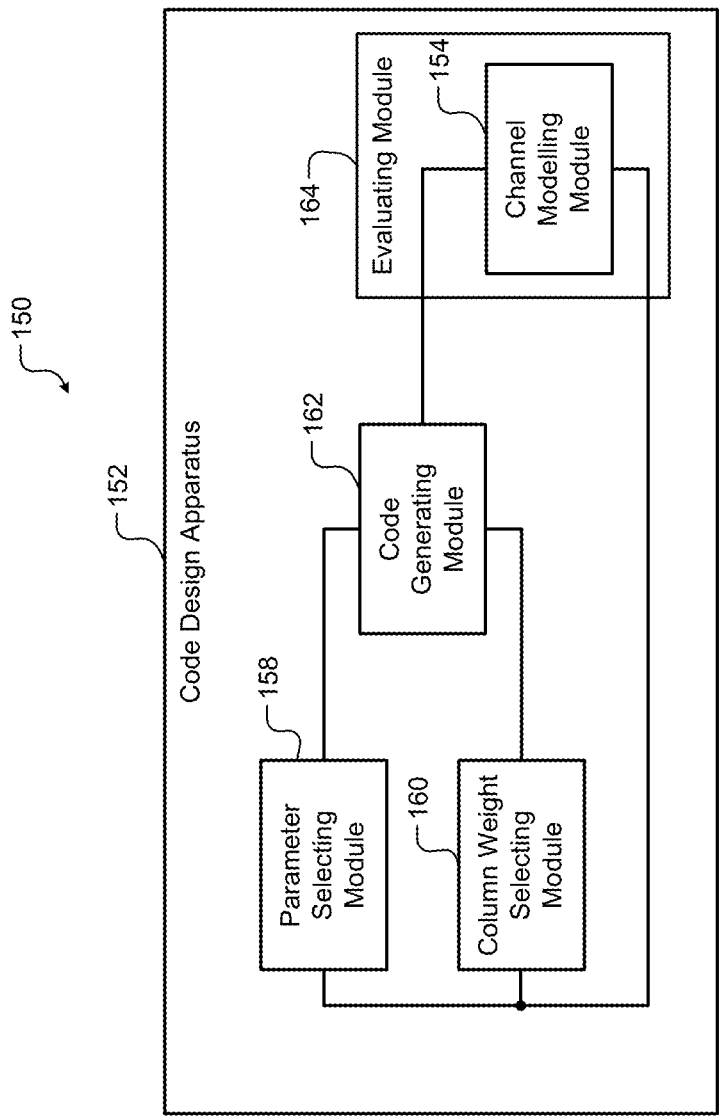
FIG. 3 is a block diagram of a system including a code design apparatus that searches for LDPC codes suitable for Additive White Gaussian Noise (AWGN) and/or WiFi channels according to the present disclosure.

FIG. 3 shows a system 150 including a code design apparatus 152 and a channel evaluating module 164. The channel evaluating module 164 has three components: a transmitting module (not shown), a channel modelling module 154, and a receiving module (also not shown). In some implementations, the channel modelling module 154, whose operation is described below in detail, may simulate the transmit and receive operations of the transmitting and receiving modules, in addition to simulating other aspects of one or more communication channels as described below in detail. The code design apparatus 152 performs a code search procedure according to the present disclosure described below. The code design apparatus 152 identifies one or more codes found in the code search procedure as the code or codes that can be used to encode data.

The code design apparatus 152 includes a parameter selecting module 158, a column weight selecting module 160, a code generating module 162, and the channel evaluating module 164. The code generating module 162 may include one or more modules of the code design apparatus 102 shown in FIGS. 1 and 2 (e.g., the matrix generating module 110 and the cyclic shift selecting module 114). The channel evaluating module 164 processes the output of the channel modelling module 154 and evaluates performance of codes generated by the code design apparatus 152 using a plurality criteria including packet error rate (PER) and signal-to-noise ratio (SNR) as explained below in further detail.

The channel modelling module 154 is configured to simulate an AWGN and/or a WiFi channel in which the channel evaluating module 164 can evaluate performance of the codes generated by the encoder 152. The channel modelling module 154 can simulate transmission and reception of data encoded using the codes generated by the encoder 152 via these channels. The channel modelling module 154 can simulate different channel conditions (e.g., noise, interference, and so on). The channel modelling module 154 is further configured to simulate transmission of encoded data using different modulation schemes, code rates, block lengths, and so on. The channel modelling module 154 is further configured to simulate transmission and reception of encoded data via one or more antennas arranged in different configurations (e.g., a multiple-input multiple-output (MIMO) configuration). Accordingly, the output of the channel modelling module 154 is a simulation of data that is encoded using the code generated by the encoder 152 and that the WiFi device 150 can receive from another WiFi device via the AWGN and/or WiFi channels.

The parameter selecting module 158 is configured to select a predetermined girth threshold greater than zero (e.g., 6), where girth denotes a length of a shortest cycle of a LDPC code. The parameter selecting module 158 is further configured to select a plurality of design parameters (girth$_i$, ACE$_i$) according to a design goal, where ACE is an Approximate Cycle Extrinsic message degree (ACE) of the LDPC code and denotes a total number of edges coming into variable nodes of one cycle of the LDPC code, girth$_i$ is an integer greater than the predetermined girth threshold, ACE$_i$ is an integer greater than or equal to zero, $1 < i < n$, and i and n are integers greater than 1. For example, the design parameters (girth$_i$, ACE$_i$) can include (8, 4), (8, 3), (6, 4), (6, 3), (8, 2), (6, 2), (6, 1), and (6, 0).

The column weight selecting module 160 is configured to select a plurality of column weight distributions for a base matrix, where a column weight denotes a number of nonzero entries in a column of the base matrix. For each column weight distribution, the code generating module 162 is configured to generate an LDPC code such that it meets the two criteria mentioned above with reference to FIG. 2.

Specifically, for a first column weight distribution, starting from the hardest design parameter (e.g., (8, 4)), the code generating module 162 is configured to generate a base matrix (e.g., using the matrix generating module 110 shown in FIGS. 1 and 2), and generate cyclic shifts for each entry in the base matrix (e.g., using the cyclic shift selecting module 114 shown in FIG. 2). The code generating module 162 is configured to determine whether the LDPC code meets the following criteria: a girth of the LDPC code has a lower bound determined by the predetermined girth threshold (e.g., 6); and an ACE metric for any cycle having girth no more than a first threshold has a lower bound determined by a second threshold, where the first threshold is greater than the predetermined girth threshold.

If the LDPC code that meets the two criteria is found, the code generating module 162 generates a code using the next column weight distribution. If the LDPC code that meets the two criteria is not found, for the first column weight distribution, the code generating module 162 generates a code using a next design parameter (girth$_i$, ACE$_i$) that is easier (i.e., relaxed) than the previous design parameter (e.g., after using (8, 4), uses (8, 3)).

If an LDPC code that meets the two criteria is not found for the last design parameter (girth$_i$, ACE$_i$) (e.g., (6, 0)), the parameter selecting module 158 translates the girth criterion to an ACE requirement. For example, the parameter selecting module 158 is configured to select a plurality of parameters (girth$_j$, ACE$_j$), where girth$_j$ is an integer greater than zero and is less than the predetermined girth threshold (e.g., $4 < 6$), ACE$_j$ is an integer greater than or equal to zero, $1 < j < n$, and j and n are integers greater than 1. For example only, the parameters (girth$_j$ ACE$_j$) can include (4, 10), (4, 9), . . . , and (4, 0).

The code generating module 162 is configured to generate, for the first column weight distribution, codes by using the parameters (4, 10), (4, 9), . . . , and (4, 0) until a code that meets the two criteria is found. The code generating module 162 is configured to repeat the above procedure for each column weight distribution. The above iterative code search procedure can be limited or simplified using certain search reduction and search refinement criteria described below.

The channel evaluating module 164 is configured to evaluate performance of each code generated by the code generating module 162 using the above procedure. The channel evaluating module 164 is configured to evaluate the performance of the codes over one or more of an AWGN channel and a WiFi channel based on the output of the channel modelling module 154. As explained above, the channel modelling module 154 models these channels and simulates transmission and reception of encoded using the codes under different channel conditions and using different coding rates, block lengths, and modulations.

The channel evaluating module 164 is configured to evaluate the performance using a plurality of criteria including packet error rate (PER) and signal-to-noise ratio (SNR). For example, the channel evaluating module 164 is configured to evaluate the performance of a code by generating a curve PER versus SNR of the code. The channel evaluating module 164 is configured to evaluate the performance of codes having different code rates, block lengths, modulations, number of deleted columns from respective matrices, and number of decoding iterations. The channel evaluating module 164 is configured to identify one or more column weight distributions for which one or more codes have performance greater than or equal to the best performance of all found codes within a predetermined relative performance tolerance threshold.

To reduce search space, for each column weight distribution, the code generating module 162 is configured to stop generating codes during the iterative code search procedure when multiple (e.g., 4) consecutive codes are found to have performance worse than the previously generated codes. This stoppage of code search is referred to an early stop in one dimensional search along a column weight distribution search space.

The early stop in one dimensional search along the column weight distribution search space is performed as follows. In some cases, the search space of column weight distribution is of multiple dimensions, e.g., for code rate 7/8 using a base matrix of size 4×25, the column weight for each column can be selected from {2, 3, 4}. Then the search space is of two dimensions. Basically, the search space is determined by three parameters denoted as n2, n3, n4, where n2 denotes the number of columns of weight 2, and so on for n3 and n4. Yet n2, n3, and n4 are not independent since they must satisfy n2+n3+n4=21 for code rate 7/8. So effectively there are two free parameters, say n2 and n3, and n4 is determined given n2 and n3.

When browsing through all possible column weight distribution the code search procedure described above goes through all possible combinations of n2 and n3 (n2 can take values from 0 to 21, n3 can take values from 0 to 21). What is meant by one dimensional search is that n3 can be fixed (e.g., n3=0), and n2 can be varied from 0 to (21−n3). As n2 increases, PER versus SNR performance may improve up to some point. Then the performance may get worse and worse compared with the previous value of n2. In that case, if n2 is increased and worse performance is observed, then the search process can be terminated early. That is, basically, the rest of n2 are discarded.

Further, the column weight selecting module 160 is configured to determine a mean column weight of the plurality of column weight distributions. The column weight selecting module 160 is further configured to select upper and lower bounds for the column weight distributions based on the mean column weight. Specifically, for a given column weight distribution, a mean column weight is calculated. For the example used above, the mean column weight is calculated as (2*n2+3*n3+4*n4)/(n2+n3+n4). An upper bound and a lower bound are set based on the mean column weight. The column weight distributions whose mean column weight distribution is out of range set by the lower bound and upper bound are discarded. The code generating module 162 is configured to generate codes only for those values of the column weight distributions that are between the upper and lower bounds. The channel evaluating module 164 is configured to evaluate performance of the codes over each channel type (AWGN or WiFi). The channel evaluating module 164 is configured to identify winning column weight distributions (i.e., column weight distributions for which the codes have performance greater than or equal to a predetermined performance threshold).

To refine the code search, for each winning column weight distribution (i.e., column weight distributions for which the codes have performance greater than or equal to a predetermined relative performance tolerance threshold), the code generating module 162 is further configured to generate codewords (e.g., 20) to meet the two criteria. The channel evaluating module 164 is configured to evaluate performance of the codes over both AWGN and WiFi channels. The channel evaluating module 164 is configured to identify parity-check matrices of those codes that perform best (i.e., have performance greater than or equal to a predetermined performance threshold) over both AWGN and WiFi channels. The channel evaluating module 164 is further configured to identify parity-check matrices of those codes that perform best (i.e., have performance greater than or equal to a predetermined relative performance tolerance threshold) over either AWGN or WiFi channel.

FIG. 4 shows a method 200 for designing a base structure for generating LDPC codes according to the present disclosure. At 202, a code rate k/n is selected to encode k units of data into n units of data, where k and n are integers greater than 1, and k=n−1. At 204, a base matrix having (R+S) rows and (C+S) columns and with column weight selected from 2 to (R+S) is generated, where R and C are integers greater than 1, R=C/n, and S is an integer greater than or equal to zero and denotes a number of columns punctured after encoding the data. At 206, S columns of the base matrix are punctured after encoding the data.

FIG. 5 shows a method 250 for designing LDPC codes according to the present disclosure. At 252, a code rate k/n is selected to encode k units of data into n units of data, where k and n are integers greater than 1, and k=n−1. At 254, a base matrix having (R+S) rows and (C+S) columns and with column weight selected from 2 to (R+S) is generated, where R and C are integers greater than 1, R=C/n, and S is an integer greater than or equal to zero and denotes a number of columns punctured after encoding the data. At 256, S columns of the base matrix are punctured after encoding the data. At 258, cyclic shifts for each entry in the base matrix are selected such that the LDPC code meets two criteria: First, a girth of the LDPC code has a lower bound determined by a first threshold, where the girth of the LDPC code is a length of a shortest cycle of the LDPC code; and second, an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

Figure 6A:
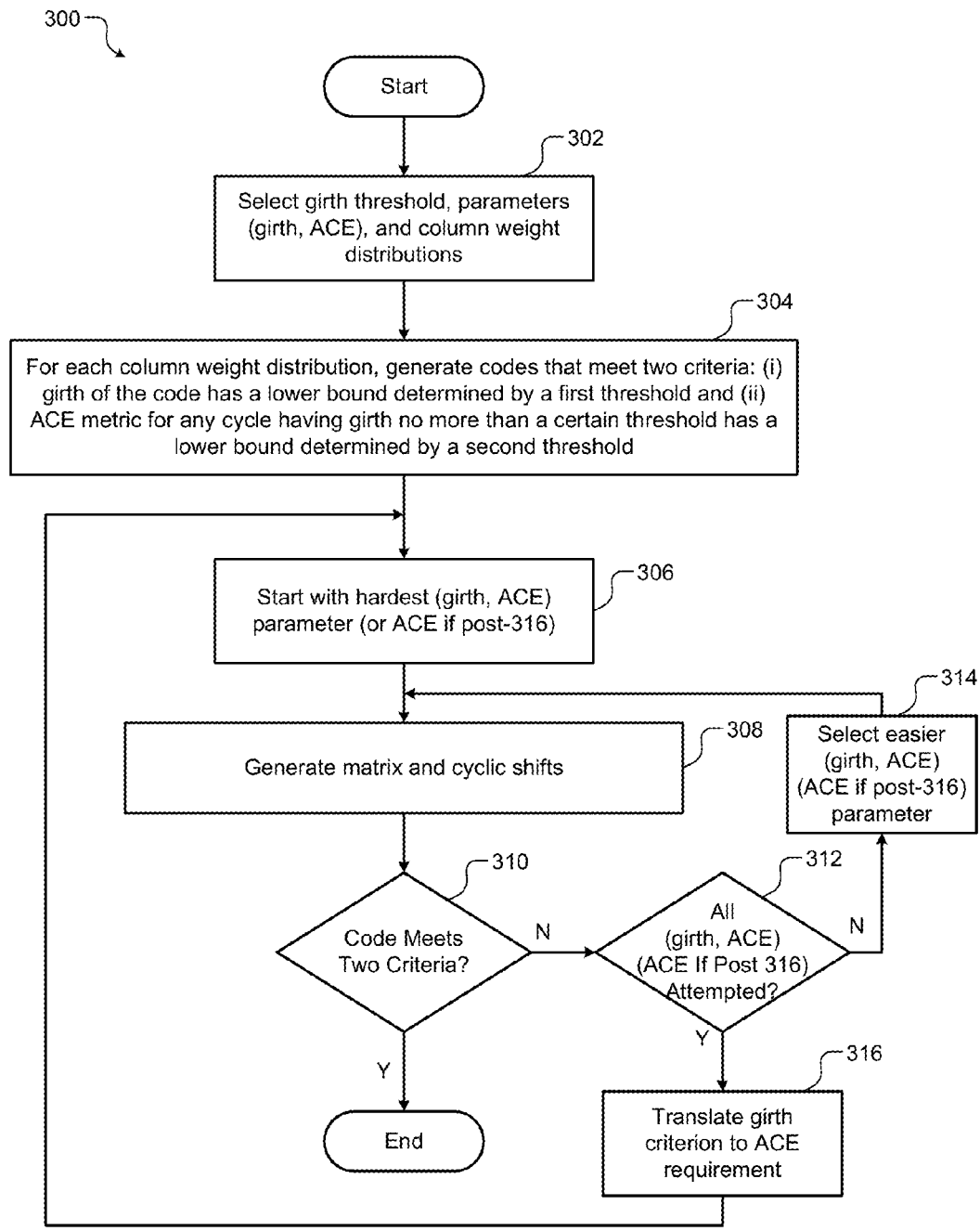
FIG. 6A is a flowchart of a method for generating a code according to the present disclosure.

FIG. 6A shows a method 300 for generating a code that meets the two design criteria according to the present disclosure. At 302, a predetermined girth threshold, design parameters (girth, ACE), and column weight distributions are selected. At 304, for each column weight distribution, codes are generated that meet two criteria: First, a girth of the LDPC code has a lower bound determined by a first threshold, where the girth of the LDPC code is a length of a shortest cycle of the LDPC code; and second, an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

At 306, for a given column weight distribution, codes are generated starting with the hardest (girth, ACE) parameter (i.e., (girth, ACE) parameter with highest values of girth and ACE). At 308, a base matrix is generated, and cyclic shifts are generated. At 310, whether the code meets the two criteria is determined. Control ends if the code meets the two criteria. At 312, if the code does not meet the two criteria, whether all (girth, ACE) parameters are attempted is determined. At 314, if all (girth, ACE) parameters are not attempted, an easier (girth, ACE) parameter (i.e., (girth, ACE) parameter with lower values of girth and ACE than a previous (girth, ACE) parameter) is selected; and control is returned to 308.

At 316, if all (girth, ACE) parameters are attempted (i.e., a code that meets the two criteria is not found after using all (girth, ACE) parameters), the girth criterion is translated to an ACE requirement; and control is returned to 308. Control executes 308-314 until a code that meets the two criteria is found. Control ends when a code that meets the two criteria is found.

Figure 6B:
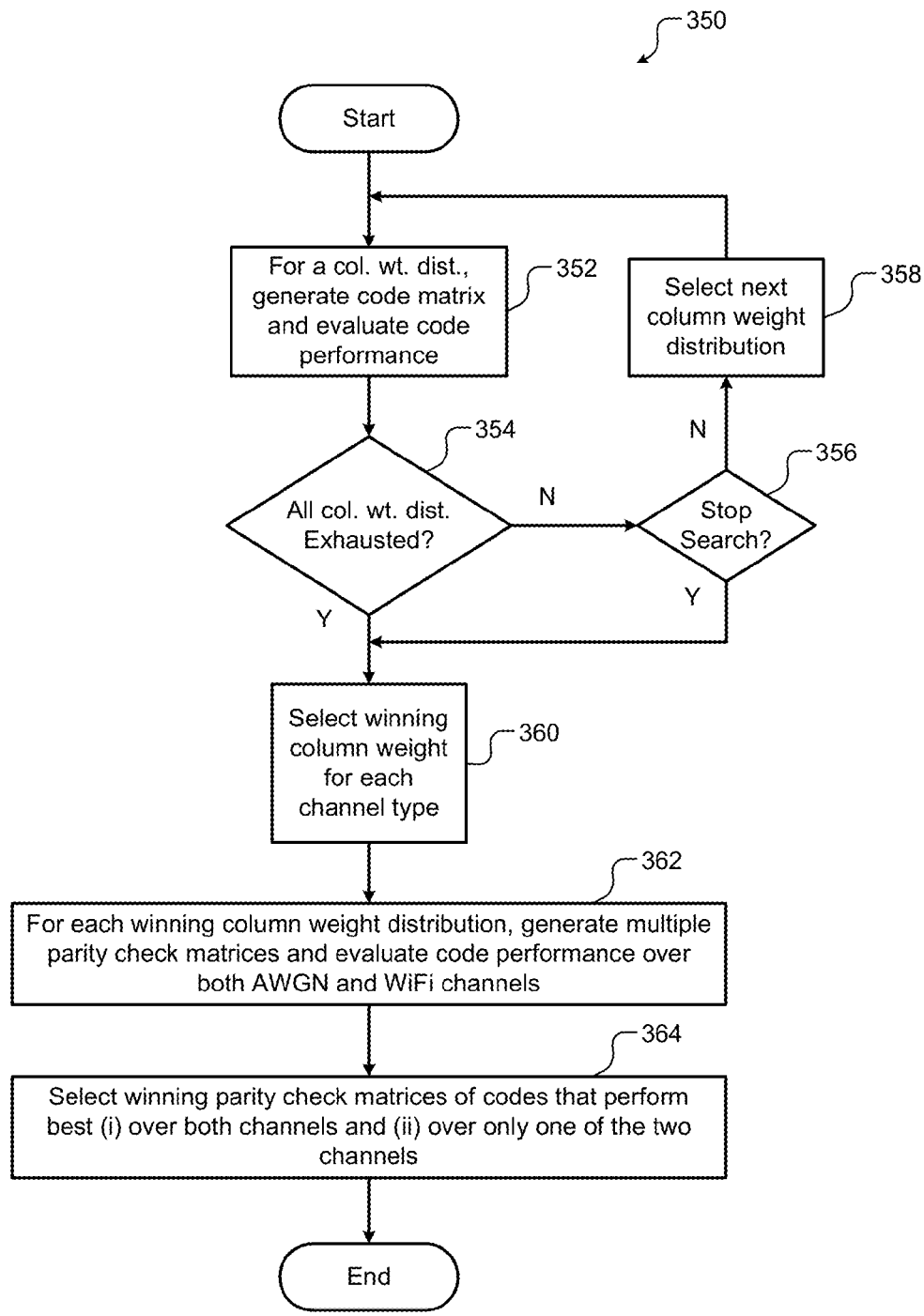
FIG. 6B is a flowchart of a method for reducing search space while performing code search according to the present disclosure.

FIG. 6B shows a method 350 for reducing search space while performing code search according to the present disclosure. The method 350 goes through all possible column weight distributions unless the code search can be terminated early as explained below. At 352, for a given column weight distribution, code matrix is generated and performance of the code that meets the two criteria (see FIG.

6A) is evaluated. A354, whether all possible column weight distributions are exhausted is determined. At 356, if all possible column weight distributions are not yet exhausted, whether to stop the code search early is determined. For example, the code search may be stopped early in one dimensional search along the column weight distribution search space as explained above. At 358, if the search is to be continued, the next column weight distribution is selected, and control is returned to 352.

At 360, if all possible column weight distributions are exhausted at 354, or if code search is to be stopped at 356, a winning column weight distribution is selected for each channel type. At 362, for each winning column weight distribution, multiple parity check matrices are generated, and code performance is evaluated over both the WGN and WiFi channels. At 364, winning parity-check matrices of codes that perform best over both channels as well as over only one of the two channels are selected, and control ends.

Figures 7A, 7B:
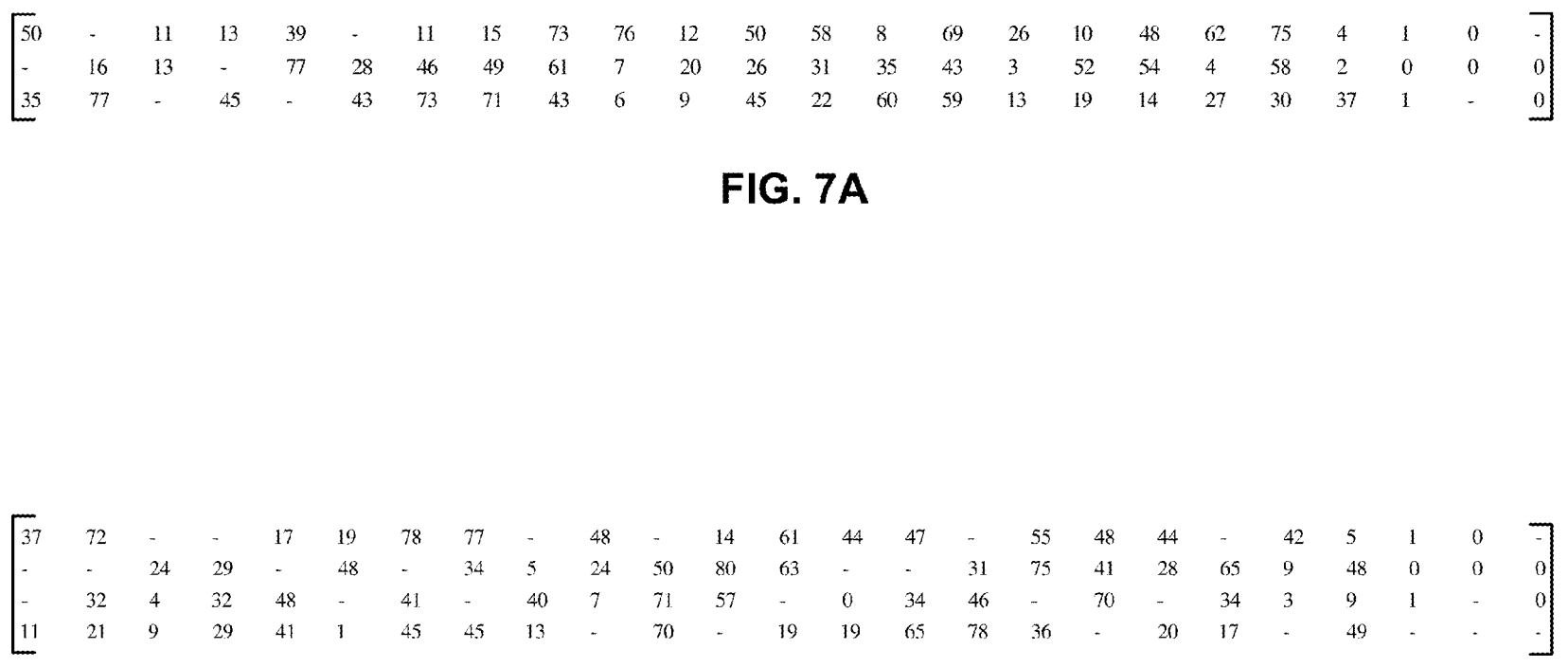

FIGS. 7A and 7B show examples of base matrices for code rate 7/8 generated using the code design methods of the present disclosure. FIG. 7A shows a 3×24 base matrix (3 rows and 24 columns) with number of punctured columns S=0. Some columns of the 3×24 base matrix may have a column weight of 2 while others may have a column weight of 3. The first 21 columns on the left hand side of the 3×24 base matrix correspond to 21 data bits or information bits. The last three columns on the right hand side of the 3×24 base matrix correspond to three parity bits. Thus the code rate is 21/24=7/8.

FIG. 7B shows a 4×25 base matrix (4 rows and 25 columns) with number of punctured columns S=1 (column 22 is punctured after encoding). Some columns of the 4×25 base matrix may have a column weight of 2, some other columns may have a column weight of 3, and still others may have a column weight of 4. After puncturing column 22, the first 21 columns on the left hand side of the 4×25 base matrix correspond to 21 data bits or information bits. The last three columns on the right hand side of the 4×25 base matrix correspond to three parity bits. Thus the code rate is 21/24=7/8.

FIGS. 8A-11B show various examples of performance of codes with code rate 7/8 generated using the 3×24 and 4×25 base matrices designed according to the present disclosure. In these figures, the notation "# of weighX is Y" (where X and Y are integers greater than or equal to zero) means "number of weight-2 column is 8."

Figure 8A:
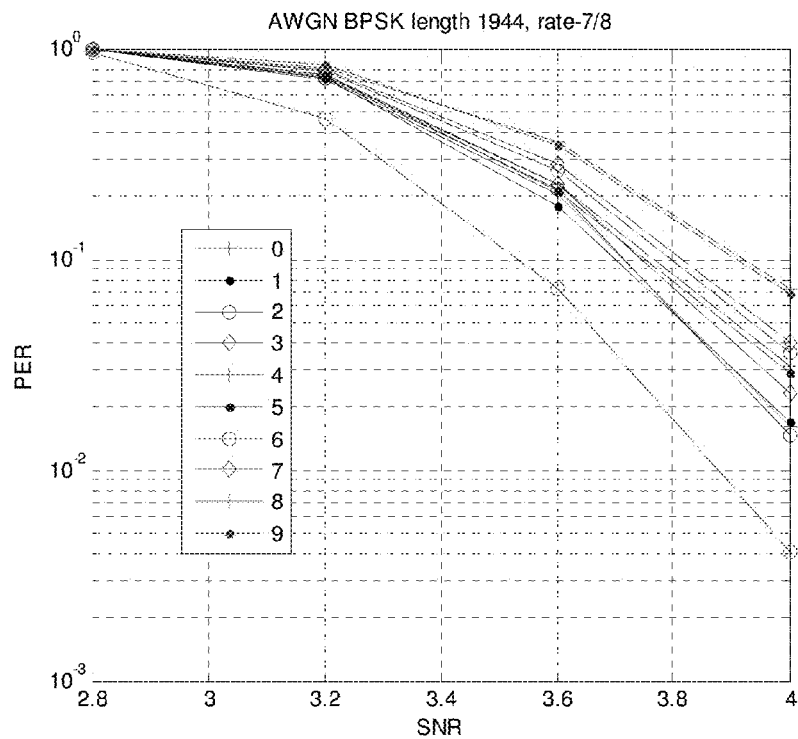
FIGS. 8A-11B show various examples of performance of codes with code rate 7/8 generated using 3×24 and 4×25 base matrices designed according to the present disclosure.
Figure 8B:
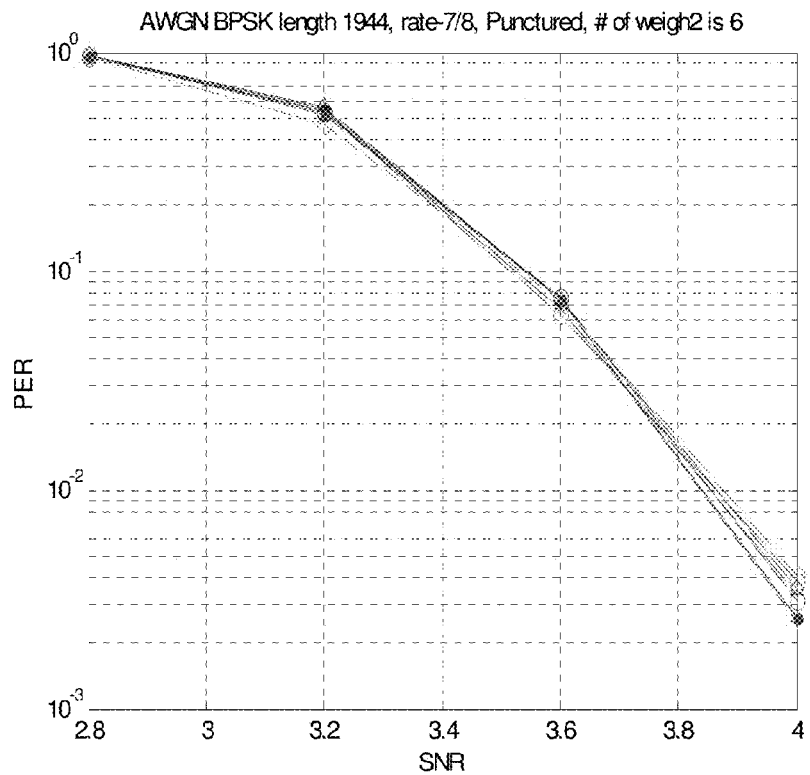

FIGS. 8A and 8B show the examples for AWGN channel with a block length of 1944 bits. FIG. 8A is an example of performance of the code generated using the 3×24 base matrix. FIG. 8B is an example of performance of the code generated using the 4×25 base matrix. The 4×25 base matrix shows about 0.2 dB gain over the 3×24 base matrix.

Figure 9A:
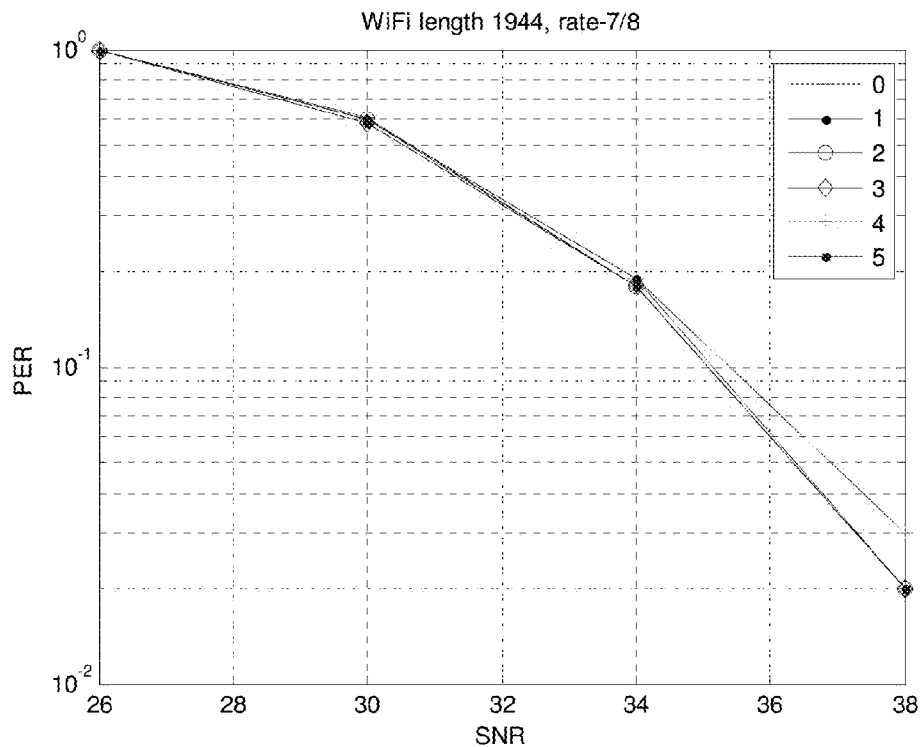
Figure 9B:
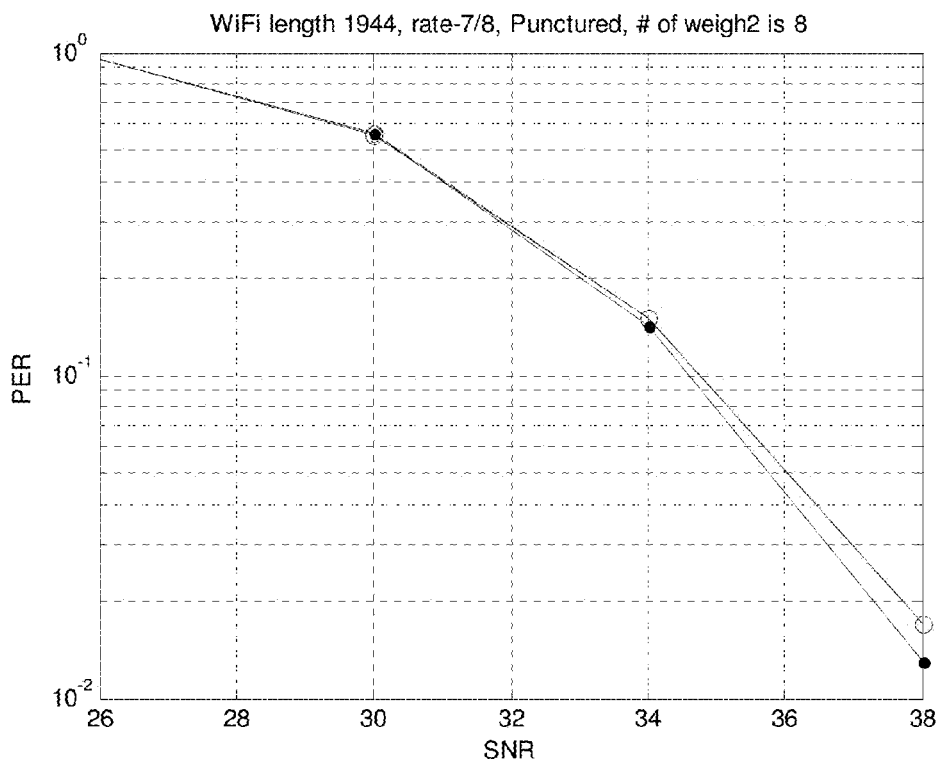

FIGS. 9A and 9B show the examples for WiFi channel with a block length of 1944 bits. FIG. 9A is an example of performance of the code generated using the 3×24 base matrix. FIG. 9B is an example of performance of the code generated using the 4×25 base matrix. At SNR=34 dB, the throughput gain with the 4×25 base matrix is about 2 or 3% over the 3×24 base matrix, and the gain is about 0.5 dB to 1.0 dB over the 3×24 base matrix.

Figure 10A:
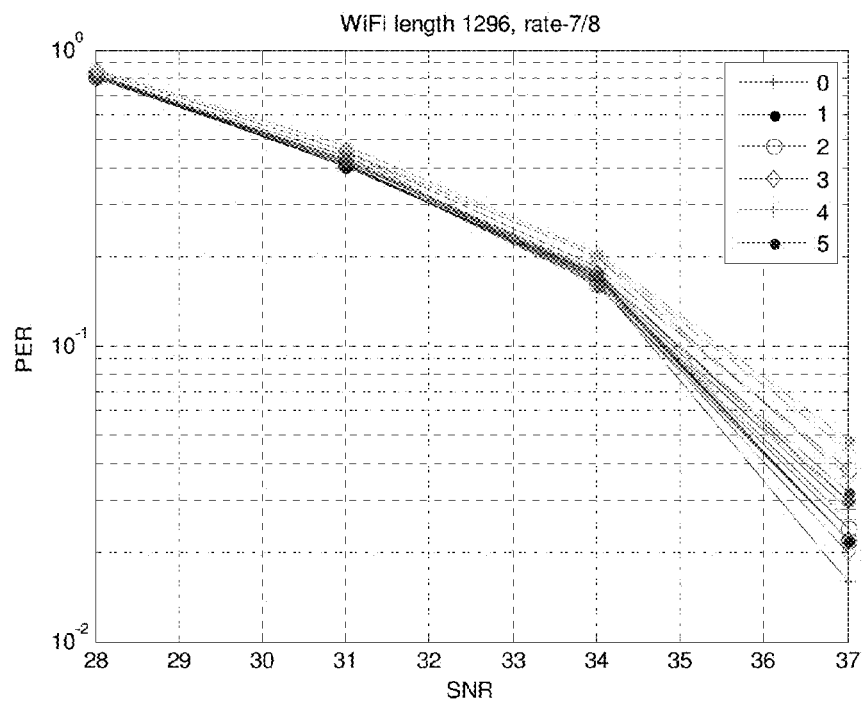
Figure 10B:
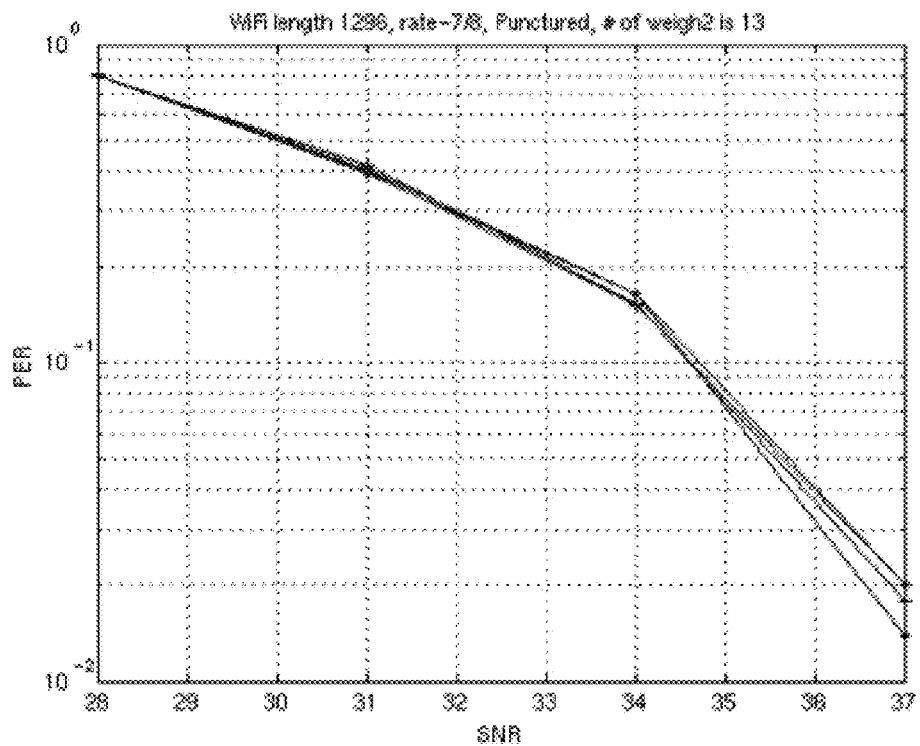

FIGS. 10A and 10B show the examples for WiFi channel with a block length of 1296 bits. FIG. 10A is an example of performance of the code generated using the 3×24 base matrix. FIG. 10B is an example of performance of the code generated using the 4×25 base matrix. The 4×25 base matrix shows a slight gain over the 3×24 base matrix.

Figure 11A:
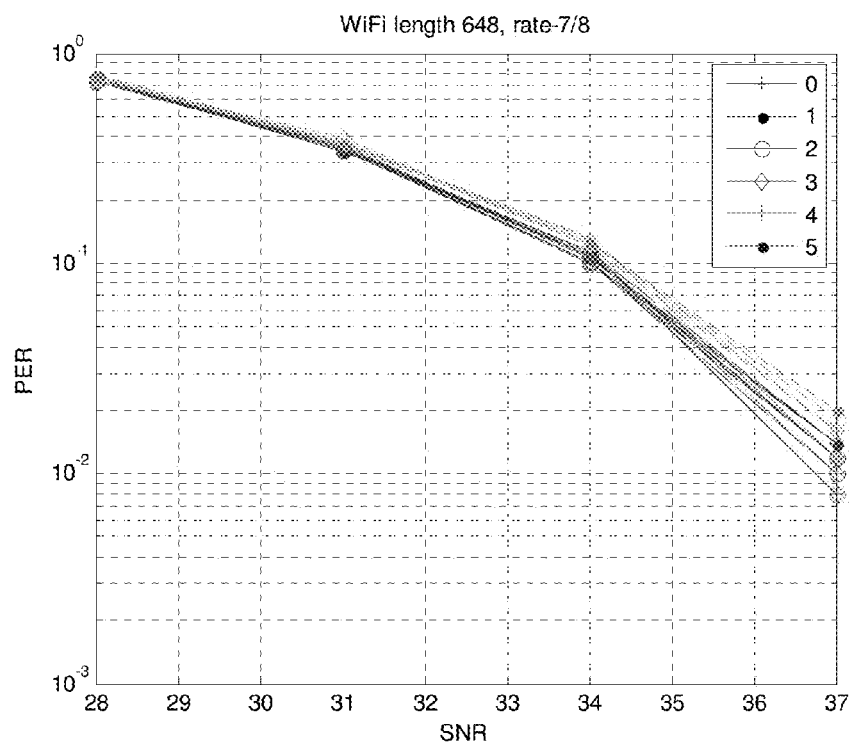
Figure 11B:
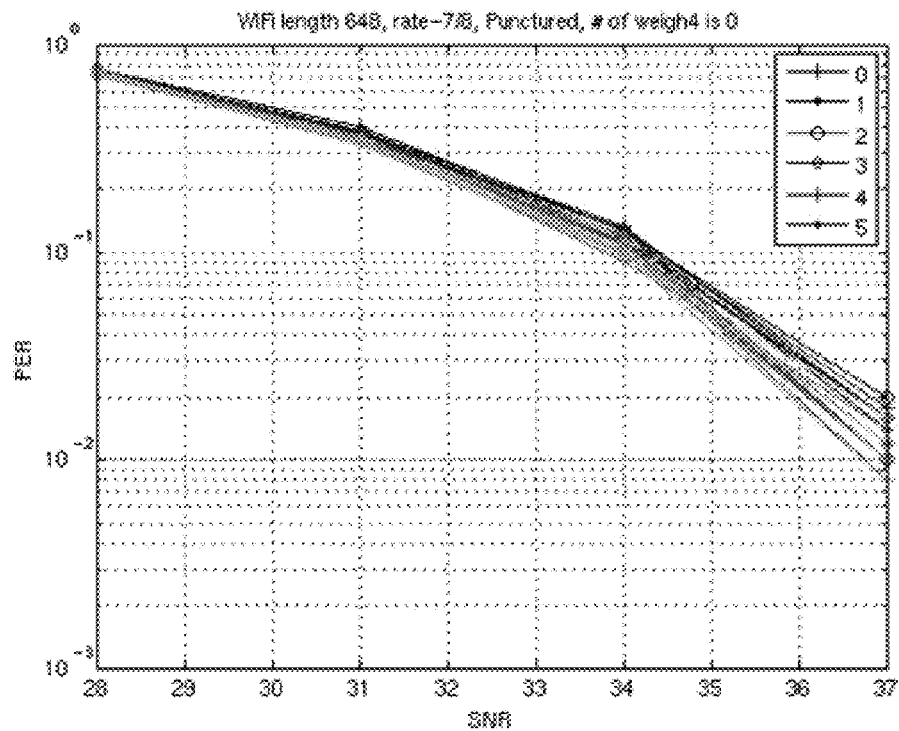

FIGS. 11A and 11B show the examples for WiFi channel with a block length of 648 bits. FIG. 11A is an example of performance of the code generated using the 3×24 base matrix. FIG. 11B is an example of performance of the code generated using the 4×25 base matrix. The 4×25 base matrix shows a slight gain over the 3×24 base matrix at 31 and 34 dBs.

Figure 12A:
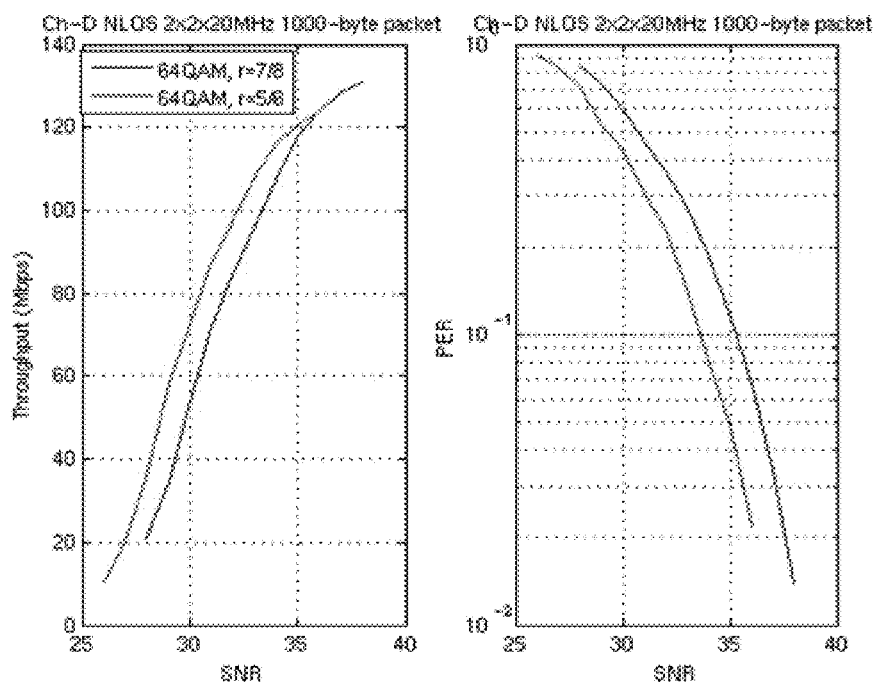
FIGS. 12A and 12B show throughput improvement of a code with code rate 7/8 found according to the present disclosure.
Figure 12B:
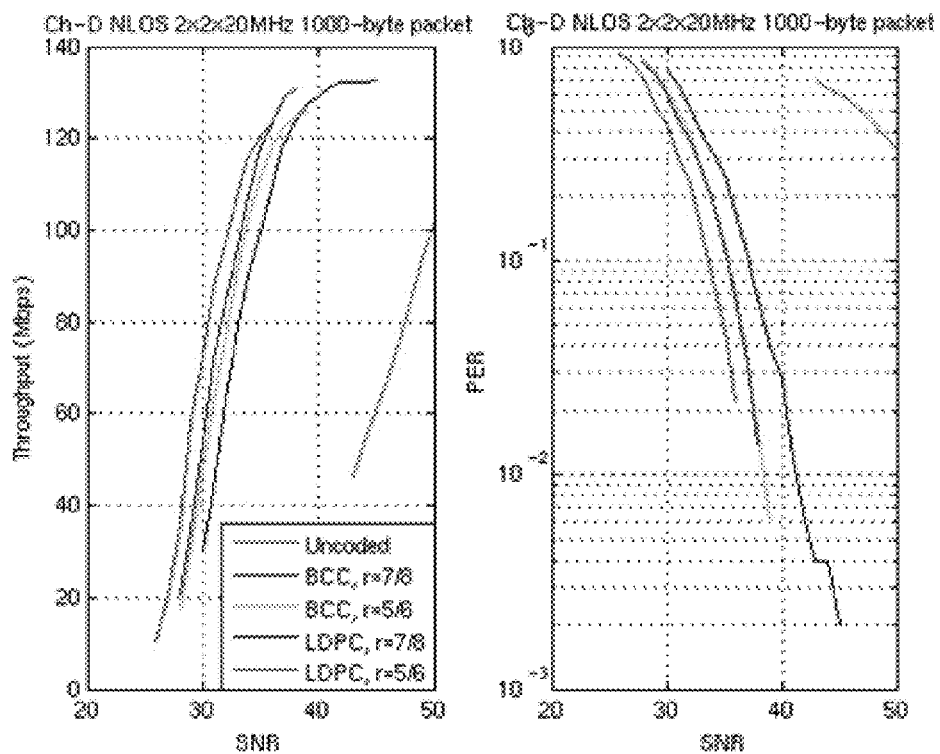

FIGS. 12A and 12B show throughput improvement of a code with code rate 7/8 found according to the present disclosure. The results are based on a simulation performed for a 20 MHz channel, using 2×2 MIMO configuration, 2 spatial streams, 64QAM modulation, and D non-line-of-sight (NLOS) WiFi channel.

Figures 13A, 13B:
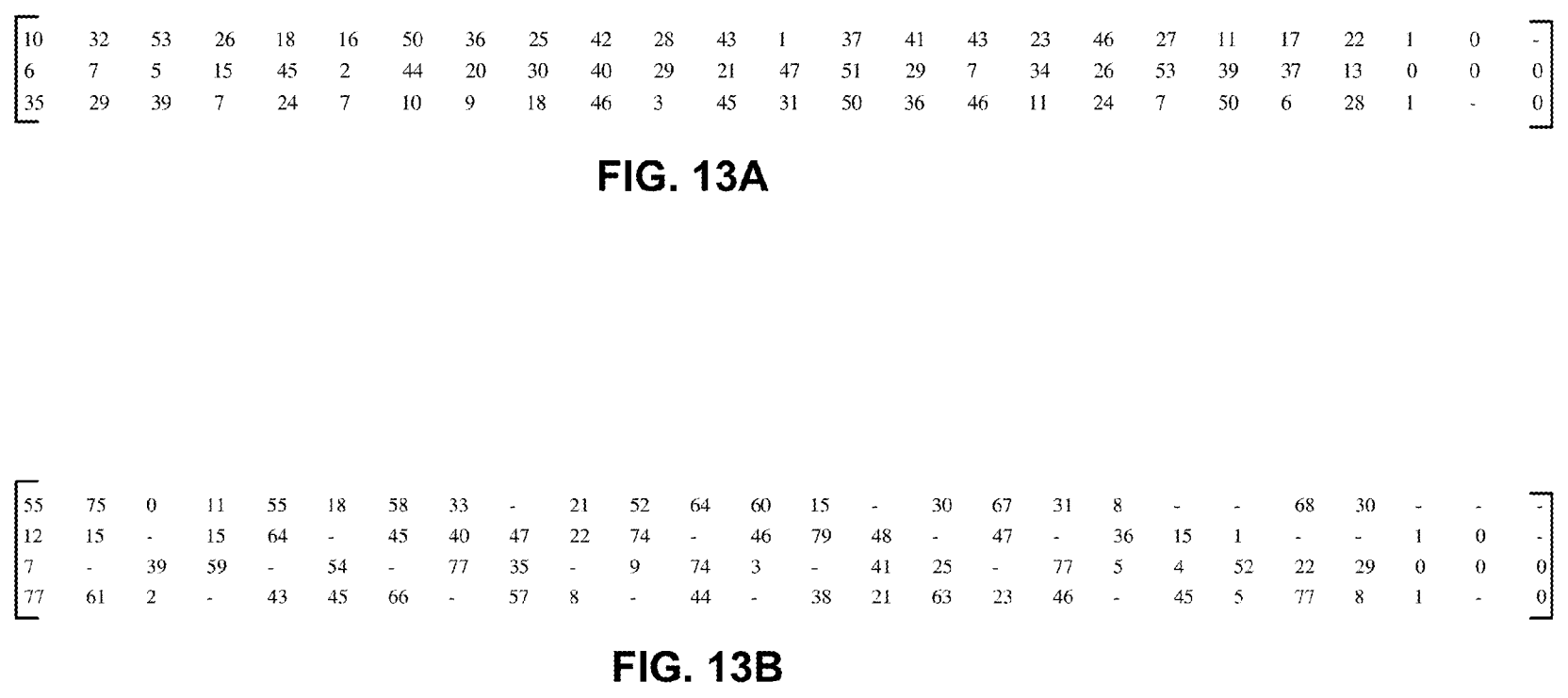

FIGS. 13A and 13B show examples of base matrices for code rate 11/12 generated using the code design methods of the present disclosure. FIG. 13A shows a 3×25 base matrix (3 rows and 25 columns) with number of punctured columns S=1 (column 23 is punctured after encoding). Some columns of the 3×25 base matrix may have a column weight of 2 while others may have a column weight of 3. After puncturing column 23, the first 22 columns on the left hand side of the 3×25 base matrix correspond to 22 data bits or information bits. The last two columns on the right hand side of the 3×25 base matrix correspond to two parity bits. Thus the code rate is 22/24=11/12.

FIG. 13B shows a 4×26 base matrix (4 rows and 26 columns) with number of punctured columns S=2 (columns 23 and 24 are punctured after encoding). Some columns of the 4×26 base matrix may have a column weight of 2, some other columns may have a column weight of 3, and still others may have a column weight of 4. After puncturing columns 23 and 24, the first 22 columns on the left hand side of the 4×26 base matrix correspond to 22 data bits or information bits. The last two columns on the right hand side of the 4×26 base matrix correspond to two parity bits. Thus the code rate is 22/24=11/12.

FIGS. 14-19 show various examples of 3×24 base matrices with column weights of 2 or 3 for code rate 7/8 with a block length of 1944 bits for WiFi channel generated without puncturing according to the present disclosure. Some columns of the 3×24 base matrix may have a column weight of 2 while others may have a column weight of 3. The first 21 columns on the left hand side of the 3×24 base matrix correspond to 21 data bits or information bits. The last three columns on the right hand side of the 3×24 base matrix correspond to three parity bits. Thus the code rate is 21/24=7/8.

FIGS. 20-28 show various examples of 4×25 base matrices with column weights of 2, 3, or 4 for code rate 7/8 with a block length of 1944 bits for WiFi channel generated with puncturing of one column (e.g., column 22) according to the present disclosure. Some columns of the 4×25 base matrix may have a column weight of 2, some other columns may have a column weight of 3, and still others may have a column weight of 4. After puncturing column 22, the first 21 columns on the left hand side of the 4×25 base matrix correspond to 21 data bits or information bits. The last three columns on the right hand side of the 4×25 base matrix correspond to three parity bits. Thus the code rate is 21/24=7/8.

Figure 29A:
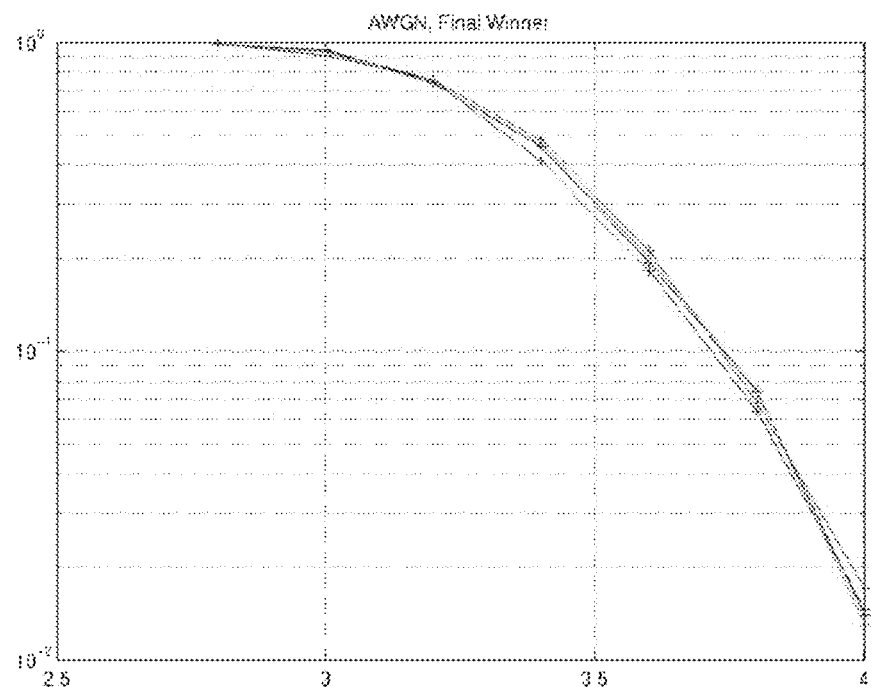
FIGS. 29A-30B show various examples of performance of codes with code rate 7/8 generated using 3×24 and 4×25 base matrices designed according to the present disclosure.
Figure 29B:
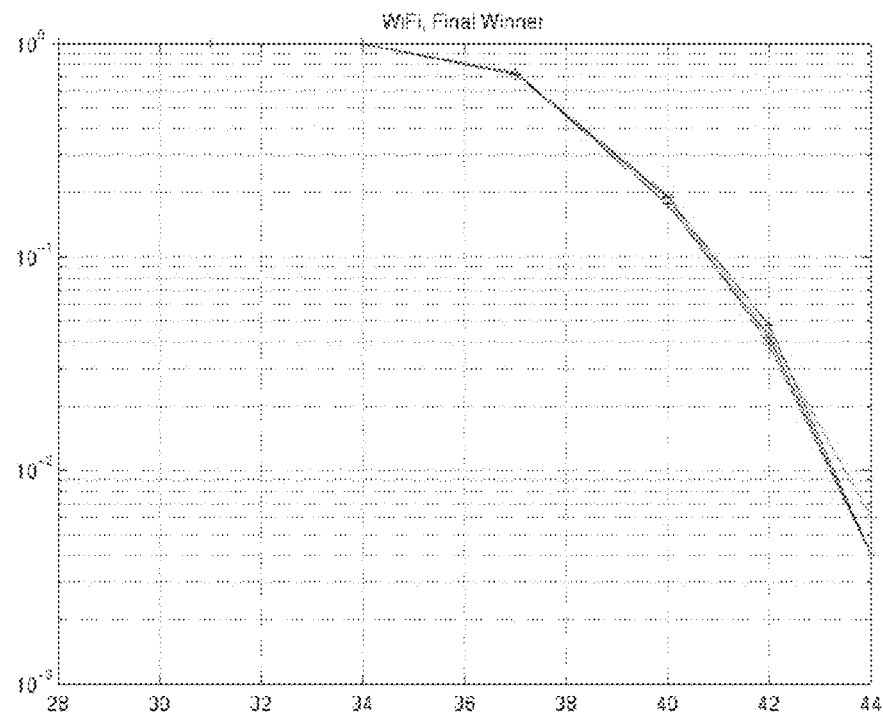

FIGS. 29A-30B show various examples of performance of codes with code rate 7/8 generated using the 3×24 and 4×25 base matrices designed according to the present disclosure. FIGS. 29A and 29B show examples of performance of the codes with code rate 7/8 generated using the 3×24 base matrices designed according to the present disclosure. FIG. 29A shows the performance for AWGN channel with BPSK modulation. FIG. 29B shows the performance for WiFi channel (e.g., IEEE802.11ac 80 MHz channel) using 256QAM modulation, 2×2 antenna configuration, 2 spatial streams, and D NLOS channel.

Figure 30A:
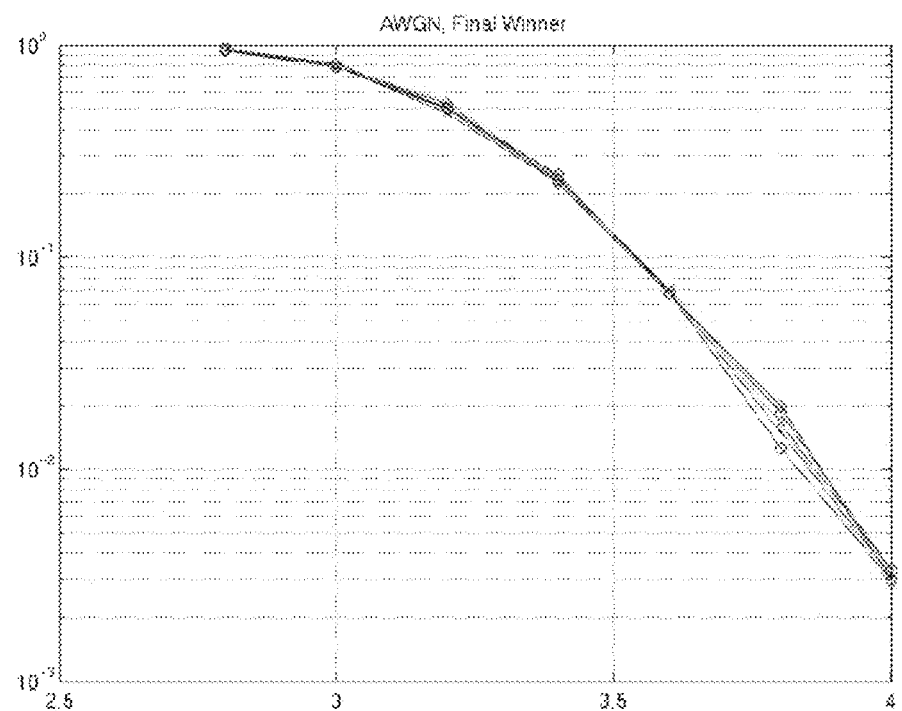
Figure 30B:
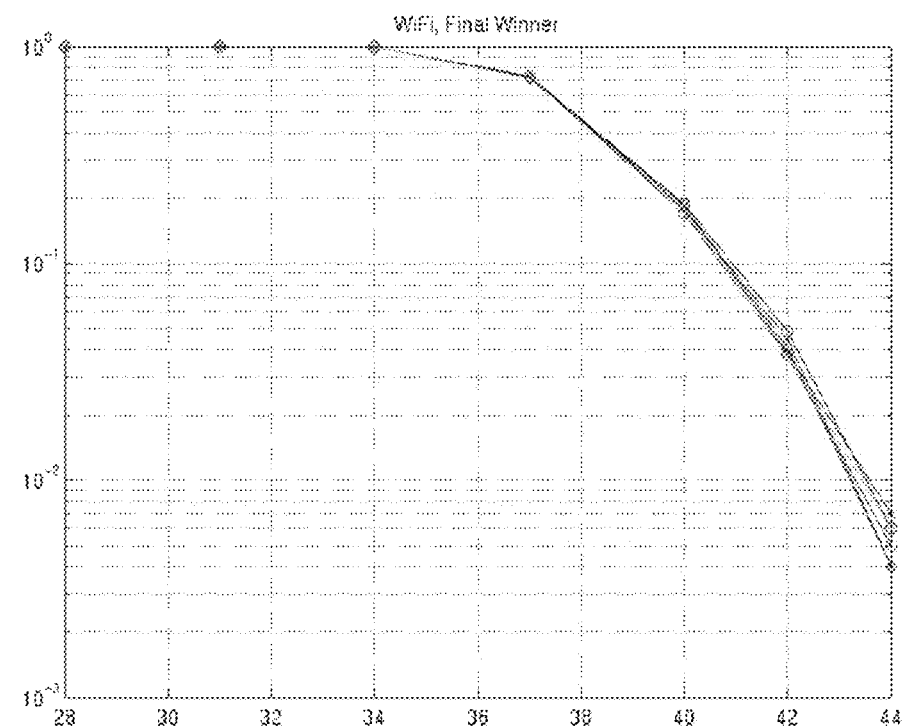

FIGS. 30A and 30B show examples of performance of the codes with code rate 7/8 generated using the 4×25 base matrices designed according to the present disclosure. FIG. 30A shows the performance for AWGN channel with BPSK modulation. FIG. 30B shows the performance for WiFi channel (e.g., IEEE802.11ac 80 MHz channel) using 256QAM modulation, 2×2 antenna configuration, 2 spatial streams, and D NLOS channel.

FIGS. 31-38 show various examples of 3×25 base matrices with column weights of 2 or 3 for code rate 11/12 with a block length of 1944 bits for WiFi channel generated with puncturing of one column (e.g., column 23) according to the present disclosure. Some columns of the 3×25 base matrix may have a column weight of 2 while others may have a column weight of 3. After puncturing column 23, the first 22 columns on the left hand side of the 3×25 base matrix correspond to 22 data bits or information bits. The last two columns on the right hand side of the 3×25 base matrix correspond to two parity bits. Thus the code rate is 22/24=11/12.

FIGS. 39-47 show various examples of 4×26 base matrices with column weights of 2, 3, or 4 for code rate 11/12 with a block length of 1944 bits for WiFi channel generated with puncturing of two of the columns 23-26 (e.g., columns 23 and 24) according to the present disclosure. Some columns of the 4×26 base matrix may have a column weight of 2, some other columns may have a column weight of 3, and still others may have a column weight of 4. After puncturing two of the columns 23-26 (e.g., columns 23 and 24), the first 22 columns on the left hand side of the 4×26 base matrix correspond to 22 data bits or information bits. The last two columns on the right hand side of the 4×26 base matrix correspond to two parity bits. Thus the code rate is 22/24=11/12.

In the base matrices described above, each element of the base matrix represents a submatrix. For example, in a 3×25 base matrix for a block length of 1944 bits, each element of the 3×25 base matrix represents an 81×81 submatrix matrix, where 81 is a ratio of 1944 bits per block divided by 24 codewords per block. The 81×81 submatrix has a single 1 in each row. The 1's in each row of the 81×81 submatrix are along a diagonal extending from top left to right bottom positions in the 81×81 submatrix. All other elements of the 81×81 submatrix are 0's. A value of each element of the base matrix indicates a number of right shifts performed on the rows of the corresponding submatrix. For example, if an element of the 3×25 base matrix has a value of 0, no shifts are performed on the rows of the corresponding 81×81 submatrix. A value of −1 (which is sometimes shown as simply "−" as in FIGS. 7A-7B and 13A-13B) indicates that all elements of the corresponding submatrix are zeros, and shifts are irrelevant. A value other than a 0 or a −1 includes an integer N greater than or equal to 1 and indicates that N right shifts are performed on the rows of the corresponding submatrix.

FIGS. 48A-51B show various examples of performance of codes with code rate 11/12 generated using the 3×25 and 4×26 base matrices designed according to the present disclosure. FIGS. 48A and 48B show examples of performance of the codes with code rate 11/12 generated using the 3×25 base matrices (shown in FIGS. 31-33) designed according to the present disclosure. FIG. 48A shows the performance for AWGN channel with BPSK modulation. FIG. 48B shows the performance for WiFi channel (e.g., IEEE802.11ac 80 MHz channel) using 256QAM modulation, 2×2 antenna configuration, 2 spatial streams, and D NLOS channel. The performance is good on both AWGN and WiFi channels.

FIGS. 49A and 49B show examples of performance of the codes with code rate 11/12 generated using the 3×25 base matrices (shown in FIGS. 34-38) designed according to the present disclosure. FIG. 49A shows the performance for AWGN channel with BPSK modulation. FIG. 49B shows the performance for WiFi channel (e.g., IEEE802.11ac 80 MHz channel) using 256QAM modulation, 2×2 antenna configuration, 2 spatial streams, and D NLOS channel. The performance for WiFi channel is better than the performance for AWGN channel.

FIGS. 50A and 50B show examples of performance of the codes with code rate 11/12 generated using the 4×26 base matrices (shown in FIGS. 39-44) designed according to the present disclosure. FIG. 50A shows the performance for AWGN channel with BPSK modulation. FIG. 50B shows the performance for WiFi channel (e.g., IEEE802.11ac 80 MHz channel) using 256QAM modulation, 2×2 antenna configuration, 2 spatial streams, and D NLOS channel. The performance is good on both AWGN and WiFi channels.

FIGS. 51A and 51B show examples of performance of the codes with code rate 11/12 generated using the 4×26 base matrices (shown in FIGS. 45-47) designed according to the present disclosure. FIG. 51A shows the performance for AWGN channel with BPSK modulation. FIG. 51B shows the performance for WiFi channel (e.g., IEEE802.11ac 80 MHz channel) using 256QAM modulation, 2×2 antenna configuration, 2 spatial streams, and D NLOS channel. The performance for WiFi channel is better than the performance for AWGN channel.

Figure 52:
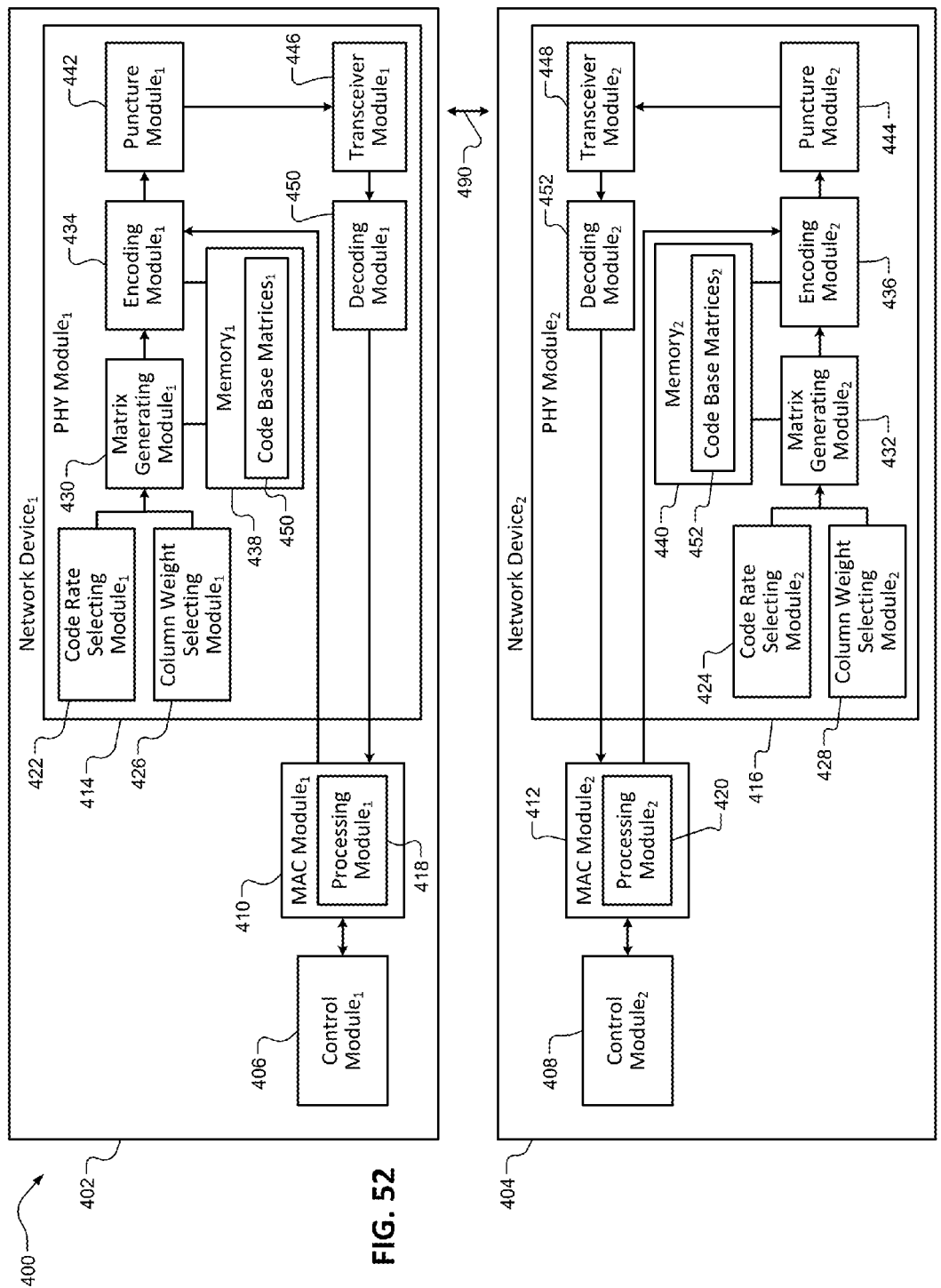
FIG. 52 is a functional block diagram of a network including network devices having matrix generating modules in accordance with the present disclosure.

Although various parameters disclosed herein are primarily described as being applied to WiFi networks and WiFi network devices, the parameters may be applied to other networks and network devices. The parameters include code rates, code lengths, matrix sizes, number of rows in each of the matrices, number of columns in each of the matrices, expansion factors, row weight distributions of matrices, column weight distributions of matrices, etc. For example, the parameters may be applied to communication in a long term evolution (LT) wireless communication network, a powerline communication network or other communication network. The parameters may be applied in storing and accessing data on a data storage device (e.g., hard drive, solid-state drive, etc.). The parameters may be used during encoding and/or decoding of data, as performed by network devices in one or more of the stated networks. An example network 400 is shown in FIG. 52. The network 400 includes network devices 402, 404. Each of the network devices 402, 404, may be a computer, a mobile device, a cellular phone, a personal data assistant, a storage drive, an appliance, a router, a modem, a bridge, a wearable device, or other network device. The network devices 402, 404 include respective control modules 406, 408, medium access control (MAC) modules 410, 412, and physical layer (PHY) modules 414, 416. The control modules 406, 408 may send data to and receive data from the MAC modules 410, 412. The MAC modules 410, 412 may include respective processing modules 418, 420.

The PHY modules 418, 420 may include respective code rate selecting modules 422, 424, column weight selecting modules 426, 428, matrix generating modules 430, 432, encoding modules 434, 436, memories 438, 440, puncture modules 442, 444, transceiver modules 446, 448, and decoding modules 450, 452. The PHY modules 418, 420 receive data from and transfer data to the MAC modules 410, 412. The code rate selecting modules 422, 424 may operate similar as other code rate selecting modules disclosed herein and may select a code rate (e.g., 7/8 or 11/12). The column weight selecting modules 426, 428 may select minimum, actual, and/or maximum column weights for one or more matrices used during encoding and/or decoding. The column weights may be 2, 3, 4 or other column weight. In one embodiment, the column weights are greater than or equal to 2.

The matrix generating modules 430, 432 generate and/or access resultant matrices for encoding and/or decoding. The resultant matrices may be generated based on code base matrices and one or more expansion factors (e.g., 27, 54, or other suitable expansion factor). Examples of code base matrices are shown in FIGS. 7A, 7B, 13A-28, 31-47, and 53-113. The matrix generating modules 430, 432 convert each element in the code base matrices to larger sub-matrices, which make up a corresponding resultant matrix (sometimes referred to as a block code). For example, if an expansion factor used is 27, then each element in a code base matrix is used to form a 27×27 sub-matrix, which is included in a resultant matrix. The elements in a code base matrix indicate how to form the corresponding sub-matrix. If an element in the code base matrix is a −1, than all corresponding elements in the sub-matrix are 0. If an element in the code base matrix is greater than or equal to 0, then each row in a corresponding identity matrix is shifted to the right by the value of that element to form a sub-matrix of the resultant matrix. During each shift of elements in an identity matrix, the elements that are in a last column of the identity matrix are shifted to the first column. An identity matrix includes all 0s expect for a center diagonal of 1s. A first element of the center diagonal is the element in the first row and first column of the identity matrix. The last element of the center diagonal is the element in the last row and last column of the identity matrix. After one or more shifts, the corresponding sub-matrix is no longer an identity matrix. The code base matrices, the sub-matrices, and/or the resultant matrices may be stored in the memories 438, 440. Code base matrices 450, 452 are shown as being stored in the memories 438, 440 in FIG. 52.

The encoding modules 434, 436 may include and/or be implemented as encoders and encode data based on the resultant matrices and corresponding codewords. The encoding as a result may be based on the code base matrices 450, 452, the sub-matrices, the resultant matrices, the expansion factors, a code rate, a code length, row or column weight distributions, matrix sizes, and/or other parameters disclosed herein. The puncture modules 442, 444 may puncture encoded data depending on the resultant matrix used during encoding. This is further described below with respect to the method of FIG. 114.

The transceiver modules 446, 448 may include and/or be implemented as transceivers and transmit and receive data. As an example, the first transceiver module 446 may transmit encoded data to the second transceiver module 448. The transceiver modules 446, 448 may perform modulation of the encoded data prior to transmission and demodulation of the received encoded data. The modulation may include, for example, binary phase shift keying (BPSK) modulation, quadrature phase shift keying (QPSK), quadrature amplitude modulation (QAM), or other suitable modulation. The transceiver modules 446, 448 may communicate over various channels and/or mediums. For example purposes only, the encoded data may be transmitted on a 20-80 mega-Hertz (MHz) channel or a D non-line-of-sight (NLOS) WiFi channel. The encoded data may be transmitted via multiple spatial streams (e.g., 2 spatial streams) using for example (i) a 2×2 multiple input multiple output (MIMO) configuration, and (ii) 64QAM modulation or 256QAM modulation. A medium (designated 490 in FIG. 52) between the transceivers 446, 448 may be a wireless medium or a wired medium. The medium 490 may be a powerline.

The decoding modules 450, 452 may include and/or be implemented as decoders and decode encoded data received from the transceiver modules 446, 448. The decoding may be based on the code base matrices 450, 452, the sub-matrices, the resultant matrices, the expansion factors, a code rate, a code length, row or column weight distributions, matrix sizes, and/or other parameters disclosed herein. The decoding may include layered belief propagation (LGP) decoding. This is especially true when the decoding is implemented in a WiFi transceiver. The decoding may include recovering the encoded bits punctured at a source subsequent to encoding. The recovered bits may be recovered based on values of other bits (source information bits and parity-check bits), where some of the other bits provide positive information and some of the other bits provide negative information.

In the following FIGS. 53-113 code base matrices are shown. The code base matrices have corresponding code rates, code lengths in bits, row and column weight distributions, expansion factors, matrix sizes, etc. At least some of these parameters are shown for these matrices in the following Table 1. The code rates may be LDPC code rates. As a reference, the code rate may be equal to 1 minus a result of the number of rows of a resultant matrix divided by a number of columns of the resultant matrix. Put another way, 1−k/n may be equal to # of rows/# of columns.

TABLE 1

| Figure | Code Rate | Code Length in Bits | Expansion Factor | Column Weights | Size | Post Encoding Puncturing |
|---|---|---|---|---|---|---|
| FIGS. 53-59 | 7/8 | 648 | 27 | 2, 3 | 3x24 | No |
| FIGS. 60-66 | | | | 2, 3, 4 | 4x25 | Yes - Data associated with 1 column punctured |
| FIGS. 67-74 | 7/8 | 1296 | 54 | 2, 3 | 3x24 | No |
| FIGS. 75-82 | | | | 2, 3, 4 | 4x25 | Yes - Data associated with 1 column punctured |
| FIGS. 83-90 | 11/12 | 648 | 27 | 2, 3 | 3x25 | No |
| FIGS. 91-98 | | | | 2, 3, 4 | 4x26 | Yes - Data associated with 2 column punctured |
| FIGS. 99-106 | 11/12 | 1296 | 54 | 2, 3 | 3x25 | No |
| FIGS. 107-113 | | | | 2, 3, 4 | 4x26 | Yes - Data associated with 2 column punctured |

Figure 113:
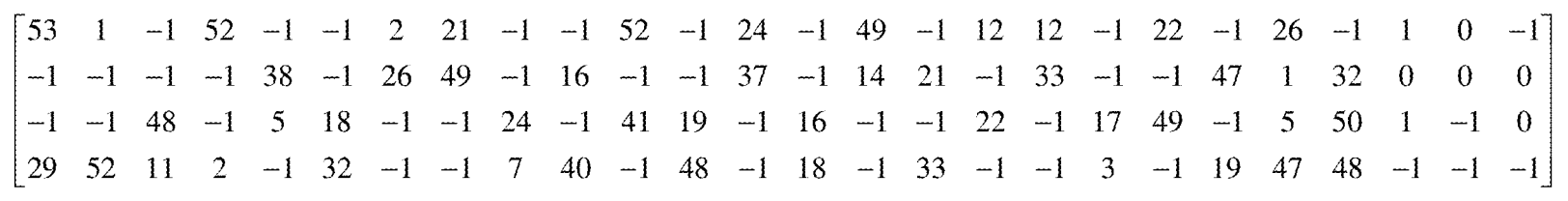

Each of the following code base matrices provided in FIGS. 53-113 have source information bit columns and parity-check columns. The matrices of size 3×24 have 21 columns of source information elements and then 3 columns of parity-check elements. The matrices of size 3×25 have 22 columns of source information elements and then 3 columns of parity-check elements. The matrices of size 4×25 have 21 columns of source information elements and then 4 columns of parity-check elements. For the 4×25 matrices, the data generated based on the first of the 4 columns of parity-check elements (or column 22) is punctured subsequent to encoding. The matrices of size 4×26 have 22 columns of source information elements and then 4 columns of parity-check elements. For the 4×26 matrices, the data generated based on the first of the 4 columns of parity-check elements (or column 23) is punctured subsequent to encoding. Continuing with the example 4×25 and 4×26 matrices provided in the figures, if an expansion factor used is 27, then 27 encoded bits are punctured for each of the elements in column 22 or 23 of the corresponding code base matrix.

As a result, encoding performed based on the matrices having sizes 4×25 and 4×26 provide an added row of elements and an added column of parity-check elements for encoding, which improves decoding performance. The puncturing of the columns after encoding maintains a code rate (e.g., 7/8 or 11/12) and a same number of source information bits (e.g., 21 or 22 columns of source information elements) for the code rate used.

The following code base matrices provided in FIGS. 53-113 may be used to maintain a current IEEE 802.11n/ac LDPC code structure with a minimized number of modifications such that existing IEEE 802.11n/ac LDPC implementations are able to support the code base matrices with minimal changes. Encoded data provided based on the code base matrices having sizes 3×24 and 3×25 may not be punctured after encoding. Encoded data provided based on the code base matrices having sizes 4×25 and 4×26 may be punctured after encoding. The code based matrices having sizes 4×25

FIGS. 53-59 show examples of 3×24 code base matrices for a code rate of 7/8 and a code length of 648 bits. FIGS. 60-66 show examples of 4×25 code base matrices for a code rate of 7/8 and a code length of 648 bits. FIGS. 67-74 show examples of 3×24 code base matrices for a code rate of 7/8 and a code length of 1296 bits. FIGS. 75-82 show examples of 4×25 code base matrices for a code rate of 7/8 and a code length of 1296 bits. FIGS. 83-90 show examples of 3×25 code base matrices for a code rate of 11/12 and a code length of 648 bits. FIGS. 91-98 show examples of 4×26 code base matrices for a code rate of 11/12 and a code length of 648 bits. FIGS. 99-106 show examples of 3×25 code base matrices for a code rate of 11/12 and a code length of 1296 bits. FIGS. 107-113 show examples of 4×26 code base matrices for a code rate of 11/12 and a code length of 1296 bits.

Figure 114:
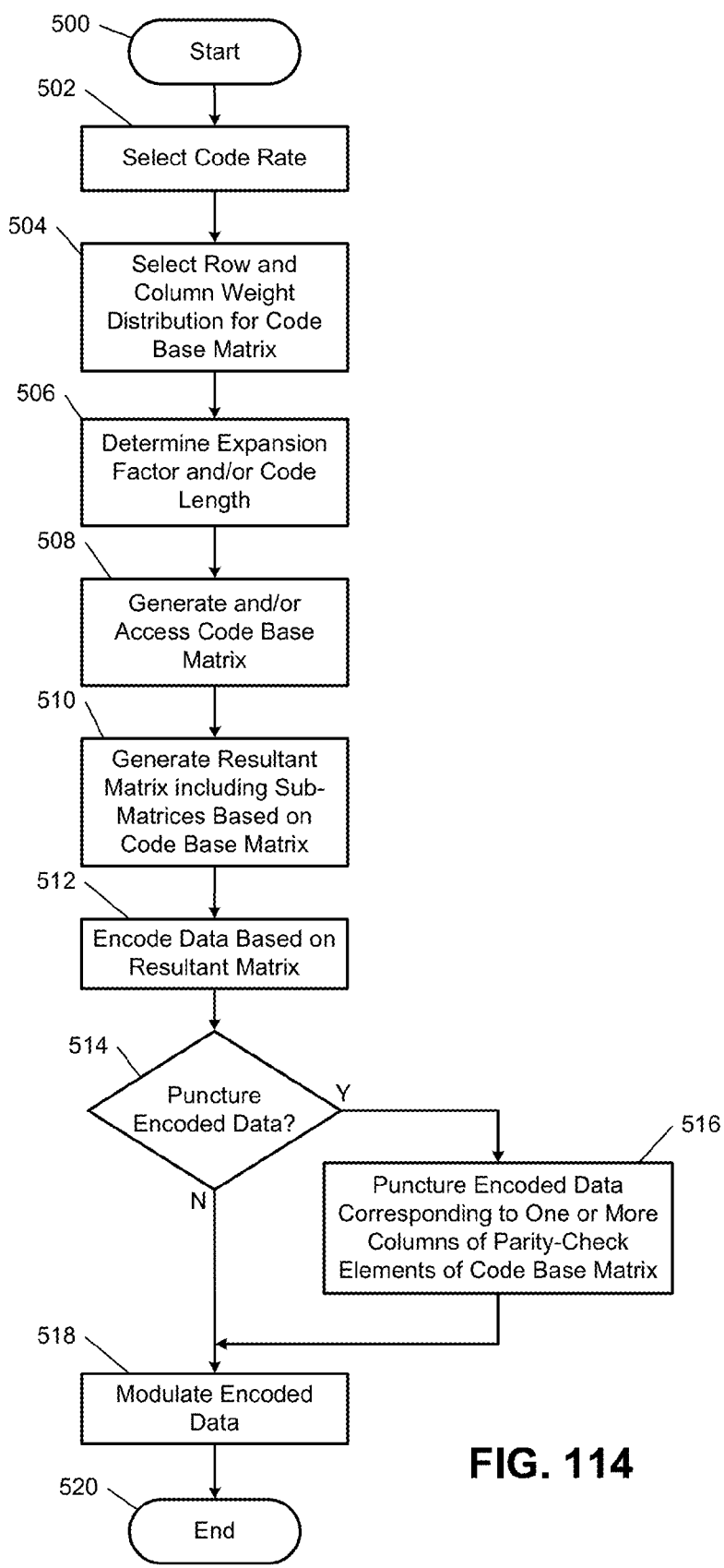
FIG. 114 illustrates an encoding method in accordance with the present disclosure.

The network devices disclosed herein may be operated using numerous methods, an example method is illustrated in FIG. 114. FIG. 114 illustrates an encoding method. Although the following tasks are primarily described with respect to the implementations of FIGS. 52-113, the tasks may be easily modified to apply to other implementations of the present disclosure. The tasks may be iteratively performed.

The method may begin at 500. At 502, a code rate selecting module (e.g., one of the modules 422, 424) of a first network device selects a code rate (e.g., 7/8 or 11/12). At 504, a weight selecting module (e.g., one of the modules 426, 428) selects a row and/or a column weight distribution. This may include selecting weights for one or more rows and/or columns of a code base matrix. The weight of a row or a column refers to a number of non-zero (i.e. non-negative 1) entry elements in a code base matrix. Note an entry of '0' in a code base matrix is a non-zero entry, as this entry corresponds to an identity matrix (or a matrix having some entries that are not 0) having zero shift.

At 506, a matrix generating module (e.g., one of the modules 430, 432) or other module of a PHY module (e.g., one of the PHY modules 414, 416) may determine an expansion factor and/or a code length. Tasks 502, 504, 506 may be performed in a different order than shown in FIG. 114. Each of the tasks 502, 504, 506 may be performed while one or more of the other ones of the tasks 502, 504, 506 are performed.

At 508, the matrix generating module generates and/or accesses a code base matrix. The code base matrix may be generated based on the selected code rate, the selected row and/or column distribution, the expansion factor, and/or the code length. In an alternative embodiment, tasks 502-506 are skipped and a previously generated code rate matrix is selected from multiple code rate matrices stored in memory (e.g., one of the memories 438, 440).

At 510, the matrix generating module generates a resultant matrix (or block code) including sub-matrices based on the code base matrix. The resultant matrix may be used as a LDPC block code. At 512, an encoding module (one of the modules 434, 436) encodes data received from a MAC module (one of the modules 410, 412) based on the resultant matrix.

At 514, a puncture module (e.g., one of the modules 442, 444) determines whether puncturing of encoded data is to be performed. If puncturing is to be performed, task 516 is performed, otherwise task 518 is performed. At 516, the puncturing module may puncture data as described above depending on the code base matrix used. The puncturing may, for example, include removing encoded data associated with a first column of parity-check elements of the code base matrix (e.g., encoded data associated with a $22^{nd}$ column of a 4×25 code base matrix or a $23^{rd}$ column of a 4×26 code base matrix).

At 518, a transceiver module (one of the modules 446, 448) may modulate the encoded data as described above and provided as a result of performing task 512 and/or task 516. At 520, the modulated data may be transmitted from the first network device to a second network device or from the first network device to a storage medium. The method may end at 522.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A network device comprising:
a matrix generating module configured to
define a code base matrix, wherein the code base matrix has a corresponding code rate of 7/8, and
based on the code base matrix, generate a resultant matrix of a low-density parity-check code, wherein the resultant matrix includes a plurality of sub-matrices, wherein each of the plurality of sub-matrices is generated based on a respective element in the code base matrix, and wherein the resultant matrix has a code length of 648 or 1296;
an encoding module configured to encode data based on the resultant matrix;
a puncture module configured to (i) determine whether to puncture the encoded data based on at least one of a total number of rows of the code base matrix and a total number of columns of the code base matrix, and (ii) puncture the encoded data if the total number of rows is greater than or equal to a predetermined number of rows or the total number of columns is greater than or equal to a predetermined number of columns; and
a transceiver configured to transmit an output of the puncture module.

2. The network device of claim 1, wherein a size of the code base matrix is 3×24.

3. The network device of claim 1, wherein:
the matrix generating module is configured to generate the resultant matrix based on an expansion factor; and
the expansion factor is 27 or 54.

4. The network device of claim 1, wherein each column in the code base matrix has a column weight of greater than or equal to 2.

5. The network device of claim 1, wherein the resultant matrix has a code length of 1296.

6. The network device of claim 1, wherein the puncture module is configured to puncture a portion of the encoded data including removing a column of the encoded data, such that a code length of resulting punctured data is equal to a code length of a matrix having (i) one or two less columns than the code base matrix, and (ii) one less row than the code base matrix.

7. The network device of claim 6, wherein:
the encoded data comprises a first plurality of columns followed by a second plurality of columns;
the first plurality of columns comprises information bits;
the second plurality of columns comprises parity check bits;
the column of the encoded data removed during puncturing of the encoded data is a first column of the party check bits; and
a size of the code base matrix is 4×25.

8. The network device of claim 1, wherein the puncture module does not remove a row of the encoded data while puncturing the encoded data.

9. A network device comprising:
a matrix generating module configured to
define a code base matrix, wherein the code base matrix has a corresponding code rate of 11/12, and
based on the code base matrix, generate a resultant matrix of a low-density parity-check code, wherein the resultant matrix includes a plurality of sub-matrices, wherein each of the plurality of sub-matrices is generated based on a respective element in the code base matrix, and wherein the resultant matrix has a code length of 648 or 1296;
an encoding module configured to encode data based on the resultant matrix;
a puncture module configured to (i) determine whether to puncture the encoded data based on at least one of a total number of rows of the code base matrix and a total number of columns of the code base matrix, and (ii) puncture the encoded data if the total number of rows is greater than or equal to a predetermined number of rows or the total number of columns is greater than or equal to a predetermined number of columns; and
a transceiver configured to transmit an output of the puncture module.

10. The network device of claim 9, wherein a size of the code base matrix is 3×25.

11. The network device of claim 9, wherein:
the matrix generating module is configured to generate the resultant matrix based on an expansion factor; and
the expansion factor is 27 or 54.

12. The network device of claim 9, wherein each column in the code base matrix has a column weight of greater than or equal to 2.

13. The network device of claim 9, wherein the resultant matrix has a code length of 1296.

14. The network device of claim 9, wherein the puncture module is configured to puncture a portion of the encoded data including removing a column of the encoded data, such that a code length of resultant punctured data is equal to a code length of a matrix having (i) one or two less columns than the code base matrix, and (ii) one less row than the code base matrix.

15. The network device of claim 14, wherein:
the encoded data comprises a first plurality of columns followed by a second plurality of columns;
the first plurality of columns comprises information bits;
the second plurality of columns comprises parity check bits;
the column of the encoded data removed during puncturing of the encoded data is a first column of the party check bits; and
wherein a size of the code base matrix is 4×26.

16. A method comprising:
defining a code base matrix, wherein the code base matrix has a corresponding code rate of 7/8;
based on the code base matrix, generating a resultant matrix of a low-density parity-check code, wherein the resultant matrix includes a plurality of sub-matrices, wherein each of the plurality of sub-matrices is generated based on a respective element in the code base matrix, and wherein the resultant matrix has a code length of 648 or 1296;
encoding data based on the resultant matrix;
puncturing a portion of the encoded data including removing a column of the encoded data, such that a code length of resultant punctured data is equal to a code length of a matrix having (i) one or two less columns than the code base matrix, and (ii) one less row than the code base matrix; and
transmitting an output of the puncture module via a transceiver.

17. The method of claim 16, wherein a size of the code base matrix is 3×24.

18. The method of claim 16, further comprising puncturing a portion of the encoded data corresponding to a column of parity-check bits in the code base matrix,
wherein a size of the code base matrix is 4×25.

19. The method of claim 16, further comprising the matrix generating module is configured to generate the resultant matrix based on an expansion factor, wherein the expansion factor is 27 or 54.

20. The method of claim 16, wherein each column in the code base matrix has a column weight of greater than or equal to 2.

21. The method of claim 16, wherein the resultant matrix has a code length of 1296.

22. A method comprising:
defining a code base matrix, wherein the code base matrix has a corresponding code rate of 11/12;
based on the code base matrix, generating a resultant matrix of a low-density parity-check code, wherein the resultant matrix includes a plurality of sub-matrices, wherein each of the plurality of sub-matrices is generated based on a respective element in the code base matrix, and wherein the resultant matrix has a code length of 648 or 1296;
encoding data based on the resultant matrix;
puncturing a portion of the encoded data including removing a column of the encoded data, such that a code length of resultant punctured data is equal to a code length of a matrix having (i) one or two less columns than the code base matrix, and (ii) one less row than the code base matrix; and
transmitting an output of the puncture module via a transceiver.

23. The method of claim 22, wherein a size of the code base matrix is 3×25.

24. The method of claim 22, further comprising puncturing a portion of the encoded data corresponding to a column of parity-check bits in the code base matrix,
wherein a size of the code base matrix is 4×26.

25. The method of claim 22, further comprising generating the resultant matrix based on an expansion factor, wherein the expansion factor is 27 or 54.

26. The method of claim 22, wherein each column in the code base matrix has a column weight of greater than or equal to 2.

27. The method of claim 22, wherein the resultant matrix has a code length of 618 or 1296.

* * * * *